United States Patent
Altenbeck et al.

(10) Patent No.: US 11,060,922 B2
(45) Date of Patent: Jul. 13, 2021

(54) OPTICAL DETECTOR

(71) Applicant: trinamiX GmbH, Ludwigshafen am Rhein (DE)

(72) Inventors: Timo Altenbeck, Ludwigshafen am Rhein (DE); Heidi Bechtel, Ludwigshafen am Rhein (DE); Regina Hoeh, Ludwigshafen am Rhein (DE); Fabian Dittmann, Ludwigshafen am Rhein (DE); Sebastian Mueller, Ludwigshafen am Rhein (DE); Thomas Hupfauer, Ludwigshafen am Rhein (DE); Peter Paul Kaletta, Ludwigshafen am Rhein (DE); Robert Gust, Ludwigshafen am Rhein (DE); Bertram Feuerstein, Ludwigshafen am Rhein (DE); Wilfried Hermes, Ludwigshafen am Rhein (DE); Sebastian Valouch, Ludwigshafen am Rhein (DE); Robert Send, Ludwigshafen am Rhein (DE); Ingmar Bruder, Ludwigshafen am Rhein (DE)

(73) Assignee: trinamiX GmbH, Ludwigshafen am Rhein (DE)

( * ) Notice: Subject to any disclaimer, the term of this patent is extended or adjusted under 35 U.S.C. 154(b) by 77 days.

(21) Appl. No.: 16/500,113

(22) PCT Filed: Apr. 19, 2018

(86) PCT No.: PCT/EP2018/060069
§ 371 (c)(1),
(2) Date: Oct. 2, 2019

(87) PCT Pub. No.: WO2018/193045
PCT Pub. Date: Oct. 25, 2018

(65) Prior Publication Data
US 2021/0025761 A1    Jan. 28, 2021

(30) Foreign Application Priority Data

Apr. 20, 2017  (EP) .................................... 17167380

(51) Int. Cl.
*G01J 5/20*        (2006.01)
*G01J 5/08*        (2006.01)
(Continued)

(52) U.S. Cl.
CPC ............... *G01J 5/20* (2013.01); *G01J 5/0806* (2013.01); *G01J 5/0878* (2013.01);
(Continued)

(58) Field of Classification Search
CPC .......... G01J 5/20; G01J 5/0806; G01J 5/0878; G01J 2005/0077; G01J 5/0887;
(Continued)

(56) References Cited

U.S. PATENT DOCUMENTS

| 3,035,176 | A | 5/1962 | Kis et al. |
| 3,112,197 | A | 11/1963 | Neugebauer et al. |

(Continued)

FOREIGN PATENT DOCUMENTS

| CA | 1065054 | 10/1979 |
| CA | 2196563 | 12/1996 |

(Continued)

OTHER PUBLICATIONS

Extended Search Report dated Aug. 23, 2011 in Europe Application No. 11154531.5 (With English Translation of Category of Cited Documents).

(Continued)

*Primary Examiner* — Christine S. Kim
(74) *Attorney, Agent, or Firm* — Armstrong Teasdale LLP

(57) ABSTRACT

The invention relates to a detector (110) for optical detection comprising a circuit carrier (130) designed to carry at least (Continued)

one layer, wherein the circuit carrier (130) is or comprises a printed circuit board (132); a reflective layer (138), the reflective layer (138) being placed on a partition of the circuit carrier (130), wherein the reflective layer (138) is designed to reflect the incident light beam (120), thereby generating at least one reflected light beam (124); a substrate layer (114), the substrate layer (114) being directly or indirectly adjacent to the reflective layer (138), wherein the substrate layer (114) is at least partially transparent with respect to the incident light beam (120); a sensor layer (122), the sensor layer (122) being placed on the substrate layer (114), wherein the sensor layer (122) is designed to generate at least one sensor signal in a manner dependent on an illumination of the sensor layer (122) by the incident light beam and the reflected light beam (124); and an evaluation device (150) designed to generate at least one item of information by evaluating the sensor signal; and at least two individual electrical contacts (148, 148') contacting the sensor layer (122), wherein the electrical contacts (148, 148') are designed to transmit the sensor signal via the circuit carrier (130) to the evaluation device (150). The detector (110) constitutes a detector for detecting optical radiation, especially within the infrared spectral range, specifically with regard to sensing at least one of transmissivity, absorption, emission and reflectivity, being capable of avoiding a loss of incident light.

17 Claims, 3 Drawing Sheets

(51) Int. Cl.
*H01L 31/0203* (2014.01)
*H01L 31/0232* (2014.01)
*H01L 31/18* (2006.01)
(52) U.S. Cl.
CPC .... *H01L 31/0203* (2013.01); *H01L 31/02327* (2013.01); *H01L 31/18* (2013.01)
(58) Field of Classification Search
CPC ........... H01L 31/0203; H01L 31/02327; H01L 31/18; H01L 27/14
See application file for complete search history.

(56) References Cited

U.S. PATENT DOCUMENTS

| | | |
|---|---|---|
| 3,384,752 A | 5/1968 | Odone |
| 3,562,785 A | 2/1971 | Craig |
| 3,564,268 A | 2/1971 | Bayne et al. |
| 3,937,950 A | 2/1976 | Hosoe et al. |
| 3,954,340 A | 5/1976 | Blomqvist et al. |
| 4,023,033 A | 5/1977 | Bricot et al. |
| 4,053,240 A | 10/1977 | Aizawa et al. |
| 4,079,247 A | 3/1978 | Briscot et al. |
| 4,256,513 A | 3/1981 | Yoshida |
| 4,286,035 A | 8/1981 | Nishizima et al. |
| 4,346,293 A | 8/1982 | Fetzer |
| 4,469,945 A | 9/1984 | Hoeberechts et al. |
| 4,524,276 A | 6/1985 | Ohtombe |
| 4,565,761 A | 1/1986 | Katagiri et al. |
| 4,584,704 A | 4/1986 | Ferren |
| 4,593,187 A | 6/1986 | Grotts et al. |
| 4,602,158 A | 7/1986 | Barrett |
| 4,603,258 A | 7/1986 | Sher et al. |
| 4,647,193 A | 3/1987 | Rosenfeld |
| 4,675,535 A | 6/1987 | Tsunekawa et al. |
| 4,694,172 A | 9/1987 | Powell et al. |
| 4,760,004 A | 7/1988 | Rochat et al. |
| 4,760,151 A | 7/1988 | Rochat et al. |
| 4,767,211 A | 8/1988 | Munakata et al. |
| 4,773,751 A | 9/1988 | Matsuda et al. |
| 4,927,721 A | 5/1990 | Gratzel et al. |
| 4,952,472 A | 8/1990 | Baranyi et al. |
| 5,082,363 A | 1/1992 | Nakanishi et al. |
| 5,216,476 A | 6/1993 | Lanckton |
| 5,227,985 A | 7/1993 | Dementhon et al. |
| 5,291,066 A | 3/1994 | Neugebauer et al. |
| 5,350,644 A | 9/1994 | Graetzel et al. |
| 5,355,241 A | 10/1994 | Kelley |
| 5,375,008 A | 12/1994 | Guerreri |
| 5,581,094 A | 12/1996 | Hara et al. |
| 5,589,928 A | 12/1996 | Babbitt et al. |
| 5,856,844 A | 1/1999 | Batterman et al. |
| 6,061,122 A | 5/2000 | Hoshino et al. |
| 6,191,881 B1 | 2/2001 | Tajima |
| 6,266,142 B1 | 7/2001 | Junkins et al. |
| 6,359,211 B1 | 3/2002 | Spitler et al. |
| 6,417,836 B1 | 7/2002 | Kumar et al. |
| 6,512,233 B1 | 1/2003 | Sato et al. |
| 6,785,028 B1 | 8/2004 | Atsuumi et al. |
| 6,930,297 B1 | 8/2005 | Nakamura |
| 6,995,445 B2 | 2/2006 | Forrest et al. |
| 7,022,966 B2 | 4/2006 | Gonzo et al. |
| 7,049,601 B2 | 5/2006 | Agano |
| 7,196,317 B1 | 3/2007 | Meissner et al. |
| 7,247,851 B2 | 7/2007 | Okada et al. |
| 7,301,608 B1 | 11/2007 | Mendenhall et al. |
| 7,417,716 B2 | 8/2008 | Nagasaka et al. |
| 7,626,569 B2 | 12/2009 | Lanier |
| 7,677,742 B2 | 3/2010 | Hillmer et al. |
| 7,768,498 B2 | 8/2010 | Wey |
| 7,773,070 B2 | 8/2010 | Trisnadi et al. |
| 7,939,932 B2 | 5/2011 | Martin |
| 8,013,901 B2 | 9/2011 | Fukuhara et al. |
| 8,019,166 B2 | 9/2011 | Cheng et al. |
| 8,107,056 B1 | 1/2012 | Riza |
| 8,144,173 B2 | 3/2012 | Baba |
| 8,228,299 B1 | 7/2012 | Maloney et al. |
| 8,231,809 B2 | 7/2012 | Pschirer et al. |
| 8,345,003 B1 | 1/2013 | Trisnadi et al. |
| 8,363,526 B2 | 1/2013 | Hotta et al. |
| 8,390,793 B2 | 3/2013 | Yamaguchi et al. |
| 8,411,289 B2 | 4/2013 | Takahashi |
| 8,477,580 B2 | 7/2013 | Yamamoto et al. |
| 8,563,855 B2 | 10/2013 | Pschirer et al. |
| 8,593,565 B2 | 11/2013 | Shuster |
| 8,902,354 B2 | 12/2014 | Shuster |
| 8,908,157 B2 | 12/2014 | Eisele et al. |
| 9,104,910 B2 | 8/2015 | Huang |
| 9,385,326 B2 | 7/2016 | Wonneberger et al. |
| 9,389,315 B2 | 7/2016 | Bruder et al. |
| 9,428,518 B2 | 8/2016 | Wonneberger et al. |
| 9,557,856 B2 | 1/2017 | Send et al. |
| 9,665,182 B2 | 5/2017 | Send et al. |
| 9,741,954 B2 | 8/2017 | Bruder et al. |
| 9,829,564 B2 | 11/2017 | Bruder et al. |
| 9,919,999 B2 | 3/2018 | Koenemann et al. |
| 9,958,535 B2 | 5/2018 | Send et al. |
| 9,989,623 B2 | 6/2018 | Send et al. |
| 10,012,532 B2 | 7/2018 | Send et al. |
| 10,094,927 B2 | 10/2018 | Send et al. |
| 10,120,078 B2 | 11/2018 | Bruder et al. |
| 2001/0025938 A1 | 10/2001 | Imai |
| 2002/0011576 A1 | 1/2002 | Cho et al. |
| 2003/0017360 A1 | 1/2003 | Tai et al. |
| 2003/0094607 A1 | 5/2003 | Guenther et al. |
| 2003/0128351 A1 | 7/2003 | Schmidt |
| 2003/0132391 A1 | 7/2003 | Agano |
| 2003/0227635 A1 | 12/2003 | Muller |
| 2004/0178325 A1 | 9/2004 | Forrest et al. |
| 2004/0190117 A1 | 9/2004 | Kubaink |
| 2004/0216625 A1 | 11/2004 | Birnstock et al. |
| 2005/0052120 A1 | 3/2005 | Gupta et al. |
| 2005/0061957 A1 | 3/2005 | Kase |
| 2005/0122308 A1 | 6/2005 | Bell et al. |
| 2005/0184301 A1 | 8/2005 | Nagasaka et al. |
| 2005/0217720 A1 | 10/2005 | Rey-Mermet et al. |
| 2005/0227390 A1 | 10/2005 | Shtein et al. |

(56) References Cited

U.S. PATENT DOCUMENTS

| | | |
|---|---|---|
| 2005/0227406 A1 | 10/2005 | Shtein et al. |
| 2005/0268957 A1 | 12/2005 | Enomoto et al. |
| 2005/0269616 A1 | 12/2005 | Andriessen |
| 2006/0049397 A1 | 3/2006 | Pfeiffer et al. |
| 2006/0065833 A1 | 3/2006 | Craig et al. |
| 2006/0075585 A1 | 4/2006 | Krieger et al. |
| 2006/0082546 A1 | 4/2006 | Wey |
| 2007/0008515 A1 | 1/2007 | Otani et al. |
| 2007/0010924 A1 | 1/2007 | Otani et al. |
| 2007/0046625 A1 | 3/2007 | Yee |
| 2007/0080925 A1 | 4/2007 | Radivojevic et al. |
| 2007/0109558 A1 | 5/2007 | Harding |
| 2007/0122927 A1 | 5/2007 | Li et al. |
| 2007/0176165 A1 | 8/2007 | Forrest et al. |
| 2007/0183047 A1 | 8/2007 | Phillips et al. |
| 2007/0206181 A1 | 9/2007 | Arenberg et al. |
| 2008/0080789 A1 | 4/2008 | Marks |
| 2008/0157965 A1 | 7/2008 | Shahar |
| 2008/0170750 A1 | 7/2008 | Gordon |
| 2008/0259310 A1 | 10/2008 | Wada |
| 2008/0269482 A1 | 10/2008 | Pschirer et al. |
| 2008/0284925 A1 | 11/2008 | Han |
| 2008/0297487 A1 | 12/2008 | Hotelling et al. |
| 2009/0009747 A1 | 1/2009 | Wolf |
| 2009/0046543 A1 | 2/2009 | De Hoog et al. |
| 2009/0097010 A1 | 4/2009 | Yamaguchi |
| 2009/0153841 A1 | 6/2009 | Ophey et al. |
| 2009/0185158 A1 | 7/2009 | Wolf |
| 2009/0188547 A1 | 7/2009 | Hayashi et al. |
| 2009/0225319 A1 | 9/2009 | Lee |
| 2009/0231582 A1 | 9/2009 | Aebischer |
| 2009/0322677 A1 | 12/2009 | Lee et al. |
| 2010/0073462 A1 | 3/2010 | Lee et al. |
| 2010/0091263 A1 | 4/2010 | Kumagai et al. |
| 2010/0141964 A1 | 6/2010 | Horsch |
| 2010/0194942 A1 | 8/2010 | Wada |
| 2010/0231513 A1 | 9/2010 | Deliwala |
| 2010/0258179 A1 | 10/2010 | Wieting |
| 2010/0279458 A1 | 11/2010 | Yeh |
| 2010/0282309 A1 | 11/2010 | Pschirer et al. |
| 2010/0283868 A1 | 11/2010 | Clark et al. |
| 2010/0297405 A1 | 11/2010 | Flores et al. |
| 2011/0032365 A1 | 2/2011 | Yett |
| 2011/0055846 A1 | 3/2011 | Perez et al. |
| 2011/0096319 A1 | 4/2011 | Otani et al. |
| 2011/0099105 A1 | 4/2011 | Mennie et al. |
| 2011/0103215 A1 | 5/2011 | Hotta et al. |
| 2011/0123188 A1 | 5/2011 | Cardwell et al. |
| 2011/0127788 A1 | 6/2011 | Nakanishi |
| 2011/0181553 A1 | 7/2011 | Brown et al. |
| 2011/0194097 A1 | 8/2011 | Yamaguchi et al. |
| 2011/0284756 A1 | 11/2011 | Miko et al. |
| 2011/0286661 A1 | 11/2011 | Lee et al. |
| 2011/0297235 A1 | 12/2011 | Bergmann |
| 2011/0306413 A1 | 12/2011 | Bickerstaff et al. |
| 2011/0317146 A1 | 12/2011 | Gu et al. |
| 2012/0013885 A1 | 1/2012 | Yang et al. |
| 2012/0061587 A1 | 3/2012 | Wu |
| 2012/0062517 A1 | 3/2012 | Lai et al. |
| 2012/0063287 A1 | 3/2012 | Yamamoto et al. |
| 2012/0146028 A1 | 6/2012 | Oda et al. |
| 2012/0160298 A1 | 6/2012 | Kanamoto et al. |
| 2012/0206336 A1 | 8/2012 | Bruder |
| 2012/0242867 A1 | 9/2012 | Shuster |
| 2012/0249998 A1 | 10/2012 | Eisele et al. |
| 2012/0250137 A1 | 10/2012 | Maxik et al. |
| 2012/0262365 A1 | 10/2012 | Mallinson |
| 2012/0289672 A1 | 11/2012 | Kastler et al. |
| 2012/0293651 A1 | 11/2012 | Kawamata et al. |
| 2012/0320160 A1 | 12/2012 | Drazic |
| 2012/0328906 A1 | 12/2012 | Kwon et al. |
| 2013/0076695 A1 | 3/2013 | Gomez et al. |
| 2013/0135604 A1 | 5/2013 | Gogolla et al. |
| 2013/0201492 A1 | 8/2013 | Takahashi |
| 2013/0222551 A1 | 8/2013 | Shamir et al. |
| 2013/0235390 A1 | 9/2013 | Holzapfel et al. |
| 2013/0242283 A1 | 9/2013 | Bailey et al. |
| 2013/0271818 A1 | 10/2013 | Maxik et al. |
| 2013/0320302 A1 | 12/2013 | Park et al. |
| 2014/0015242 A1 | 1/2014 | Forrest |
| 2014/0066656 A1 | 3/2014 | Bruder et al. |
| 2014/0078376 A1 | 3/2014 | Shuster |
| 2014/0124782 A1 | 5/2014 | Jung et al. |
| 2014/0132724 A1 | 5/2014 | Choi et al. |
| 2014/0209789 A1 | 7/2014 | Hu |
| 2014/0211295 A1 | 7/2014 | Maxik et al. |
| 2014/0217329 A1 | 8/2014 | Hayoz et al. |
| 2014/0233028 A1 | 8/2014 | Englund |
| 2014/0291480 A1 | 10/2014 | Bruder et al. |
| 2014/0347442 A1 | 11/2014 | Wang et al. |
| 2014/0368726 A1 | 12/2014 | Gladnick |
| 2015/0085166 A1 | 3/2015 | Shuster |
| 2015/0111337 A1 | 4/2015 | Welker et al. |
| 2015/0124241 A1 | 5/2015 | Eisele et al. |
| 2015/0124268 A1 | 5/2015 | Bruder et al. |
| 2015/0132887 A1 | 5/2015 | Welker et al. |
| 2015/0286340 A1 | 10/2015 | Send et al. |
| 2015/0346911 A1 | 12/2015 | Christiansson |
| 2015/0372046 A1 | 12/2015 | Kim et al. |
| 2016/0099429 A1 | 4/2016 | Bruder et al. |
| 2016/0124074 A1 | 5/2016 | Wonneberger et al. |
| 2016/0127664 A1 | 5/2016 | Bruder et al. |
| 2016/0139243 A1 | 5/2016 | Send et al. |
| 2016/0140786 A1 | 5/2016 | Wang |
| 2016/0155575 A1 | 6/2016 | Yamato et al. |
| 2016/0177177 A1 | 6/2016 | Koenemann et al. |
| 2016/0211464 A1 | 7/2016 | Tanabe et al. |
| 2016/0218302 A1 | 7/2016 | Hermes et al. |
| 2016/0248021 A1 | 8/2016 | Sundarraj et al. |
| 2016/0266257 A1 | 9/2016 | Bruder et al. |
| 2016/0320489 A1 | 11/2016 | Send et al. |
| 2016/0364015 A1 | 12/2016 | Send et al. |
| 2017/0039793 A1 | 2/2017 | Send et al. |
| 2017/0074652 A1 | 3/2017 | Send et al. |
| 2017/0082426 A1 | 3/2017 | Bruder et al. |
| 2017/0082486 A1 | 3/2017 | Send et al. |
| 2017/0123593 A1 | 5/2017 | Send et al. |
| 2017/0183295 A1 | 6/2017 | Koenemann et al. |
| 2017/0205230 A1 | 7/2017 | Send et al. |
| 2017/0219694 A1 | 8/2017 | Send et al. |
| 2017/0219709 A1 | 8/2017 | Send et al. |
| 2017/0237926 A1 | 8/2017 | Bruder et al. |
| 2017/0250334 A1 | 8/2017 | Hermes et al. |
| 2017/0363465 A1 | 12/2017 | Send et al. |
| 2017/0363741 A1 | 12/2017 | Send et al. |
| 2018/0003993 A1 | 1/2018 | Send et al. |
| 2018/0007343 A1 | 1/2018 | Send et al. |
| 2018/0017679 A1 | 1/2018 | Valouch et al. |
| 2018/0067213 A1 | 3/2018 | Send et al. |
| 2018/0136319 A1 | 5/2018 | Send et al. |
| 2018/0210064 A1 | 7/2018 | Send et al. |
| 2018/0231376 A1 | 8/2018 | Send et al. |
| 2018/0238993 A1 | 8/2018 | Send et al. |
| 2018/0249051 A1 | 8/2018 | Send et al. |
| 2018/0276843 A1 | 9/2018 | Send et al. |
| 2018/0329024 A1 | 11/2018 | Send et al. |
| 2018/0356501 A1 | 12/2018 | Send et al. |
| 2019/0129035 A1 | 5/2019 | Valouch et al. |
| 2019/0129036 A1 | 5/2019 | Valouch et al. |
| 2019/0140129 A1 | 5/2019 | Valouch et al. |
| 2019/0157470 A1 | 5/2019 | Send et al. |
| 2019/0170849 A1 | 6/2019 | Hermes et al. |
| 2019/0172964 A1 | 6/2019 | Hermes et al. |
| 2019/0277703 A1 | 9/2019 | Valouch et al. |

FOREIGN PATENT DOCUMENTS

| | | |
|---|---|---|
| CN | 1270706 | 10/2000 |
| CN | 1677053 A | 10/2005 |
| CN | 1723564 A | 1/2006 |
| CN | 1777859 | 5/2006 |
| CN | 1809801 A | 7/2006 |
| CN | 1896686 A | 1/2007 |
| CN | 101290348 A | 10/2008 |

(56) References Cited

FOREIGN PATENT DOCUMENTS

| | | |
|---|---|---|
| CN | 101449181 | 6/2009 |
| CN | 101650173 A | 2/2010 |
| CN | 101655350 | 2/2010 |
| CN | 101859439 A | 10/2010 |
| CN | 102096962 | 6/2011 |
| CN | 201897828 | 7/2011 |
| CN | 102435136 | 5/2012 |
| CN | 102506754 A | 6/2012 |
| CN | 102549381 A | 7/2012 |
| CN | 102737435 | 10/2012 |
| CN | 102833569 | 12/2012 |
| CN | 103106411 A | 5/2013 |
| CN | 103322910 A | 9/2013 |
| CN | 103403494 | 11/2013 |
| CN | 103492835 | 1/2014 |
| CN | 103649677 | 3/2014 |
| CN | 103650478 | 3/2014 |
| DE | 2 417 854 | 10/1974 |
| DE | 25 01 124 A1 | 8/1975 |
| DE | 32 25 372 A1 | 2/1983 |
| DE | 42 11 875 | 10/1993 |
| DE | 196 04 856 | 8/1997 |
| DE | 10146752 | 4/2002 |
| DE | 10 2005 043 627 | 3/2007 |
| DE | 10 2005 053 9 | 5/2007 |
| DE | 10 2007 037 875 A1 | 2/2009 |
| DE | 202012009070 U1 | 11/2012 |
| DE | 102014108353 A1 | 12/2014 |
| EP | 0 112 169 A2 | 6/1984 |
| EP | 0 185 450 A2 | 6/1986 |
| EP | 0 309 631 | 4/1989 |
| EP | 0 754 930 A2 | 1/1997 |
| EP | 1 176 646 A1 | 1/2002 |
| EP | 1 191 819 | 3/2002 |
| EP | 1 330 117 | 7/2003 |
| EP | 1 373 272 | 1/2004 |
| EP | 1 667 246 A1 | 6/2006 |
| EP | 1 832 910 | 9/2007 |
| EP | 1 947 477 | 7/2008 |
| EP | 2 527 866 A1 | 11/2012 |
| EP | 2 725 617 A1 | 4/2014 |
| EP | 2 735 542 | 5/2014 |
| EP | 2 813 324 | 12/2014 |
| EP | 2 818 493 A1 | 12/2014 |
| EP | 15 153 215 | 1/2015 |
| EP | 15 157 363 | 3/2015 |
| EP | 15 164 653 | 4/2015 |
| EP | 2 884 303 A1 | 6/2015 |
| EP | 15 177 275 | 7/2015 |
| EP | 15 180 353 | 8/2015 |
| EP | 15 180 354 | 8/2015 |
| EP | 15 185 005 | 9/2015 |
| EP | 15 191 960 | 10/2015 |
| EP | 15 196 238 | 11/2015 |
| EP | 15 196 239 | 11/2015 |
| EP | 15 197 744 | 12/2015 |
| EP | 15 155 835 | 2/2016 |
| EP | 16 155 834 | 2/2016 |
| EP | 16 155 845 | 2/2016 |
| GB | 2 432 723 | 5/2007 |
| JP | S59-50579 | 3/1984 |
| JP | 61-89501 | 5/1986 |
| JP | S61-135280 | 6/1986 |
| JP | 61-186804 | 8/1986 |
| JP | 61-245579 | 10/1986 |
| JP | H02-170004 | 6/1990 |
| JP | 04-240817 | 8/1992 |
| JP | 5-48833 A | 2/1993 |
| JP | 05-240640 | 9/1993 |
| JP | 8-159714 | 6/1996 |
| JP | 8-292586 A | 11/1996 |
| JP | 10-26513 A | 1/1998 |
| JP | 10-221064 | 8/1998 |
| JP | H11-230860 | 8/1999 |
| JP | 11-257917 | 9/1999 |
| JP | 2001-516150 | 9/2001 |
| JP | 2002-176191 | 6/2002 |
| JP | 2003-307407 | 10/2003 |
| JP | 2004-508691 | 3/2004 |
| JP | 2005-509909 | 4/2005 |
| JP | 2005-241340 A | 9/2005 |
| JP | 2006-514366 | 4/2006 |
| JP | 2007-521559 | 8/2007 |
| JP | 2007-530978 | 11/2007 |
| JP | 2008-522418 | 6/2008 |
| JP | 2010-081002 | 4/2010 |
| JP | 2010-218770 | 9/2010 |
| JP | 2010-531520 | 9/2010 |
| JP | 2011-503673 | 1/2011 |
| JP | 2011-027707 | 2/2011 |
| JP | 2012-519584 | 8/2012 |
| JP | 2012-522248 | 9/2012 |
| JP | 2012-229964 | 11/2012 |
| JP | 2012-231154 | 11/2012 |
| JP | 2013-051674 | 3/2013 |
| TW | 2011-40111 A | 11/2011 |
| WO | 99-09603 | 2/1999 |
| WO | WO 01/29576 A1 | 4/2001 |
| WO | WO 02/076988 | 10/2002 |
| WO | WO 02/101838 A1 | 12/2002 |
| WO | 03/012371 A1 | 2/2003 |
| WO | WO 03/098617 | 11/2003 |
| WO | WO 2004/072909 | 8/2004 |
| WO | WO 2004/114112 A1 | 12/2004 |
| WO | WO 2005/106965 A1 | 11/2005 |
| WO | WO 2007/006717 | 1/2007 |
| WO | WO 2007/054470 A1 | 5/2007 |
| WO | WO 2008/122531 | 10/2008 |
| WO | WO 2008/145172 | 12/2008 |
| WO | WO 2009/013282 A1 | 1/2009 |
| WO | WO 2009/021859 | 2/2009 |
| WO | WO 2009/053291 A1 | 4/2009 |
| WO | WO 2009/058115 A1 | 5/2009 |
| WO | WO 2009/105801 | 9/2009 |
| WO | WO 2010/088032 A2 | 8/2010 |
| WO | WO 2010/094636 A1 | 8/2010 |
| WO | WO 2010/118409 | 10/2010 |
| WO | WO 2010/118450 | 10/2010 |
| WO | WO 2011/067192 A2 | 6/2011 |
| WO | WO 2011/083722 | 7/2011 |
| WO | WO 2011/091967 A2 | 8/2011 |
| WO | WO 2012/001628 A1 | 1/2012 |
| WO | WO 2012/046181 A1 | 4/2012 |
| WO | WO 2012/049038 A1 | 4/2012 |
| WO | WO 2012/085803 A1 | 6/2012 |
| WO | WO 2012/110924 A1 | 8/2012 |
| WO | WO 2012/115593 | 8/2012 |
| WO | WO 2012/139354 | 10/2012 |
| WO | 2012/152812 A1 | 11/2012 |
| WO | 2012/168395 A1 | 12/2012 |
| WO | WO 2006/134370 | 12/2012 |
| WO | WO 2013/009676 | 1/2013 |
| WO | WO 2013/090960 | 6/2013 |
| WO | WO 2013/091016 A1 | 6/2013 |
| WO | 2013/118037 A1 | 8/2013 |
| WO | WO 2013/116883 | 8/2013 |
| WO | WO 2013/144177 A1 | 10/2013 |
| WO | WO 2013/156101 A1 | 10/2013 |
| WO | 2013/170982 A1 | 11/2013 |
| WO | 2014/086722 A1 | 6/2014 |
| WO | 2014/097489 A1 | 6/2014 |
| WO | WO 2014/097181 A1 | 6/2014 |
| WO | WO 2014/123522 | 8/2014 |
| WO | 2014/178923 A2 | 11/2014 |
| WO | 2014/198623 A1 | 12/2014 |
| WO | 2014/198625 A1 | 12/2014 |
| WO | 2014/198626 A1 | 12/2014 |
| WO | 2014/198629 A1 | 12/2014 |
| WO | WO 2015/024871 | 2/2015 |
| WO | WO 2015/081362 | 6/2015 |
| WO | WO 2015/091607 | 6/2015 |
| WO | WO 2015/159192 | 10/2015 |
| WO | WO 2015/161989 | 10/2015 |
| WO | WO 2015/162528 | 10/2015 |

(56) References Cited

FOREIGN PATENT DOCUMENTS

| WO | WO 2015/177784 A2 | 11/2015 | | |
|---|---|---|---|---|
| WO | 2015/193804 A2 | 12/2015 | | |
| WO | 2016/005893 A1 | 1/2016 | | |
| WO | 2016/092454 A1 | 6/2016 | | |
| WO | WO 2016/083914 | 6/2016 | | |
| WO | WO 2016/120392 | 8/2016 | | |
| WO | WO-2016120392 A1 * | 8/2016 | ........... | A63F 13/655 |
| WO | WO 2016/146725 | 9/2016 | | |

OTHER PUBLICATIONS

Erwin Bacher, et al., "Synthesis and Characterization of Photo-Cross-Linkable Hole-Conducting Polymers", Macromolecules, vol. 38, 2005, pp. 1640-1647.

H. Bruce Goodbrand, et al., "Ligand-Accelerated Catalysis of the Ullmann Condensation: Application to Hole Conducting Triarylamines", J. Org. Chem., vol. 64, 1999, pp. 670-674.

Felix E. Goodson, et al., "Palladium-Catalyzed Synthesis of Pure, Regiodefined Polymeric Triarylamines", J. Am. Chem. Soc., vol. 121, 1999, pp. 7527-7539.

John F. Hartwig, "Transition Metal Catalyzed Synthesis of Arylamines and Aryl Ethers from Aryl Halides and Triflates: Scope and Mechanism", Angew. Chem. Int. Ed., vol. 37, 1998, pp. 2046-2067.

Sheila I. Hauck, et al., "Tetraazacyclophanes by Palladium-Catalyzed Aromatic Amination. Geometrically Defined, Stable, High-Spin Diradicals", Organic Letters, vol. 1, No. 13, 1999, pp. 2057-2060.

Ping-Hsin Huang, et al., "Synthesis and Characterization of new fluorescent two-photon absorption chromophores", J. Mater. Chem., vol. 16, 2006, pp. 850-857.

Qinglan Huang, et al., "Molecularly 'Engineered' Anode Adsorbates for Probing OLED Interfacial Structure-Charge Injection/Luminance Relationships: Large, Structure-Dependent Effects", J. Am. Chem. Soc., vol. 125, 2003, pp. 14704-14705.

A. Balionyte, et al., "Carbazolyl-substituted triphenyldiamine derivatives as novel photoconductive amorphous molecular materials", Journal of Photochemistry and Photobiology A: Chemistry, vol. 162, 2004, pp. 249-252.

G. R. A. Kumara, et al., "Fabrication of Dye-Sensitized Solar Cells Using Triethylamine Hydrothiocyanate as a CuI Crystal Growth Inhibitor", Langmuir, vol. 18, 2002, pp. 10493-10495.

Lukas Schmidt-Mende, et al., "Organic Dye for Highly Efficient Solid-State Dye-Sensitized Solar Cells", Adv. Mater., vol. 17, No. 7, 2005, pp. 813-815.

James Lindley, "Copper Assisted Nucleophilic Substitution of Aryl Halogen", Tetrahedron, vol. 40, No. 9, 1984, pp. 1433-1456.

Yunqi Liu, et al., "Synthesis and characterization of a novel bipolar polymer for light-emitting diodes", Chem. Commun., vol. 24, 1998, pp. 2747-2748.

Narukuni Hirata, et al., "Interface engineering for solid-state dye-sensitised nanocrystalline solar cells: the use of an organic redox cascade", Chem. Commun., vol. 5, 2006, pp. 535-537.

Qingjiang Yu, et al., "High-Efficiency Dye-Sensitized Solar Cells: The Influence of Lithium Ions on Exciton Dissociation, Charge Recombination, and Surface States", ACS Nano, vol. 4, No. 10, 2010, pp. 6032-6038.

Bin Peng, et al., "Systematic investigation of the role of compact $TiO_2$ solar cells", Coordination Chemistry Reviews, vol. 248, 2004, pp. 1479-1489.

Jiun Yi Shen, et al., "High $T_g$ blue emitting materials for electroluminescent devices", J. Mater. Chem., vol. 15, 2005, pp. 2455-2463.

Tobat P. I. Saragi, et al., "Comparison of Charge-Carrier Transport in Thin Films of Spiro-Linked Compounds and Their Corresponding Parent Compounds", Adv. Funct. Mater., vol. 16, 2006, pp. 966-974.

V. P. S. Perera, et al., "Dye-Sensitized Solid-State Photovoltaic Cells Based on Dye Multilayer-Semiconductor Nanostructures", J. Phys. Chem. B, vol. 107, 2003, pp. 13758-13761.

U. Bach, et al., "Solid-state dye-sensitized mesoporous $TiO_2$ solar cells with high photon-to-electron conversion efficiencies", Nature, vol. 395, 1998, pp. 583-585.

John P. Wolfe, et al., "Rational Development of Practical Catalysts for Aromatic Carbon-Nitrogen Bond Formation", Acc. Chem. Res. vol. 31, 1998, pp. 805-818.

Bryant H. Yang, et al., "Palladium-Catalyzed amination of aryl halides and sulfonates", Journal of Organometallic Chemistry, vol. 576, 1999, pp. 125-146.

Zhong Hui Li, et al., "Synthesis and Functional Properties of Strongly Luminescent Diphenylamino End-Capped Oligophenylenes", J. Org. Chem., vol. 69, 2004, pp. 921-927.

Brian O'Regan, et al., "A low-cost, high-efficiency solar cell based on dye-sensitized colloidal $TiO_2$ films", Letters to Nature, vol. 353, 1991, pp. 737-740.

International Search Report dated Sep. 24, 2014 in PCT/EP2014/061682.

International Preliminary Report on Patentability and Written Opinion dated Dec. 15, 2015 in PCT/EP2014/061682.

International Preliminary Report on Patentability and Written Opinion dated Dec. 23, 2015 in PCT/EP2014/061695.

International Search Report and Written Opinion dated May 31, 2012 in PCT/IB2012/050592 filed on Feb. 9, 2012.

Supplementary European Search Report dated Nov. 19, 2014, issued in corresponding European Patent Application No. EP 12 74 6808.

Volker Viereck, et al., Large-area applications of optical MEMS: micromirror arrays guide daylight, optimize indoor illumination, Optical Components, Photonik International 2, 2009, pp. 48-49.

C.U. Murade, et al., "High speed adaptive liquid microlens array", Optics Express, vol. 20, No. 16, Jul. 30, 2012, pp. 18180-18187 . . . .

Jason Heikenfeld, et al., "Recent Progress in Arrayed Electrowetting Optics", Optics & Photonics News, vol. 20, No. 1, Jan. 1, 2009, pp. 20-26.

Tao Peng, "Algorithms and models for 3-D shape measurement using digital fringe projections", Dissertation, University of Maryland (College Park, Md.), Jan. 16, 2007, 268 pages (http://drum.lib.umd.edu//handle/1903/6654; http://en.wikipedia.org/wiki/Gray_code; http://en.wikipedia.org/wiki/Structured-light_3D_scanner).

Jie-Ci Yang et al., "An Intelligent Automated Door Control System Based on a Smart", Sensors, 2013, 13(5), pp. 5923-5936; doi: 10.3390/s130505923 www.mdpi.com/journal/sensors.

Tomas Leijtens, et al., "Hole Transport Materials with Low Glass Transition Temperatures and High Solubility for Application in Solid-State Dye-Sensitized Solar Cells", ACS Nano, vol. 6, No. 2, 2012, pp. 1455-1462 www.acsnano.org.

International Search Report and Written Opinion dated Oct. 31, 2014 in PCT/EP2014/067466 filed Aug. 15, 2014.

Paul Pargas, "Phenomena of Image Sharpness Recognition of CdS and CdSe Photoconductors" Journal of the Optical Society of America, vol. 54, No. 4, Apr. 1964, pp. 516-519.

Paul Pargas, "A Lens Measuring Method Using Photoconductive Cells" Journal of the SMPTE, vol. 74, Jun. 1965, pp. 501-504.

Jack T. Billings, "An Improved Method for Critical Focus of Motion-Picture Optical Printers" Journal of the SMPTE, vol. 80, Aug. 1971, pp. 624-628.

International Search Report dated Sep. 9, 2014 in PCT/EP2014/061688 filed Jun. 5, 2014.

Written Opinion of the International Searching Authority dated Sep. 9, 2014 in PCT/EP2014/061688 filed Jun. 5, 2014.

International Search Report and Written Opinion of the International Searching Authority dated Mar. 12, 2015 in PCT/EP2014/078155 Filed Dec. 17, 2014.

International Search Report and Written Opinion of the International Searching Authority dated May 16, 2014 in PCT/IB2013/061095.

Seigo Ito, et al., "High-Efficiency Organic-Dye-Sensitized Solar Cells Controlled by Nanocrystalline-$TiO_2$ Electrode Thickness", Adv. Mater., vol. 18, 2006, pp. 1202-1205.

Atte Haapalinna, et al., "Measurement of the Absolute Linearity of Photodetectors with a Diode Laser," Meas. Sci. Technol., 10, (1999) 1075-1078.

(56) References Cited

OTHER PUBLICATIONS

M. R. Andersen, et al., "Kinect Depth Sensor Evaluation for Computer Vision Applications",Electrical and Computer Engineering, Technical Report ECE-TR-6, Aarhus University, 2012, 39 pages.
Takumi Kinoshita, et al., "Wideband dye-sensitized solar cells employing a phosphine-coordinated ruthenium sensitizer", Nature Photonics, vol. 7, 2013, pp. 535-239.
Office Action dated Apr. 22, 2015 in Chinese Patent Application No. 201280018328.5 (submitting English translation only).
International Search Report and Written Opinion dated Sep. 3, 2014 in PCT/EP2014/061691.
International Preliminary Report on Patentability dated Sep. 25, 2015 in PCT/EP2014/061691.
Kuthirumal, S., et al., "Flexible Depth of Field Photography," IEEE Transactions on Pattern Analysis and Machine Intelligence, vol. 33, No. 1 (2011), pp. 58-71.
Hiura Shinsaku et al., "Depth Measurement by the Multi-Focus Camera," Computer Vision and Pattern Recognition, 1998. Proceedings. 1998 IEEE Computer Society Conference on Santa Barbara, CA, USA, Jun. 23-25, 1998, pp. 953-959.
International Preliminary Report on Patentability and Written Opinion dated Dec. 23, 2015 in PCT/EP2014/061688.
Klimentjew, D. et al., "Multi Sensor Fusion of Camera and 3D Laser Range Finder for Object Recognition," 2010 IEEE International Conference on Multisensor Fusion and Integration for Intelligent Systems, University of Utah, Salt Lake City, UT, USA, Sep. 5-7, 2010, pp. 236-241.
International Search Report and Written Opinion dated Nov. 21, 2014 in PCT/EP2014/067465.
"New—Ultra-Compact Pockels Cells with Brewster Polarizer and Waveplate for Laser Q-Switching" Leysop Ltd, Manufacturers and Suppliers of Electro-Optic Components—http://www.leysop.com/integrated_pockels_cell.htm, Aug. 4, 2013, 2 Pages.
D. Scaramuzza, et al., "Extrinsic Self Calibration of a Camera and a 3D Laser Range Finder from Natural Scenes" 2007 IEEE/RSJ International Conference on Intelligent Robots and Systems, 2007, pp. 4164-4169.
International Search Report dated Aug. 28, 2015, in PCT/IB2015/052769, filed Apr. 16, 2015.
International Search Report and Written Opinion dated Jun. 30, 2015 in PCT/IB15/052233 Filed Mar. 26, 2015.
International Search Report dated Sep. 22, 2015, in Application No. PCT/IB2015/052785, filed on Apr. 16, 2015.
International Search Report dated Nov. 27, 2015, in PCT/IB2015/055121, filed Jul. 7, 2015.
International Search Report and Written Opinion dated Mar. 29, 2016, in PCT/IB2015/054536, filed Jun. 16, 2015.
International Search Report and Written Opinion dated Jan. 18, 2016 in PCT/IB2015/057412 filed Sep. 28, 2015.
Wang, Feng-Peng et al., "Distance Measurement using Digital Cameras Based on Laser Spot Detection", published on Jun. 30, 2011, School of Physics and Electronic Information, Gannan Normal University, Ganzhou 341000, China (with English Abstract).
Bahaa E. A. Saleh, et al., "Fundamentals of Photonics" John Wiley & Sons, Inc., Chapter 3, 1991, pp. 80-107 (with Cover Page) .
International Search Report dated Mar. 21, 2016, in PCT/IB2015/059406.
International Search Report and Written Opinion in PCT/IB2015/059411 dated Mar. 16, 2016 filed Dec. 7, 2015.
Nam-Trung Nguyen, "Micro-optofluidic Lenses: A review", Biomicrofluidics, 2010, vol. 4, 031501-15.
Uriel Levy et al., "Tunable optofluidic devices", Microfluid Nanofluid, 2008, vol. 4, pp. 97-105.
International Search Report dated Mar. 15, 2016 in PCT/IB2015/059404 filed Dec. 7, 2015.
International Search Report and Written Opinion dated Mar. 21, 2016, in PCT/IB2015/059403, filed Dec. 7, 2015.
International Preliminary Report and Written Opinion dated Mar. 10, 2016, in PCT/IB2015/059404.

International Search Report dated Mar. 22, 2016 in PCT/IB2015/059408 filed Dec. 7, 2015.
International Search Report and Written Opinion dated May 27, 2016, in PCT/EP2016/051817, filed Jan. 28, 2016.
International Search Report dated May 20, 2016, in PCT/EP2016/054532.
International Preliminary Report on Patentability dated Aug. 1, 2017, in PCT/EP2016/051817.
Linyi Bian, et al., "Recent Progress in the Design of Narrow Bandgap Conjugated Polymers for High-Efficiency Organic Solar Cells", Progress in Polymer Science, vol. 37, 2012, pp. 1292-1331.
Antonio Facchetti, "Polymer donor-polymer acceptor (all-polymer) solar Cells", Materials Today, vol. 16 No. 4, Apr. 2013, pp. 123-132.
Graham H. Carey, et al., "Colloidal Quantum Dot Solar Cells", Chemical Reviews, vol. 115 No. 23, 2015, pp. 12732-12763.
Kotaro Fukushima, et al., "Crystal Structures and Photocarrier Generation of Thioindigo Derivatives", Journal of Physical Chemistry B, vol. 102 No. 31, 1998, pp. 5985-5990.
Serap Günes, et al., "Hybrid Solar Cells", Inorganica Chimica Acta, vol. 361, 2008, pp. 581-588.
R. S. Mane, et al., "Chemical Deposition Method for Metal Chalcogenide Thin Films", Materials Chemistry and Physics, vol. 65, 2000, pp. 1-31.
Wilfried Hermes, "Emerging Thin-Film Photovoltaic Technologies", Chemie Ingenieur Technik, 2015, vol. 87 No. 4, pp. 376-389.
Paul H. Keck, "Photoconductivity in Vacuum Coated Selenium Films", Journal Optical Society of America, vol. 42 No. 4, Apr. 1952, pp. 221-225, with cover page.
Frank H. Moser, et al., "Phthalocyanine Compounds", Reinhold Publishing Corporation, 1963, p. 69-76 with cover pages.
M. Popescu, "Disordered Chalcogenide Optoelectronic Materials: Phenomena and Applications", Journal of Optoelectronics and Advanced Materials, vol. 7 No. 4, Aug. 2005, pp. 2189-2210.
Friedrich Andreas Sperlich, "Electron Paramagnetic Resonance Spectroscopy of Conjugated Polymers and Fullerenes for Organic Photovoltaics", Julius-Maximilians-Universität Würzburg, 2013, pp. 1-127.
F. Stöckmann, "Superlinear Photoconductivity", Physica Status Solidi, vol. 34, 1969, pp. 751-757.
Evangelos Theocharous, "Absolute Linearity Measurements on a PbS Detector in the Infrared", Applied Optics, vol. 45 No. 11, Apr. 10, 2006, pp. 2381-2386.
Evangelos Theocharous, et al., "Absolute Linearity Measurements on HgCdTe Detectors in the Infrared Region", Applied Optics, vol. 43 No. 21, Jul. 20, 2004, pp. 4182-4188.
Arthur L.Thomas, "Phthalocyanine Research and Applications", CRC Press, 1990, pp. 253-271 with cover pages.
International Search Report and Written Opinion dated Jul. 19, 2016 in PCT/EP2016/058487 filed Apr. 18, 2016.
International Preliminary Report on Patentability and Written Opinion dated Feb. 1, 2018, in PCT/EP2016/066783.
C. Hahne, A. Aggoun, S. Haxha, V. Velisavljevic, and J. Fernández, "Light field geometry of a standard plenoptic camera," Opt. Express 22, 26659-26673 (2014).
C. Hahne, A. Aggoun, S. Haxha, V. Velisavljevic, and J. Fernández, "Baseline of virtual cameras acquired by a standard plenoptic camera setup," in 3D-TV-Conference: The True Vision—Capture, Transmission and Display of 3D Video (3DTV-CON), Jul. 2-4, 2014.
C. Hahne, A. Aggoun, and V. Velisavljevic, "The refocusing distance of a standard plenoptic photograph," in 3D-TV-Conference: The True Vision—Capture, Transmission and Display of 3D Video (3DTV-CON), Jul. 8-10, 2015.
C. Hahne and A. Aggoun, "Embedded FIR filter design for real-time refocusing using a standard plenoptic video camera," Proc. SPIE 9023, in Digital Photography X, 902305 (Mar. 7, 2014).
Baeg et al., "Organic Light Detectors: Photodiodes and Phototransistors", *Advanced Materials*, vol. 25, No. 31, Mar. 11, 2013, pp. 4267-4295.
Office Action dated Jan. 3, 2018, in Chinese Patent Application No. 201610552144.7 parallel to U.S. Appl. No. 15/364,680.
International Preliminary Report on Patentability and Written Opinion dated Feb. 22, 2018 in PCT/EP2016/069049).

(56) References Cited

OTHER PUBLICATIONS

R. M. Schaffert, "A New High-Sensitivity Organic Photoconductor for Electrophotography", *IBM J. Res. Develop.*, 1971, p. 75-89.

P. Gregory, Ed., Chemistry and Technology of printing and imaging systems, Chapman & Hall, 1996, Chap. 4, R.S. Gairns, *Electrophotography*, p. 76-112.

Benjamin F. Grewe, et al., "Fast Two-Layer Two-Photon Imaging of Neuronal Cell Populations Using an Electrically Tunable Lens," *Biomedical Optics Express*, vol. 2, No. 7, Jul. 1, 2011 (pp. 2035-2046).

Petr Bartu et al, "Conformable Large-AreaPposition-Sensitive Photodetectors Based on Luminescence-Collecting Silicone Waveguides," *Journal of Applied Physics*, 107, 123101 (2010).

Roland Stolarski, "Fluorescent Naphthalimide Dyes for Polyester Fibres," *Fibres & Textiles* in Eastern Europe, vol. 17, No. 2 (73) pp. 91-95 (2009).

Ayse Aktas et al., "Synthesis, Characterization, Electrochemical and Spectroelectrochemical Properties of Peripherally Tetra-Substituted Metal-Free and Metallophthalocyanines," *Dyes and Pigments*, 99, (2013) 613-619.

Hairong Li, et al., "Syntheses and Properties of Octa-, Tetra-, and Di-Hydroxy-Substituted Phthalocyanines," *Tetrahedron*, 65 (2009) 3357-3363.

"Methine Dyes and Pigments," *Ullmann's Encyclopedia of Industrial Chemistry*, vol. 23 (2012).

Jing Liu, et al., "Sulfone-Rhodamines: A New Class of Near-Infrared Fluorescent Dyes for Bioimagin," *ACS Applied Materials& Interfaces*, 8, 22953-22962 (2016).

E. Noelting et al., "Berichte der deutschen chemischen Gesellschaft", *Band*, 38, S. 3516-3527 (1905) . . . .

T. Nedelcev et al., "Preparation and Characterization of a New Derivative of Rhodamine B with an Alkoxysilane Moiety," *Dyes and Pigments*, 76 (2008), 550-556.

Aurore Loudet et al., "BODIPY Dyes and Their Derivatives: Syntheses and Spectroscopic Properties," *Chem.Rev.*, 107 (2007) 4981-4932.

Weili Zhao, et al., "Conformationally Restricted Aza-Bodipy: A Highly fluorescent, Stable, Near-Infrared-Absorbing Dye", *Angew. Chem. Int. Ed.*, 44 (2005) 1677-1679.

Georg M. Fischer, et al., "Near-Infrared Dyes and Fluorophores Based on Diketopyrrolopyrroles," *Angew. Chem. Int. Ed.* 46 (2007) 3750-3753.

Amaresh Mishra et al., "Small Molecule Organic Semiconductors on the Move: Promises for Future Solar Energy Technology," *Angew. Chem. Int. Ed.*, 51, (2012), 2020-2067.

G. Seybold et al., "New Perylene and Violanthrone Dyestuffs for Fluorescent Collectors," *Dyes and Pigments*, 11 (1989) 303-317.

Nam-Trung Nguyen, "Micro-Optofluidic Lenses: A Review", *Biomicrofluidics*, 4, (2010) 031501.

Uriel Levy et al., "Tunable Optofluidic Devices," *Microfluid Nanofluid* (2008) 4: 97-105.

Robert Koeppe et al., "Video-Speed Detection of the Absolute Position of a Light Point on a Large-Area Photodetector Based on Luminescent Waveguides," *Optics Express*, vol. 18, No. 3, (Feb. 1, 2010), 2209.

Office Action dated Jul. 9, 2018, in Japanese Patent Application No. 2017-007544.

Xing Lin, et al., "Coded focal stack photography", Computational Photography (ICCP), 2013 IEEE International Conference on, Apr. 19, 2013, XP032424246, pp. 1-9.

Nabeel A. Riza, et al., "Noncontact distance sensor using spatial signal processing", Optics Letters, Optical Society of America, vol. 34, No. 4, Feb. 15, 2009, XP001522006, pp. 434-436.

Nabeel A. Riza, et al., "Smart agile lens remote optical sensor for three-dimensional object shape measurements", Applied Optics, Optical Society of America, vol. 49, No. 7, Mar. 1, 2010, XP001552714, pp. 1139-1150.

International Search Report dated Nov. 7, 2017, in corresponding PCT/EP2017/057867.

International Search Report dated Jul. 7, 2017, in corresponding PCT/EP2017/057825.

Street (Ed.): Technology and Applications of Amorphous Silicon, Springer-Verlag Heidelberg, 2010, pp. 346-349.

International Search Report dated Aug. 17, 2017, in corresponding PCT/EP2017/060057.

International Search Report dated Aug. 1, 2017, in corresponding PCT/EP2017/060058.

Walter Fuhs, "Hydrogenated Amorphous Silicon—Material Properties and Device Applications", in S. Baranovski, Charge Transport in Disordered Solids, Wiley, p. 97-147, 2006.

A.G. Pattantyus-Abraham, I.J. Kramer, A.R. Barkhouse, X. Wang, G. Konstantatos, R. Debnath, L. Levina, I. Raabe, M.K. Nazeeruddin, M. Grätzel, and E.H. Sargent, *Depleted-Heterojunction Colloidal Quantum Dot Solar Cells*, ACS NANO 4 (6), May 24, 2010.

International Search Report dated Oct. 20, 2017 in PCT/EP2017/068956 filed on Jul. 27, 2017.

Leskela, M. et al., "Preparation of lead sulfide thin films by the atomic layer epitaxy process," Pergamon Press plc, Vacuum/vol. 41/Nos. 4-6, pp. 1457-1459 (1990).

Dasgupta, N. et al., "Fabrication and Characterization of Lead Sulfide Thin Films by Atomic Layer Deposition," The Electrochemical Society, ECS Transactions, 16 (4) 29-36 (2008), Total 8 pages.

Dasgupta, N. et al., "Design of an atomic layer deposition reactor for hydrogen sulfide compatibility," Review of Scientific Instruments 81, 044102 (2010), Total 6 pages.

Xu, J. et al., "Atomic layer deposition of absorbing thin films on nanostructured electrodes for short-wavelength infrared photosensing," AIP Publishing, Applied Physics Letters 107, 153105 (2015), Total 5 pages.

Blount, G., et al., "Photoconductive properties of chemically deposited PbS with dielectric overcoatings,"AIP Publishing, Journal of Applied Physics 46, 3489 (1975), Total 12 pages.

Groner, M. et al., "Low-Temperature $Al_2O_3$ Atomic Layer Deposition," American Chemical Society, Chem. Mater., vol. 16, No. 4, 2004, pp. 639-645.

Yoon, W. et al., "Electrical Measurement Under Atmospheric Conditions of PbSe Nanocrystal Thin Films Passivated by Remote Plasma Atomic Layer Deposition of $Al_2O_3$," IEEE Transactions on Nanotechnology, vol. 12, No. 2, Mar. 2013, pp. 146-151.

Hu, C., et al., "Air-stable short-wave infrared PbS colloidal quantum dot photoconductors passivated with $Al_2O_3$ atomic layer deposition," AIP Publishing, Applied Physics Letters 105, 171110 (2014), Total 5 pages.

Liu, Y., et al., "Robust, Functional Nanocrystal Solids by Infilling with Atomic Layer Deposition," ACS Publications, American Chemical Society, Nano Letters 2011, 11, pp. 5349-5355.

Liu, Y., et al., "PbSe Quantum Dot Field-Effect Transistors with Air-Stable Electron Mobilities above 7 $cm^2$ $V^{-1}$ $s^{-1}$," ACS Publications, American Chemical Society, Nano Letters 2013, 13, pp. 1578-1587.

George, S., "Atomic Layer Deposition: An Overview," American Chemical Society, Chem. Rev. 2010, 110, pp. 111-131.

Konstantatos, G., et al., "Engineering the Temporal Response of Photoconductive Photodetectors via Selective Introduction of Surface Trap States," American Chemical Society, Nano Letters 2008, vol. 8, No. 5, pp. 1446-1450.

Soci, C., et al., "ZnO Nanowire UV Photodetectors with High Internal Gain," American Chemical Society, Nano Letters 2007, vol. 7, No. 4, pp. 1003-1009.

List of integrated circuit packaging types (Wikipedia article, downloaded Jan. 15, 2019 from https://en.wikipedia.org/wiki/List_of_integrated_circuit_packaging_types).

List of integrated circuit packaging types, Dimension Reference (Wikipedia article, downloaded Jan. 15, 2019 from https://en.wikipedia.org/wiki/List_of_integrated_circuit_packaging_types#PIN-PITCH).

*Wikipedia*, Article denoted, "Thermocouple", retrieved Jul. 20, 2016.

Chinese Office Action dated Jan. 29, 2019, in Chinese Patent Application No. 201580036919.9.

(56) References Cited

OTHER PUBLICATIONS

Pekkola et al., "Focus-Induced Photoresponse: a novel way to measure distances with photodetectors", *Scientific Reports* (2018) 8:9208, 8 pages.
L. Pintilie, et al., "Field-effect-assisted photoconductivity in PbS films deposited on silicon dioxide", *J. Appl. Phys.* 91, p. 5782, 2002.
Kurt Konolige et al., "A Low-Cost Laser Distance Sensor", *2008 IEEE International Conference on Robotics and Automation*, Pasadena, CA, May 19-23, 2008.
International Preliminary Report on Patentability and Written Opinion dated Aug. 22, 2019 in PCT/EP2018/053057.
J. Robertson, "High Dielectric Constant Oxides", *European Physical Journal Applied Physics*, vol. 28, No. 3, pp. 265-291, 2004.
J.A. Kittl et al., "High-k Dielectrics for Future Generation Memory Devices", *Microelectronic Engineering*, Vo. 86 (2009) 1789-1795.
Serap Günes, et al., "Hybrid Solar Cells", *Inorganica Chimica Acta* 361, (2008), p. 581-588.
John E. Anthony, et al., "n-Type Organic Semiconductors in Organic Electronics", *Adv. Mater.* 2010, 22, pp. 3876-3892.
Tian-yi Li, et al., "Small Molecule Near-Infrared Boron Dipyrromethene Donors for Organic Tandem Solar Cells", *J. Am. Chem. Soc.* 2017, 139, 13636-13639.
Christian Ulrich et al., "Organic Thin-Film Photovoltaic Cells Based on Oligothiophenes with Reduced Bandgap", *Adv. Funct. Mater.* 2007, 17, pp. 2991-2999.
Ronald Gresser, et al., "Synthesis and Characterization of Near-Infrared Absorbing Benzannulated Aza-BODIPY Dyes", *Chem. Eur. J.* 2011, 17, pp. 2939-2947.
Amaresh Mishra, et al., "Small Molecule Organic Semiconductors on the Move: Promises for Future Solar Energy Technology", *Angew. Chem. Int. Ed.* 2012, 51, 2020-2067.
Huifeng Yao, et al., "Molecular Design of Benzodithiophene-Based Organic Photovoltaic Materials", *Chem. Rev.* 2016, 116, 7397-7457.
Moritz Riede, et al., "Efficient Organic Tandem Solar Cells based on Small Molecules", *Adv. Funct. Mater.* 2011, 21, pp. 3019-3028.
Rico Schueppel, et al., "Controlled Current Matching in Small Molecule Organic Tandem Solar Cells Using Doped Spacer Layers", *J. Appl. Phys.* 107, 044503, 2010.
Jan Meiss et al., "Fluorinated Zinc Phthalocyanine as Donor for Efficient Vacuum-Deposited Organic Solar Cells," *Adv. Funct. Mater.* 2012, 22, pp. 405-414.
Japanese Office Action dated Nov. 5, 2019, in corresponding Japanese Patent Application No. 2017-558775 w/English translation.
U.S. Appl. No. 16/500,113, filed Oct. 2, 2019, Altenbeck, et al.
U.S. Appl. No. 13/357,206, filed Jan. 24, 2012, U.S. Pat. No. 9,001,029, Bruder, et al.
U.S. Appl. No. 14/132,570, filed Dec. 18, 2013, U.S. Pat. No. 9,389,315, Bruder, et al.
U.S. Appl. No. 14/460,529, filed Aug. 15, 2014, U.S. Pat. No. 9,665,182, Send, et al.
U.S. Appl. No. 14/598,432, filed Jan. 16, 2015, US 2015-0124268, Bruder, et al.
U.S. Appl. No. 14/897,981, filed Dec. 11, 2015, US 2016-0124074, Wonneberger, et al.
U.S. Appl. No. 15/099,717, filed Apr. 15, 2016, U.S. Pat. No. 10,120,078, Bruder, et al.
U.S. Appl. No. 15/105,489, filed Jun. 16, 2016, US 2016-0320489, Send, et al.
U.S. Appl. No. 15/301,112, filed Sep. 30, 2016, US 2017-0140786, Send, et al.
U.S. Appl. No. 15/304,328, filed Oct. 14, 2016, US 2017-0039793, Send, et al.
U.S. Appl. No. 15/305,379, filed Oct. 20, 2016, US 2017-0074652, Send, et al.
U.S. Appl. No. 15/319,156, filed Dec. 15, 2016, US 2017-0123593, Send, et al.
U.S. Appl. No. 15/364,680, filed Nov. 30, 2016, US 2017-0082426, Bruder, et al.
U.S. Appl. No. 15/324,223, filed Jan. 5, 2017, US 2017-0205230, Send, et al.
U.S. Appl. No. 15/514,830, filed Mar. 28, 2017, U.S. Pat. No. 10,094,927, Send, et al.
U.S. Appl. No. 15/492,007, filed Apr. 20, 2017, U.S. Pat. No. 9,958,535, Send, et al.
U.S. Appl. No. 15/534,335, filed Jun. 8, 2017, US 2017-0363465, Send, et al.
U.S. Appl. No. 15/534,294, filed Jun. 8, 2017, US 2018-0276843, Send, et al.
U.S. Appl. No. 15/533,572, filed Jun. 6, 2017, US 2018-0003993, Send, et al.
U.S. Appl. No. 15/534,343, filed Jun. 8, 2017, US 2018-0007343, Send, et al.
U.S. Appl. No. 15/534,041, filed Jun. 8, 2017, US 2017-0363741, Send, et al.
U.S. Appl. No. 15/547,664, filed Jul. 31, 2017, US 2018-0017679, Valouch, et al.
U.S. Appl. No. 15/554,496, filed Aug. 30, 2017, US 2018-0067213, Send, et al.
U.S. Appl. No. 15/567,885, filed Oct. 19, 2017, US 2018-0136319, Send, et al.
U.S. Appl. No. 15/751,283, filed Feb. 8, 2018, US 2018-0231376, Send, et al.
U.S. Appl. No. 15/775,424, filed May 11, 2018, US 2018-0329024, Send, et al.
U.S. Appl. No. 15/778,454, filed May 23, 2018, US 2018-0356501, Send, et al.
U.S. Appl. No. 16/090,990, filed Oct. 3, 2018, US 2019-0140129, Valouch, et al.
U.S. Appl. No. 16/091,409, filed Oct. 4, 2018, US 2019-0157470, Send, et al.
U.S. Appl. No. 16/094,402, filed Oct. 17, 2018, US 2019-0129036, Valouch, et al.
U.S. Appl. No. 16/095,846, filed Oct. 23, 2018, Valouch, et al.
U.S. Appl. No. 16/096,361, filed Oct. 25, 2018, US 2019-0129035, Valouch, et al.
U.S. Appl. No. 16/321,143, filed Jan. 28, 2019, US 2019-0172964, Hermes, et al.
U.S. Appl. No. 16/321,054, filed Jan. 28, 2019, US 2019-0170849, Hermes, et al.
U.S. Appl. No. 16/344,538, filed Apr. 24, 2019, US 2019-0277703, Valouch, et al.
U.S. Appl. No. 16/344,511, filed Apr. 24, 2019, Valouch, et al.
U.S. Appl. No. 16/484,369, filed Aug. 7, 2019, Lungenschmied, et al.
U.S. Appl. No. 16/478,907, filed Jul. 18, 2019, Valouch, et al.
U.S. Appl. No. 16/623,557, filed Dec. 17, 2019, Lungenschmied, et al.
Clifford et al., "Fast, sensitive and spectrally tuneable colloidal-quantum-dot photodetectors", Nature Nanotechnology, 2008, 5 pages.
DLP-Technologie, "So funktioniert die DLP-Technologie", archived by Internet Archive Wayback Machine on Jun. 8, 2014 with URL http://www.dlp.com/de/technology/how-dlp-works/, 4 pages.
Gairns R.S., "Electrophotography", Chemistry and Technology of Printing and Imaging Systems, 1996, Springer, Dordrecht, pp. 76-112. (Previously provided to the PTO).
Hahne C., "The Standard Plenoptic Camera", archived by Internet Archive Wayback Machine on Oct. 25, 2016 with URL http://www.plenoptic.info/pages/refocusing.html, 3 pages.
SPACEWX, "ISO 21348 Definitions of Solar Irradiance Spectral Categories", archived by Internet Archive Wayback Machine dated Nov. 15, 2016 with URL http://www.spacewx.com/pdf/SET_21348_2004.pdf, 2 pages.
Wikipedia; "Printed Circuit Board", archived by Internet Archive Wayback Machine on Mar. 29, 2017 with URL https://en.wikipedia.org/wiki/Printed_circuit_board, 19 pages.
R. Martins and E. Fortunato, Thin Film Sensitive Detectors: from 1D to 3D Applications, Cha. 8 in R.A. Street (Ed.), Technology and Applications of Amorphous Silicon, Springer, 2010.

\* cited by examiner

OPTICAL DETECTOR

FIELD OF THE INVENTION

The invention relates to a detector for an optical detection, in particular, of radiation within the infrared spectral range, specifically, with regard to sensing at least one optically conceivable property of an object. More particular, the detector may be used for determining transmissivity, absorption, emission, reflectivity, and/or a position of at least one object. Furthermore, the invention relates to a human-machine interface, an entertainment device, a scanning system, a tracking system, a stereoscopic system, and a camera. Further, the invention relates to a method for manufacturing the optical detector and to various uses of the optical detector. Such devices, methods and uses can be employed for example in various areas of daily life, gaming, traffic technology, mapping of spaces, production technology, security technology, medical technology or in the sciences. However, further applications are possible.

PRIOR ART

Optical detectors designed for sensing especially in the infrared spectral range (IR detectors), particularly, comprise thin layers of lead sulfide (PbS) or lead selenide (PbSe) photoconductors which are placed on a transparent substrate. Herein, in order to achieve a high performance the photoconductive layer is comparatively a thin layer which, however, still proves to be at least partially transparent, in particular, for long wavelengths of an incident light beam. Since the IR spectral range comprises wavelengths from 760 nm to 1000 µm, a large partition of the incident light may, thus, be lost in a measurement application. Therefore, in order to reduce this loss of incident light during a measurement in IR detectors, it is known to place a reflective gold coating on the backside of the glass substrate. However, placing an additional gold layer on the backside of the glass substrate requires a sophisticated manufacturing step.

WO 2016/120392 A1 discloses a longitudinal optical sensor designed to generate at least one sensor signal in a manner dependent on an illumination of the sensor region. According to the so-called "FiP effect", the sensor signal, given the same total power of the illumination, is hereby dependent on a geometry of the illumination, in particular on a beam cross-section of the illumination on the sensor region. Furthermore, an optical detector is disclosed which has at least one evaluation device designated to generate at least one item of geometrical information from the sensor signal, in particular at least one item of geometrical information about the illumination and/or the object. Herein, a sensor region of the longitudinal optical sensor comprises a photoconductive material, wherein an electrical conductivity in the photoconductive material, given the same total power of the illumination, is dependent on the beam cross-section of the light beam in the sensor region. Thus, the longitudinal sensor signal is dependent on the electrical conductivity of the photo-conductive material. Preferably, the photoconductive material is selected from lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), or copper zinc tin sulfide (CZTS). Further, solid solutions and/or doped variants thereof are also feasible. Further, a transversal optical sensor having a sensor area is disclosed, wherein the sensor area comprises a layer of the photo-conductive material, preferentially embedded in between two layers of a transparent conducting oxide, and at least two electrodes. Preferably, at least one of the electrodes is a split electrode having at least two partial electrodes, wherein transversal sensor signals provided by the partial electrodes indicate an x- and/or a y-position of the incident light beam within the sensor area.

US 2014/124782 A1 discloses an optical detector which comprises a substrate configured to include a semiconductor material, e.g. Si, Ge, or Si/Ge, as well as a read-out integrated circuit, a sensor layer comprising a chalcogenide material being capable of serving both as an absorption layer and a conversion layer, a detection part electrically connected to the sensor layer and configured to detect a change in resistance of the sensor layer, which may be caused by incident infrared light or heat generated therefrom, an interposition layer located between the substrate and the sensor layer, wherein the interposition layer includes a reflection layer as well as an isolation layer which are sequentially stacked on the substrate.

US 2012/146028 A1 discloses a further optical detector comprising a substrate, in particular a translucent glass substrate, such as a low-alkali glass substrate, or a quartz substrate, a base layer as a substrate layer, a semiconductor layer having at least an n-type region and a p-type region as a sensor layer, and a metal oxide layer as a reflective layer, wherein a portion of incident light that has passed through the semiconductor layer, subsequently, passes through the base layer and, eventually, reaches the upper surface of the metal oxide layer. Due to random asperities being provided on an upper surface of the metal oxide layer, the incident light cannot pass through the metal oxide layer; rather the metal oxide layer, thus, diffusely reflects the incident light.

Despite the advantages as implied by the above-mentioned devices, there still is a need for improvements with respect to a simple, cost-efficient and, still, reliable optical detector.

PROBLEM ADDRESSED BY THE INVENTION

Therefore, a problem addressed by the present invention is that of specifying a device and a method for an optical detection which at least substantially avoids the disadvantages of known devices and methods of this type.

In particular, providing an improved simple, cost-efficient and, still, reliable optical detector for detecting optical radiation, especially within the infrared spectral range, would be desirable, specifically with regard to sensing at least one of transmissivity, absorption, emission and reflectivity. Hereby, the optical detector would, preferably, be arranged in a manner to be capable of reducing or avoiding a loss of incident light, in particular light from the infrared spectral range, as far as possible, wherein the optical detector could be manufactured by applying an easy manufacturing process.

SUMMARY OF THE INVENTION

This problem is solved by the invention with the features of the independent patent claims. Advantageous developments of the invention, which can be realized individually or in combination, are presented in the dependent claims and/or in the following specification and detailed embodiments.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

In a first aspect of the present invention, an optical detector for an optical detection of an incident light beam is disclosed. Herein, the optical detector according to the present invention comprises:

- a circuit carrier designed to carry at least one layer;
- a reflective layer, the reflective layer being placed on a partition of the circuit carrier, wherein the reflective layer is designed to reflect the incident light beam, thereby generating at least one reflected light beam;
- a substrate layer, the substrate layer being directly or indirectly adjacent to the reflective layer, wherein the substrate layer is at least partially transparent with respect to the incident light beam and the reflected light beam;
- a sensor layer, the sensor layer being placed on the substrate layer, wherein the sensor layer is designed to generate at least one sensor signal in a manner dependent on an illumination of the sensor layer by the incident light beam and the reflected light beam; and
- an evaluation device designed to generate at least one item of information by evaluating the sensor signal.

Herein, the listed components may be separate components. Alternatively, two or more of the components may be integrated into one component. Preferably, the evaluation device may be formed as a separate evaluation device independent from the other optical components, but may preferably be connected to the sensor layer in order to receive the sensor signal. However, other kinds of arrangements may also be feasible.

As generally used, the term "optical detector" may, particularly, be designed for detecting at least one wavelength in at least a partition of a spectral range, wherein the desired partition of the spectral range may be selected from the ultraviolet (UV) spectral range, the visible (VIS) spectral range and/or the infrared (IR) spectral range. For the optical detector or, simply, the detector according the present invention, the IR range, i.e. the spectral range of 760 nm to 1000 µm, may, especially, be preferred.

According to the present invention, the detector comprises a circuit carrier which is designed to carry at least one layer, in particular, at least one reflective layer as described below in more detail. As used herein, the term "circuit carrier" refers to a carrier provided for carrying at least one electronical, electrical, and/or optical element, in particular a plurality of such elements, wherein the carrier is designed to mechanically support and electrically connect these electronical, electrical, and/or optical elements. In a preferred embodiment, the circuit carrier may be a planar circuit carrier. As generally used, the term "planar" refers to a body which comprises extensions in two dimensions, typically denominated as "surface" of the planar body, which exceed the extension in a third dimension, usually denoted by "thickness" of the planar body, by a factor of at least 10, preferably of at least 100, more preferred of at least 1000. In an alternative embodiment, non-planar circuit carriers may also be applicable, in particular one of a flex printed circuit (FPC) or a mechatronic integrated device (MID).

In a particularly preferred embodiment, the circuit carrier may be or comprise a printed circuit board, usually abbreviated to "PCB", which refers to an electrically non-conductive, planar substrate, which may also be denoted as a board, on which at least one sheet of an electrically conductive material, in particular a copper layer, is applied to, specifically laminated, onto the substrate. Other terms which refer to this type of circuit carrier which, in addition, comprises one or more electronical, electrical, and/or optical elements may also be denoted as a printed circuit assembly, short "PCA", a printed circuit board assembly, short "PCB assembly" or "PCBA", circuit card assembly or short "CCA" or simply "card". In the PCB, the insulating substrate may comprise a glass epoxy, wherein a cotton paper impregnated with a phenolic resin, typically tan or brown, may also be sued as the substrate material. Depending on a number of sheets, the printed circuit board may be a single-sided PCB, a two-layer or double-sided PCB, or a multi-layer PCB, wherein different sheets are connected with each other by using so-called "vias". For the purposes of the present invention, an application of a single-sided PCB may be sufficient; however other kinds of printed circuit boards may also be applicable. A double-sided PCB may have metal on both sides while a multi-layer PCB may be designed by sandwiching additional metal layers between further layers of insulating material. Further, by using two double-sided PCBs, a four-layer PCB may be generated, wherein two first layers may be used as power a supply and a ground plane whereas two second layers may be used as a signal wiring between electrical components. In a multi-layer PCB, the layers can be laminated together in an alternating manner, such as in an order of metal, substrate, metal, substrate, metal, etc., wherein each metal layer may be individually etched and wherein any internal vias may be plated through before the multiple layers are laminated together. Further, the vias may be or comprise copper-plated holes which can, preferably, be designed as electrical tunnels through the insulating substrate. For this purpose, through-hole components may also be used which may, usually, be mounted by wire leads passing through the substrate and soldered to tracks or traces on the other side.

Electrically conductive patterns or structures, such as tracks, traces, pads, vias for generating connections between adjacent sheets, or features such as solid conductive areas, may be introduced into the one or more sheets, preferably by removing a partition of the sheet, in particular by etching, silk screen printing, photoengraving, PCB milling, or laser resist ablation, at selected regions in the sheet, whereby the desired structures are created. The etching can, preferably, be performed by using a photoresist material being coated onto the PCB which is, subsequently, exposed to light, whereby the desired pattern may be generated. Herein, the photoresist material may be adapted to protect the metal from dissolution into an etching solution. After etching, the PCB may, finally, be cleaned. By using this process, a particular PCB pattern can be mass-reproduced. However, other kinds of separation processes or connection processes may also be applicable. By way of example, a track introduced into the PCB may function as a wire being fixed at a selected position, wherein adjacent tracks can be insulated from each other, on one hand, by the substrate material and, on the other hand, by an electrically isolating fluid under conditions at which the PCB is used, specifically by air or a protective gas which may be present in a gap between the adjacent tracks. In addition, a surface of the PCB may have a coating, also denoted as a solder resist, which may be designed for protecting the metal, specifically the copper, within the at least one sheet from detrimental environmental effects, such as corrosion, thus, reducing a chance that undesired short circuits may be generated by a solder or by stray bare wires. In a multi-layer PCB, only outer metal layers may be coated in this manner since inner metal layers are protected by the adjacent substrate layers.

Further, the electronical, electrical, and/or optical elements or components may be placed onto the substrate, such as by soldering, welding, or depositing, or, additionally or as an alternative, be embedded into the circuit carrier, such as by placing them into seats designated in the substrate for this purpose and/or by deliberately removing a partition of the circuit carrier. Preferably, surface mount components, specifically transistors, diodes, IC chips, resistors and capacitors, may, thus, be attached to the PCB by using electrical conductive leads which adjoin the respective component to metal tracks, traces, or areas on the same side of the substrate. As an alternative, through-hole mounting may be used, in particular, for extended or voluminous components, such as electrolytic capacitors or connectors. As a further alternative, the components may be embedded within the substrate. In addition, the PCB may, further, comprise an area on the PCB, usually denoted by the term "silkscreen", on which an identifying text, such as a legend identifying the components or test points, may be printed. For further embodiments of the printed circuit board, reference may be made to https://en.wikipedia.org/wiki/Printed_circuit_board. However, other kinds of circuit carriers may also be applicable.

Further according to the present invention, the detector comprises a reflective layer, wherein the reflective layer is placed on a partition of the circuit carrier, in particular on a partition of the surface of the circuit carrier, more particular on a partition of the surface of the printed circuit board. Herein, the term "reflective layer" refers to a layer which is designed to reflect the incident light beam, preferably, in a manner that the incident light beam may be reflected back into the sensor layer after it has, at least partially, transmitted the sensor layer before. This arrangement may, thus, allow redirecting the incident light beams into the sensor layer, thereby reducing a loss of incident light during a measurement in this kind of detector.

In a particularly preferred embodiment, the reflective layer, in particular at least the surface of the reflective layer which is designed to be impinged by an incident light beam comprises a metal layer or, at least, a metal surface, preferably a gold layer, a silver layer, or a copper layer. Herein, the gold layer, the silver layer, and the copper layer are, particularly, preferred since they exhibit a high reflectivity in the IR, such as a reflectivity above 90% over the whole IR spectral range, especially from 760 nm to 20 µm. In addition, gold layers are, additionally preferred since they may be manufactured by depositing gold on a receptive surface of the circuit carrier, in particular the PCB. However, other kinds of metal layers may also be suitable, such as an aluminum, which exhibits a reflectivity above 90% from 1 µm to 20 µm. Other common materials used in the production of the contacts of PCBs are tin, palladium, nickel or lead, which each can be used as reflective layer. In addition, commonly used silk screen print, solder stop lacquer and other organic overlayers which are common in PCB production show favorable reflection characteristics. By way of example, a white silk screen shows a considerably high wideband diffusive reflection, in particular, due to a use of white pigment in the layer. In particular, the reflective layer may exhibit a thickness of 10 nm to 100 µm, preferably of 20 nm to 10 µm, more preferred of 40 nm to 2 µm.

In a particular embodiment, the reflective layer may be designed to reflect the incident light beam in a manner that a diffuse reflection may be generated hereby, wherein the term "diffuse reflection" relates to a scattering of impinging light beams in various directions. For this purpose, the reflective layer may exhibit a rough surface which may be in contrast to a flat surface of the reflective layer. Preferably, the rough surface may exhibit an Ra value of the roughness of at least 0.01 µm. As result, an incident light beam which may impinge the rough surface of the reflective layer in this particular embodiment may, in general, be reflected at a narrower angle with respect to surface, thus, causing the reflected light beam to travel over longer distances through the sensor layer where it may be absorbed with a large probability. Consequently, the rough surface of the reflective layer in this particular embodiment may reduce losses of the incident light by redirecting respective beams at advantageous angles into the sensor layer for preferred absorption of the incident light.

In order to obtain the rough surface of the reflective layer, a further surface layer may be located between the circuit carrier and the reflective layer. Further, to obtain a rough surface, the circuit carrier may be treated by a roughening process, preferably by brushing, etching, jet pumice, or laser treatment, in particular, to increase a surface roughness of the reflective layer when applied on top of the treated area. For most PCB surface finishes the surface roughness is already implemented by a pre-treatment of the metal layer, in particular of the copper layer, in an initial cleaning step, preferentially by application of a roughening process, preferably jet pumice, etching or brushing. Subsequently deposited layers, preferably comprising at least one of nickel, gold, palladium, tin, lead, aluminum, silver or alloys thereof may follow the roughness of the bottom copper layer. Typical Ra and Rz values of the roughness to be found on PCB copper layers are of the order of Ra of 0.3 µm to 0.4 µm and Rz of 3 µm to 4 µm.

Further according to the present invention, the detector comprises a sensor layer comprising at least one photosensitive material, wherein the sensor layer may function as a sensor region of the detector. As used herein, the "sensor region" is considered as a partition of the detector being designed to receive the illumination of the detector by the light beam, wherein the illumination in a manner as received by the sensor region may trigger the generation of the at least one sensor signal, wherein the generation of the sensor signal may be governed by a defined relationship between the sensor signal and the manner of the illumination of the sensor region.

The sensor signal may generally be an arbitrary signal indicative of a desired optical property to be measured, in particular a transmissivity, absorption, emission and reflectivity of an incident light beam, or a position of an object. As an example, the sensor signal may be or may comprise a digital and/or an analog signal. As an example, the sensor signal may be or may comprise a voltage signal and/or a current signal. Additionally or alternatively, the sensor signal may be or may comprise digital data. The sensor signal may comprise a single signal value and/or a series of signal values. The sensor signal may further comprise an arbitrary signal which is derived by combining two or more individual signals, such as by averaging two or more signals and/or by forming a quotient of two or more signals.

In a preferred embodiment, the at least one photosensitive material as comprised by the sensor layer may be selected from a group consisting of dye solar cells, photoconductive materials, and quantum dots, wherein the photoconductive materials are particularly preferred. For further details with regard to the dye solar cells, reference may be made to WO 2012/110924 A1 and WO 2014/097181 A1.

In particular based on WO 2016/120392 A1, the term "photoconductive material", as used herein, refers to a material which is capable of sustaining an electrical current and, therefore, exhibits a specific electrical conductivity, wherein, specifically, the electrical conductivity is dependent on the illumination of the material. Since an electrical resistivity is defined as the reciprocal value of the electrical conductivity, alternatively, the term "photoresistive material" may also be used to denominate the same kind of material. Thus, the photoconductive material may, preferably, comprise an inorganic photoconductive material, in particular, a thin film semiconductor or a nanoparticulate photoconductive material; an organic photoconductive material, in particular an organic semiconductor; a combination, a solid solution, and/or a doped variant thereof. As used herein, the term "solid solution" refers to a state of the photoconductive material in which at least one solute may be comprised in a solvent, whereby a homogeneous phase is formed and wherein the crystal structure of the solvent may, generally, be unaltered by the presence of the solute. By way of example, the binary CdTe may be solved in ZnTe leading to $Cd_{1-x}Zn_xTe$, wherein x can vary from 0 to 1. As further used herein, the term "doped variant" may refer to a state of the photoconductive material in which single atoms apart from the constituents of the material itself are introduced onto sites within the crystal which are occupied by intrinsic atoms in the undoped state.

In this regard, the inorganic photoconductive material may, in particular, comprise one or more of selenium, tellurium, a selenium-tellurium alloy, a metal oxide, a group IV element or compound, i.e. an element from group IV or a chemical compound with at least one group IV element, a group III-V compound, i.e. a chemical compound with at least one group III element and at least one group V element, a group II-VI compound, i.e. a chemical compound with, on one hand, at least one group II element or at least one group XII element and, on the other hand, at least one group VI element, and/or a chalcogenide. However, other inorganic photoconductive materials may equally be appropriate.

As mentioned above, the chalcogenide, may preferably be selected from a group comprising sulfide chalcogenides, selenide chalcogenides, telluride chalcogenides, ternary chalcogenides, quaternary and higher chalcogenides, may preferably be appropriate to be used for the sensor layer. As generally used, the term "chalcogenide" refers to a compound which may comprise a group 16 element of the periodic table apart from an oxide, i.e. a sulfide, a selenide, and a telluride. In particular, the photoconductive material may be or comprise a sulfide chalcogenide, preferably lead sulfide (PbS), a selenide chalcogenide, preferably lead selenide (PbSe), a telluride chalcogenide, preferably, cadmium telluride (CdTe), or a ternary chalcogenide is, preferably mercury zinc telluride (HgZnTe; MZT). Since at least the mentioned preferred photoconductive materials are, generally, known to exhibit a distinctive absorption characteristic within the infrared spectral range, the sensor layer which comprises one of the mentioned photoconductive materials may, preferably, be used as an infrared sensor. However, other embodiments and/or other photoconductive materials, in particular, the photoconductive materials as described below, may also be feasible.

In particular, the sulfide chalcogenide may be selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS or $Cu_2S$), cobalt sulfide (CoS), nickel sulfide (NiS), molybdenum disulfide ($MoS_2$), iron disulfide ($FeS_2$), and chromium trisulfide ($CrS_3$).

In particular, the selenide chalcogenide may be selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe or $Cu_2Se$), molybdenum diselenide ($MoSe_2$), tin selenide (SnSe), and cobalt selenide (CoSe), and indium selenide ($In_2Se_3$). Further, solid solutions and/or doped variants of the mentioned compounds or of other compounds of this kind may also be feasible.

In particular, the telluride chalcogenide may be selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), and indium telluride ($In_2Te_3$). Further, solid solutions and/or doped variants of the mentioned compounds or of other compounds of this kind may also be feasible.

In particular, the ternary chalcogenide may be selected from a group comprising mercury cadmium telluride (HgCdTe; MCT), mercury zinc telluride (HgZnTe), mercury cadmium sulfide (HgCdS), lead cadmium sulfide (PbCdS), lead mercury sulfide (PbHgS), copper indium disulfide ($CuInS_2$; CIS), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), cadmium selenite ($CdSeO_3$), cadmium zinc telluride (CdZnTe), and cadmium zinc selenide (CdZnSe), further combinations by applying compounds from the above listed binary chalcogenides and/or binary III-V-compounds as listed below. Further, solid solutions and/or doped variants of the mentioned compounds or of other compounds of this kind may also be feasible.

With regard to quaternary and higher chalcogenides, this kind of material may be selected from a quaternary and higher chalcogenide which may be known to exhibit suitable photoconductive properties. In particular, a compound having a composition of $Cu(In, Ga)S/Se_2$ or of $Cu_2ZnSn(S/Se)_4$ may be feasible for this purpose.

With regard to the III-V compound, this kind of semiconducting material may be selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb). Further, solid solutions and/or doped variants of the mentioned compounds or of other compounds of this kind may also be feasible.

With regard to the II-VI compound, this kind of semiconducting material may be selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe). However, other II-VI compounds may be feasible. Further, solid solutions of the mentioned compounds or of other compounds of this kind may also be applicable.

With regard to the metal oxides, this kind of semiconducting material may be selected from a known metal oxide which may exhibit photoconductive properties, particularly from the group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), ferrite ($Fe_3O_4$), and perovskite oxides ($ABO_3$, wherein A is a divalent cation, and B a tetravalent cation). In addition, ternary, quarternary or higher metal oxides may also be applicable. Furthermore, solid solutions and/or doped variants of the mentioned compounds or of other compounds of this kind, which could be stoichiometric compounds or off-stoichiometric compounds, may also be feasible. As explained later in more detail, it may be preferable to select a metal oxide which might, simultaneously, also exhibit transparent or translucent properties.

With regard to a group IV element or compound, this kind of semiconducting material may be selected from a group comprising doped diamond (C), doped silicon (Si), silicon carbide (SiC), and silicon germanium (SiGe), wherein the semiconducting material may be selected from a crystalline material, a microcrystalline material, or, preferably, from an amorphous material. As generally used, the term "amorphous" refers to a non-crystalline allotropic phase of the semiconducting material. In particular, the photoconductive material may comprise at least one hydrogenated amorphous semiconducting material, wherein the amorphous material has, in addition, been passivated by applying hydrogen to the material, whereby, without wishing to be bound by theory, a number of dangling bonds within the material appear to have been reduced by several orders of magnitude. In particular, the hydrogenated amorphous semiconducting material may be selected from a group consisting of hydrogenated amorphous silicon (a-Si:H), a hydrogenated amorphous silicon carbon alloy (a-SiC:H), or a hydrogenated amorphous germanium silicon alloy (a-GeSi:H). However, other kinds of materials, such as hydrogenated microcrystalline silicon (μc-Si:H), may also be used for these purposes.

Alternatively or in addition, the organic photoconductive material may, in particular, be or comprise an organic compound, in particular an organic compound which may be known to comprise appropriate photoconductive properties, preferably polyvinylcarbazole, a compound which is generally used in xerography. However, a large number of other organic molecules which are described in WO 2016/120392 A1 in more detail may also be feasible.

In a further preferred embodiment, the photoconductive material may be provided in form of a colloidal film which may comprise quantum dots. This particular state of the photoconductive material which may exhibit slightly or significantly modified chemical and/or physical properties with respect to a homogeneous layer of the same material may, thus, also be denoted as colloidal quantum dots (CQD). As used herein, the term "quantum dots" refers to a state of the photoconductive material in which the photoconductive material may comprise electrically conducting particles, such as electrons or holes, which are confined in all three spatial dimensions to a small volume that is usually denominated as a "dot".

Herein, the quantum dots may exhibit a size which can, for simplicity, be considered as diameter of a sphere that might approximate the mentioned volume of the particles. In this preferred embodiment, the quantum dots of the photoconductive material may, in particular, exhibit a size from 1 nm to 100 nm, preferably from 2 nm to 100 nm, more preferred from 2 nm to 15 nm, provided that the quantum dots actually comprised in a specific thin film may exhibit a size being below the thickness of the specific thin film. In practice, the quantum dots may comprise nanometer-scale semiconductor crystals which might be capped with surfactant molecules and dispersed in a solution in order to form the colloidal film. Herein, the surfactant molecules may be selected to allow determining an average distance between the individual quantum dots within the colloidal film, in particular, as a result from approximate spatial extensions of the selected surfactant molecules. Further, depending on the synthesis of ligands, quantum dots may exhibit hydrophilic or hydrophobic properties. The CQD can be produced by applying a gas-phase, a liquid-phase, or a solid-phase approach. Hereby, various ways for a synthesis of the CQD are possible, in particular by employing known processes such as thermal spraying, colloidal synthesis, or plasma synthesis. However, other production processes may also be feasible.

Further in this preferred embodiment, the photoconductive material used for the quantum dots may, preferably, be selected from one of the photoconductive materials as mentioned above, more particular, from the group comprising lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), a perovskite structure materials $ABC_3$, wherein A denotes an alkaline metal or an organic cation, B=Pb, Sn, or Cu, and C a halide, and copper zinc tin sulfide (CZTS). Further, solid solutions and/or doped variants of the mentioned compounds or of other compounds of this kind may also be feasible. Core shell structures of the materials of this kind of materials may also be feasible. However, kinds of other photoconductive materials may also be feasible.

Herein, the sensor layer which, in particular comprises the at least one photosensitive material, may be manufactured by applying at least one deposition method for depositing the sensor layer on a surface of the substrate layer, wherein the deposition method may, preferably, be selected from the group consisting of: chemical bath deposition, vacuum evaporation, sputtering, atomic layer deposition, chemical vapor deposition, spray pyrolysis, electrodeposition, anodization, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, and solution-gas interface techniques. As a result, the sensor layer may exhibit a thickness in the range 10 nm, preferably of 100 nm, in particular of 300 nm, to 100 μm, preferably to 10 μm, in particular to 5 μm, thus, exhibiting a thickness which may, however, be still below the wavelength of the incident beam or a fraction thereof, such as ½ or ¼ of the wavelength in the IR spectral range, i.e. from 760 nm to 1000 μm, especially, in the MidIR spectral range, i.e. from 1.5 µm to 15 µm. Consequently, a loss of incident light may appear rather likely, in particular, as long as the impinging light beam may only traverse the sensor layer a single time, which can be cured by using the reflective layer as described elsewhere herein.

In a particularly preferred embodiment, the sensor layer may be directly or indirectly applied to the substrate layer, especially, in a manner that no gap may be left nor generated between the sensor layer and the substrate layer. As a result, the sensor layer may, preferably, be exactly one continuous sensor layer. In order to allow a high transmission of both the incident light beam and the reflected light beam, the substrate layer is at least partially transparent with respect to both the incident light beam and the reflected light beam. For this purpose, the substrate layer may comprise a substrate material which may, preferably, be selected from glass, quartz, silicon (Si), a transparent conducting oxide (TCO), or a transparent organic polymer. In particular, the transparent conducting oxide (TCO) may be selected from the group consisting of aluminum oxide ($Al_2O_3$), titanium oxide ($TiO_2$), indium tin oxide (ITO), fluorine doped tin oxide ($SnO2$:F; FTO), aluminum doped zinc oxide (AZO), magnesium oxide (MgO), or a perovskite transparent conducting oxide. However, depending on the desired wavelength range, other kinds of substrate materials may also be employed as the substrate layer.

In a particular embodiment, the detector according to the present invention may, further, comprise an adhesive layer which may be placed between the substrate layer and the reflective layer. As generally used, the term "adhesive layer" refers to an additional layer which may be placed between two adjacent layers, wherein the adhesive layer comprises an adhesive substance which is designed to assemble the two adjacent layers in a manner that they are resistive to a separation, such as by enabling the separation only through an application of an increased force compared to a binding of the adjacent layers with adhesive. Herein, the adhesive layer may, especially, be applied in a manner that no gap may be left nor generated, on one hand, between the reflective layer and the adhesive layer and, on the other hand, between the adhesive layer and the substrate layer. Again, the adhesive layer may, preferably, be exactly one continuous layer which may be placed adjacently with respect to both the substrate layer and the reflective layer. Herein, the adhesive layer may, at least partially, be transparent with respect to the incident light beam or, as an alternative, be partially reflective with respect to the incident light beam. Both kinds of embodiments may, thus, allow the incident light beam, to be reflected through the substrate layer towards the sensor layer, as desired. For this purpose, the adhesive layer may exhibit a thickness which may be selected in order to provide a close and stable connection between the substrate layer and the reflective layer. Herein, the adhesive layer may, in particular, comprise an organic adhesive which may, preferably, be filled with diffusively or specularly reflecting particles. In particular depending on a material selected for the adhesive layer, the thickness of the adhesive layer may, therefore, be of 100 nm to 10 µm, more preferred of 250 nm to 5 µm.

In further embodiments, the adhesive layer may, alternatively or in addition, exhibit one or more chemical or physical properties which may prove to be advantageous for the optical sensor.

Thus, in a preferred embodiment, the adhesive layer may have anti-reflective optical properties, in particular, by being adapted for reducing a difference in refractive index between the substrate layer and the reflective layer by being or comprising an optically anti-reflective layer. Further properties may also be conceivable.

Further according to the present invention, the detector comprises an evaluation device which is designed to generate at least one item of information provided by the incident light beam by evaluating the sensor signal. As used herein, the term "evaluation device" generally refers to an arbitrary device designed to generate the items of information. As an example, the evaluation device may be or may comprise one or more integrated circuits, such as one or more application-specific integrated circuits (ASICs), and/or one or more digital signal processors (DSPs), and/or one or more field programmable gate arrays (FPGAs), and/or one or more data processing devices, such as one or more computers, preferably one or more microcomputers and/or microcontrollers. Additional components may be comprised, such as one or more preprocessing devices and/or data acquisition devices, such as one or more devices for receiving and/or preprocessing of the sensor signals, such as one or more AD-converters and/or one or more filters. Further, the evaluation device may comprise one or more data storage devices. Further, as outlined above, the evaluation device may comprise one or more interfaces, such as one or more wireless interfaces and/or one or more wire-bound interfaces.

The at least one evaluation device may be adapted to perform at least one computer program, such as at least one computer program performing or supporting the step of generating the items of information. As an example, one or more algorithms may be implemented which, by using the sensor signals as input variables, may perform a predetermined transformation into the position of the object.

The evaluation device may particularly comprise at least one data processing device, in particular an electronic data processing device, which can be designed to generate the items of information by evaluating the sensor signals. Thus, the evaluation device is designed to use the sensor signals as input variables and to generate the items of information provided by the incident light beam by processing these input variables. The processing can be done in parallel, subsequently or even in a combined manner. The evaluation device may use an arbitrary process for generating these items of information, such as by calculation and/or using at least one stored and/or known relationship. Besides the sensor signals, one or a plurality of further parameters and/or items of information can influence said relationship, for example at least one item of information about a modulation frequency. The relationship can be determined or determinable empirically, analytically or else semi-empirically. Particularly preferably, the relationship comprises at least one calibration curve, at least one set of calibration curves, at least one function or a combination of the possibilities mentioned. One or a plurality of calibration curves can be stored for example in the form of a set of values and the associated function values thereof, for example in a data storage device and/or a table. Alternatively or additionally, however, the at least one calibration curve can also be stored for example in parameterized form and/or as a functional equation. Separate relationships for processing the sensor signals into the items of information may be used. Alternatively, at least one combined relationship for processing the sensor signals is feasible. Various possibilities are conceivable and can also be combined.

By way of example, the evaluation device can be designed in terms of programming for the purpose of determining the items of information. The evaluation device can comprise in particular at least one computer, for example at least one microcomputer. Furthermore, the evaluation device can comprise one or a plurality of volatile or nonvolatile data memories. As an alternative or in addition to a data processing device, in particular at least one computer, the evaluation device can comprise one or a plurality of further electronic components which are designed for determining the items of information, for example an electronic table and in particular at least one look-up table and/or at least one application-specific integrated circuit (ASIC), and/or at least one digital signal processor (DSP), and/or at least one field programmable gate array (FPGA).

The detector has at least one evaluation device. In particular, the at least one evaluation device can also be designed to completely or partly control or drive the detector, for example by the evaluation device being designed to control at least one illumination source and/or to control at least one modulation device of the detector. The evaluation device can be designed, in particular, to carry out at least one measurement cycle in which one or a plurality of sensor signals, such as a plurality of sensor signals, are picked up, for example a plurality of sensor signals of successively at different modulation frequencies of the illumination.

The evaluation device is designed, as described above, to generate at least one item of information provided by the incident light beam by evaluating the at least one sensor signal. In a particular embodiment, said item of information may comprise at least one item of information on a longitudinal position of the object and/or, if applicable, on a transversal position of the object. The "object" generally may be an arbitrary object, chosen from a living object and a non-living object. Thus, as an example, the at least one object may comprise one or more articles and/or one or more parts of an article. Additionally or alternatively, the object may be or may comprise one or more living beings and/or one or more parts thereof, such as one or more body parts of a human being, e.g. a user, and/or an animal.

As used herein, a "position" generally refers to an arbitrary item of information on a location and/or orientation of the object in space. For this purpose, as an example, one or more coordinate systems may be used, and the position of the object may be determined by using one, two, three or more coordinates. As an example, one or more Cartesian coordinate systems and/or other types of coordinate systems may be used. In one example, the coordinate system may be a coordinate system of the detector in which the detector has a predetermined position and/or orientation. Said position of the object can be static or may even comprise at least one movement of the object, for example a relative movement between the detector or parts thereof and the object or parts thereof. In this case, a relative movement can generally comprise at least one linear movement and/or at least one rotational movement. Items of movement information can for example also be obtained by comparison of at least two items of information picked up at different times, such that for example at least one item of location information can also comprise at least one item of velocity information and/or at least one item of acceleration information, for example at least one item of information about at least one relative velocity between the object or parts thereof and the detector or parts thereof. In particular, the at least one item of location information can generally be selected from: an item of information about a distance between the object or parts thereof and the detector or parts thereof, in particular an optical path length; an item of information about a distance or an optical distance between the object or parts thereof and the optional transfer device or parts thereof; an item of information about a positioning of the object or parts thereof relative to the detector or parts thereof; an item of information about an orientation of the object and/or parts thereof relative to the detector or parts thereof; an item of information about a relative movement between the object or parts thereof and the detector or parts thereof; an item of information about a two-dimensional or three-dimensional spatial configuration of the object or of parts thereof, in particular a geometry or form of the object. Generally, the at least one item of location information can therefore be selected for example from the group consisting of: an item of information about at least one location of the object or at least one part thereof; information about at least one orientation of the object or a part thereof; an item of information about a geometry or form of the object or of a part thereof, an item of information about a velocity of the object or of a part thereof, an item of information about an acceleration of the object or of a part thereof, an item of information about a presence or absence of the object or of a part thereof in a visual range of the detector.

The at least one item of location information can be specified for example in at least one coordinate system, for example a coordinate system in which the detector or parts thereof rest. Alternatively or additionally, the location information can also simply comprise for example a distance between the detector or parts thereof and the object or parts thereof. Combinations of the possibilities mentioned are also conceivable.

In a particularly preferred embodiment of the present invention, the detector may further comprise at least two individual electrical contacts which contact the sensor layer and which are designed to transmit the sensor signal via the circuit carrier to the evaluation device. As used herein, the term "contacting the sensor layer" refers to an electrically conductive connection between the respective contact and the sensor layer which may be arranged in a manner that each of the electrical contacts may be placed on a location at a surface of the sensor layer. For this purpose, the at least individual two electrical contacts may be applied at different locations of the layer of the photoconductive material, especially, in a manner that at least two of the individual electrical contacts are electrically isolated with respect to each other. Herein, each of the at least two electrical contacts may, preferably, be arranged in a manner that a direct electrical contact between the respective electrode and the sensor layer may be achieved, particularly in order to acquire the sensor signal with as little loss as possible, such as due to additional resistances in a transport path between the sensor layer and the evaluation device. In an alternative embodiment, the sensor layer may be arranged in a setup which may allow transmitting the sensor signal contactless to the evaluation device.

Consequently, upon impingement of the sensor region by the light beam the at least two electrical contacts may provide the sensor signal which depends on the illumination of the sensor layer to the evaluation device. Herein, the electrical contacts may comprise an evaporated metal layer which may easily be provided by known evaporation techniques. In particular, the evaporated metal layer may comprise one or more of gold, silver, aluminum, platinum, magnesium, chromium, or titanium. Alternatively, at least one of the electrical contacts may comprise a layer of highly conductive graphene.

In this kind of material, the electrical current may be guided via at least one first electrical contact through the material to at least one second electrical contact, wherein the first electrical contact may be isolated from the second electrical contact while both the first electrical contact and the second electrical contact may be in direct connection with the material. For this purpose, the direct connection may be provided by any known measure known from the state of the art, such as wire bonding, plating, welding, soldering, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances, in particular metals like gold, beryllium doped gold, copper, aluminum, silver, platinum, or palladium as well as alloys comprising at least one of the mentioned metals, at the contact zones.

In a particularly preferred embodiment, wire bonds may be used for providing a direct connection between each of the electrical contacts contacting the sensor layer and a corresponding receiving contact, such as a contact pad, which may, preferably, be further placed on the circuit carrier, in particular, on the printed circuit board (PCB). This kind of arrangement may allow easily contacting the sensor layer to an evaluation device, wherein the electrical contacts may be designed to transmit the sensor signal to the circuit carrier and, subsequently, to the evaluation device.

In a further, particularly preferred embodiment of the present invention, the detector may, additionally, comprise a cover layer. Herein, the cover layer may be deposited on the sensor layer, preferably, in a manner that it may directly contact the sensor layer. In a preferred embodiment, the cover layer may be deposited on the layer in a fashion that it may fully cover an accessible surface of the sensor layer. Preferably, the cover layer may be an amorphous layer comprising at least one metal-containing compound. However, other kinds of cover layers may also be feasible.

Preferably, at least one deposition method may be used for depositing the cover layer on the sensor layer. For this purpose, the at least one deposition method may, in particular, be selected from an atomic layer deposition, a chemical vapor deposition, a plasma-enhanced chemical vapor deposition, a physical vapor deposition, a sol-gel deposition, or a combination thereof. Consequently, the cover layer may be or comprise an atomic deposition layer, a chemical vapor deposition layer, or a physical vapor deposition layer, or a sol-gel deposition layer, or a plasma-enhanced chemical vapor deposition layer. Additional alternatives for the cover layer may comprise an expoxy resin layer or a glass layer. Herein, the term "atomic layer deposition", the equivalent terms "atomic layer epitaxy" or "molecular layer deposition" as well as their respective abbreviations "ALD, "ALE" or "MLD" are, generally, used for referring to a deposition process which may comprise a self-limiting process step and a subsequent self-limiting re-action step. Hence, the process which is applied in accordance with the present invention may also be referred to as an "ALD process". For further details referring to the ALD process, reference may be made to by George, Chem. Rev., 110, p. 111-131, 2010. Further, the term "chemical vapor deposition", usually abbreviated to "CVD" refers to a method in which a surface of a substrate or a layer located on a substrate may be exposed to at least one volatile precursor, wherein the precursor may react and/or decompose on the surface in order to generate a desired deposit. In a frequent case, possible by-products may be removed by applying a gas flow above the surface. Alternatively, a PECVD process may, preferably, be applicable as the deposition process, in particular, for obtaining a film of silicon nitride ($Si_3N_4$). Herein, the term "PECVD process" refers to a specific CVD process in which the precursors may be provided as a plasma, such as by application of a discharge in a reaction chamber.

As mentioned above, the cover layer may, preferentially, comprise at least one metal-containing compound. Herein, the metal-containing compound may, preferably, comprise a metal, wherein the metal may, in particular, be selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, and Bi. In a specific embodiment, the metal-containing compound may, alternatively, comprise a semimetal, which may also be denominated as a "metalloid", wherein the semimetal may be selected from the group consisting of B, Ge, As, Sb, and Te. Preferably, the at least one metal-containing compound may be selected from the group consisting of Al, Ti, Ta, Mn, Mo, Zr, Hf, and W.

Herein, the at least one metal-containing compound may, preferably, be selected from the group comprising an oxide, a hydroxide, a chalcogenide, a pnictide, a carbide, or a combination thereof. As already defined above, the term "chalcogenide" refers to a compound which may comprise a group 16 element of the periodic table apart from an oxide, i.e. a sulfide, a selenide, and a telluride. In a similar fashion, the term "pnictide" refers to a, preferably binary, compound which may comprise a group 15 element of the periodic table, i.e. a nitride, a phosphide, arsenide and an antimonide. As described below in more detail, the metal-containing compound may, preferably, comprise at least one oxide, at least one hydroxide, or a combination thereof, preferably of Al, Ti, Zr, or Hf.

In an alternative embodiment, the cover layer may be or comprise a laminate which may have at least two adjacent layers, wherein the adjacent layers may, in particular, differ by their respective composition in a manner that one, both, some, or all of the adjacent layers may comprise one of the metal-containing compounds. Herein, the adjacent layers may comprise two different metal-containing compounds, such as described above, providing an amorphous structure. By way of example, the cover layer may comprise alternating adjacent layers of an Al-containing compound and of a Zr- or Hf-containing compound. However, other combinations of metal-containing compounds may also be possible. In addition, the laminate may further comprise additional adjacent layers which may not have any one of the metal-containing compounds as described elsewhere in this application but may rather be or comprise at least one of a metallic compound, a polymeric compound, a silicone compound, or a glass compound. Herein, other kinds of materials may also be feasible. As a result, the laminate may comprise additional adjacent layers that may be amorphous but which may, alternatively, also be or comprise crystalline or nanocrystalline layers.

In a particular preferred embodiment, the cover layer may fully cover the accessible surface of the sensor layer. Thus, the cover layer may, in a first regard, be adapted for providing an encapsulation for the sensor layer. As used herein the term "encapsulation" may refer to a package, preferably, an hermetic package, especially, in order to avoid as far as possible a partial or full degradation of the sensor layer or a partition thereof, in particular, by external influence, such as by humidity and/or by oxygen comprised in a surrounding atmosphere. Herein, the package may, preferably, be adapted to cover all accessible surfaces of the sensor layer, wherein it may be taken into account that the sensor layer may be deposited on a substrate layer which may already be adapted to protect a partition of the surfaces of the sensor layer. In other words, the substrate layer and the cover layer may be adapted in a fashion that they can cooperate in order to accomplish a packaging, preferably a hermetic packaging, of the sensor layer.

In addition, the amorphous nature of the cover layer according to the present invention may not only improve the protective encapsulation for the photoconductive material, such as described above, but may inherently also contribute to an activation of the photoconductive properties of the photoconductive material that may be, preferentially, in direct contact with the cover layer in a sense that the photoconductive properties of the photoconductive material may considerably be improved after the deposition of the cover layer on the layer of the photoconductive material and a subsequent thermally treating the compound structure comprising the cover layer directly deposited on the photoconductive material.

Not being bound by theory, the deposition of the cover layer on the photoconductive material may not only result in a direct contact between the respective surfaces of the cover layer and the photoconductive material. In addition, the thermal treatment of the compound structure may prompt the material comprised in the cover layer or at least a partition thereof in order to partially penetrate into the photoconductive material, thus, resulting in a physical and/or chemical effect, in particular with respect to the detailed structure and/or composition of the photoconductive material. It seems that this effect may allow a small partition of the material comprised in the cover layer to penetrate into receptive portions of the photoconductive material, such as phase boundaries, vacancies, or pores. This effect appears, thus, to be, particularly, related to the amorphous structure of the cover layer.

In a particularly preferred embodiment, the cover layer may exhibit a thickness of 10 nm to 600 nm, preferably of 20 nm to 200 nm, more preferred of 40 nm to 100 nm, most preferred of 50 to 75 nm. This thickness may, particularly, reflect the amount of metal-containing compounds within the cover layer that may be advantageous to achieve the function of providing encapsulation and/or of activation for the sensor layer. Herein, the cover layer may be a conformal layer with respect to the adjacent surface of the sensor layer. As generally used, the thickness of the conformal layer may, thus, follow the corresponding surface of the sensor layer within a deviation of ±50 nm, preferably of ±20 nm, mostly preferred of ±10 nm, wherein the deviation may occur over at least for at least 90%, preferably for at least 95%, mostly preferred for at least 99%, of a surface of the cover layer, hereby leaving aside any contamination or imperfection that may be present on the surface of the cover layer.

Further, the cover layer may be adapted to exhibit at least one further function in addition to the function of providing encapsulation and/or activation. By way of example, the cover layer may exhibit a high refractive index, such as at least 1.2, preferably at least 1.5, in order to qualify as a suitable anti-reflective layer. As a result, it may be advantageous to select the material as used for the cover layer to be, preferably, optically transparent within the desired wavelength range, in particular, by exhibiting a suitable absorption characteristic. On the other hand, since the substrate layer is already at least partially transparent, a larger variety of different materials, including optically intransparent materials, may be employed for the cover layer. Further examples may include a second optical filter, a scratch-resistant layer, a hydrophilic layer, a hydrophobic layer, a self-cleaning layer, an anti-fog layer, and a conductive layer. Other functions may also be possible.

In particular, the cover layer may function as an optical filter designed for filtering a predefined wavelength range. In this regard, it may also be possible to use a cover layer being or comprising a laminate. In particular, a stack employing at least two different kinds of metal oxides can be used as an interference filter. By way of example, a stack comprising aluminum oxide ($Al_2O_3$) and titanium oxide ($TiO_2$) alternatively stacked on top of each other may well be suited for such a purpose.

In a particular embodiment, particularly in a case in which it might not be appropriate to provide the cover layer with the desired further function or in which an extent of the further function as provided by the selected cover layer may not be sufficient, the cover layer may, additionally, at least partially be covered by at least one additional layer at least partially deposited on the cover layer. Preferably, the additional layer may be or exhibit the further function and may, thus, comprise at least one of an anti-reflective layer, a second optical filter, a scratch-resistant layer, a hydrophilic layer, a hydrophobic layer, a self-cleaning layer, an anti-fog layer, or a conductive layer. Herein, the person skilled in the art may be easily capable of selecting and providing the at least one additional layer. However, other embodiments may also be possible.

In a preferred embodiment, the cover layer may partially or fully cover the electrical contacts, which may, especially, be configured to be bondable, such as to one or more leads to an external circuit. Herein, the electrical contacts may be bondable by using wires, such as gold or aluminum wires, wherein the electrical contacts may, preferably, be bondable through the cover layer. In a particular embodiment, a further adhesive layer may be provided at the electrical contacts, wherein the further adhesive layer may, especially, be adapted for bonding. For this purpose, the further adhesive layer may comprise at least one of Ni, Cr, Ti or Pd.

According to the present invention, the detector may, preferably, be designed for detecting electromagnetic radiation over a considerably wide spectral range, such as the ultraviolet (UV), visible, and the infrared (IR) spectral ranges, wherein the IR spectral range may particularly be preferred. Herein, the following photoconductive materials may, especially, be selected for the sensor layer within the detector:

for the UV spectral range: doped diamond (C), zinc oxide (ZnO), titanium oxide ($TiO_2$), gallium nitride (GaN), gallium phosphide (GaP) or silicon carbide (SiC);

for the visible spectral range: silicon (Si), gallium arsenide (GaAs), cadmium sulfide (CdS), cadmium telluride (CdTe), copper indium sulfide ($CuInS_2$; CIS), copper indium gallium selenide (CIGS), copper zinc tin sulfide (CZTS);

for IR spectral range: indium gallium arsenide (InGaAs), silicon (Si), germanium (Ge), cadmium telluride (CdTe), copper indium sulfide ($CuInS_2$; CIS), copper indium gallium selenide (CIGS), copper zinc tin sulfide (CZTS) for the NIR spectral range of 7560 nm to 1.5 µm, wherein CdTe, CIS, CIGS, and CZTS are particularly preferred for wavelengths above 850 nm; indium gallium arsenide (InGaAs) for wavelengths up to 2.6 µm; indium arsenide (InAs) for wavelengths up to 3.1 µm; lead sulfide (PbS) for wavelengths up to 3.5 µm; lead selenide (PbSe) for wavelengths up to 5 µm; indium antimonide (InSb) for wavelengths up to 5.5 µm; and mercury cadmium telluride (MCT, HgCdTe) for wavelengths up 16 µm.

As already mentioned above, the detector for optical detection generally is a device which may be adapted for providing at least one item of information on the position of the at least one object. The detector may be a stationary device or a mobile device. Further, the detector may be a stand-alone device or may form part of another device, such as a computer, a vehicle or any other device. Further, the detector may be a hand-held device. Other embodiments of the detector are feasible.

As used herein, the term position "position" generally refers to an arbitrary item of information on a location and/or orientation of the object in space. For this purpose, as an example, one or more coordinate systems may be used, and the position of the object may be determined by using one, two, three or more coordinates. As an example, one or more Cartesian coordinate systems and/or other types of coordinate systems may be used. In one example, the coordinate system may be a coordinate system of the detector in which the detector has a predetermined position and/or orientation. As will be outlined in further detail below, the detector may have an optical axis, which may constitute a main direction of view of the detector. The optical axis may form an axis of the coordinate system, such as a z-axis. Further, one or more additional axes may be provided, preferably perpendicular to the z-axis.

Thus, as an example, the detector may constitute a coordinate system in which the optical axis forms the z-axis and in which, additionally, an x-axis and a y-axis may be provided which are perpendicular to the z-axis and which are perpendicular to each other. As an example, the detector and/or a part of the detector may rest at a specific point in this coordinate system, such as at the origin of this coordinate system. In this coordinate system, a direction parallel or antiparallel to the z-axis may be regarded as a longitudinal direction, and a coordinate along the z-axis may be considered a longitudinal coordinate. An arbitrary direction perpendicular to the longitudinal direction may be considered a transversal direction, and an x- and/or y-coordinate may be considered a transversal coordinate.

Alternatively, other types of coordinate systems may be used. Thus, as an example, a polar coordinate system may be used in which the optical axis forms a z-axis and in which a distance from the z-axis and a polar angle may be used as additional coordinates. Again, a direction parallel or antiparallel to the z-axis may be considered a longitudinal direction, and a coordinate along the z-axis may be considered a longitudinal coordinate. Any direction perpendicular to the z-axis may be considered a transversal direction, and the polar coordinate and/or the polar angle may be considered a transversal coordinate.

The detector may, especially, be adapted to provide the at least one item of information on the position of the at least one object in any feasible way. Thus, the information may e.g. be provided electronically, visually, acoustically or in any arbitrary combination thereof. The information may further be stored in a data storage of the detector or a separate device and/or may be provided via at least one interface, such as a wireless interface and/or a wire-bound interface.

In a particularly preferred embodiment, the detector may be or comprise a longitudinal optical sensor. As used herein, the "longitudinal optical sensor" is generally a device which is designed to generate at least one longitudinal sensor signal in a manner dependent on an illumination of the sensor region by the light beam, wherein the longitudinal sensor signal, given the same total power of the illumination, is dependent, according to the so-called "FiP effect" on a beam cross-section of the light beam in the sensor region. The longitudinal sensor signal may generally be an arbitrary signal indicative of the longitudinal position, which may also be denoted as a depth. As an example, the longitudinal sensor signal may be or may comprise a digital and/or an analog signal. As an example, the longitudinal sensor signal may be or may comprise a voltage signal and/or a current signal. Additionally or alternatively, the longitudinal sensor signal may be or may comprise digital data. The longitudinal sensor signal may comprise a single signal value and/or a series of signal values. The longitudinal sensor signal may further comprise an arbitrary signal which is derived by combining two or more individual signals, such as by averaging two or more signals and/or by forming a quotient of two or more signals. For potential embodiments of the longitudinal optical sensor and the longitudinal sensor signal, reference may be made to WO 2012/110924 A1 and WO 2014/097181 A1.

Further, the sensor region of the longitudinal optical sensor may be illuminated by at the least one light beam. Given the same total power of the illumination, the electrical conductivity of the sensor region may, therefore, depend on the beam cross-section of the light beam in the sensor region, be denominated as a "spot size" generated by the incident beam within the sensor region. Thus, the observable property that the electrical conductivity of the photoconductive material depends on an extent of the illumination of the sensor region comprising the photoconductive material by an incident light beam particularly accomplishes that two light beams comprising the same total power but generating different spot sizes on the sensor region provide different values for the electrical conductivity of the photoconductive material in the sensor region and are, consequently, distinguishable with respect to each other.

Further, since the longitudinal sensor signal may be determined by applying an electrical signal, such as a voltage signal and/or a current signal, the electrical conductivity of the material traversed by the electrical signal may, therefore, be taken into account when determining the longitudinal sensor signal. In addition, a bias voltage source and a load resistor employed in series with the longitudinal optical sensor may, preferably, be used here. As a result, the longitudinal optical sensor may, thus, principally allow determining the beam cross-section of the light beam in the sensor region from a recording of the longitudinal sensor signal, such as by comparing at least two longitudinal sensor signals, at least one item of information on the beam cross-section, specifically on the beam diameter. Further, since the beam cross-section of the light beam in the sensor region, according to the above-mentioned FiP effect, given the same total power of the illumination, depends on the longitudinal position or depth of an object which emits or reflects the light beam which impinges on the sensor region, the longitudinal optical sensor may, therefore, be applied to determining a longitudinal position of the respective object.

As already known from WO 2012/110924 A1, the longitudinal optical sensor is designed to generate at least one longitudinal sensor signal in a manner dependent on an illumination of the sensor region, wherein the sensor signal, given the same total power of the illumination depends on a beam cross-section of the illumination on the sensor region. As an example, a measurement of a photocurrent I as a function of a position of a lens is provided there, wherein the lens is configured for focusing electromagnetic radiation onto the sensor region of the longitudinal optical sensor. During the measurement, the lens is displaced relative to the longitudinal optical sensor in a direction perpendicular to the sensor region in a manner that, as a result, the diameter of the light spot on the sensor region changes. In this particular example in which a photovoltaic device, in particular, a dye solar cell, is employed as the material in the sensor region, the signal of the longitudinal optical sensor, in this case a photocurrent, clearly depends on the geometry of the illumination such that, outside a maximum at the focus of the lens, the photocurrent falls to less than 10% of its maximum value.

As outlined above, the at least one longitudinal sensor signal, given the same total power of the illumination by the light beam, is, according to the FiP effect, dependent on a beam cross-section of the light beam in the sensor region of the at least one longitudinal optical sensor. As used herein, the term "beam cross-section" generally refers to a lateral extension of the light beam or a light spot generated by the light beam at a specific location. In case a circular light spot is generated, a radius, a diameter or a Gaussian beam waist or twice the Gaussian beam waist may function as a measure of the beam cross-section. In case non-circular light-spots are generated, the cross-section may be determined in any other feasible way, such as by determining the cross-section of a circle having the same area as the non-circular light spot, which is also referred to as the equivalent beam cross-section. In this regard, it may be possible to employ the observation of an extremum, i.e. a maximum or a minimum, of the longitudinal sensor signal, in particular a global extremum, under a condition in which the corresponding material, such as a photovoltaic material, may be impinged by a light beam with the smallest possible cross-section, such as when the material may be located at or near a focal point as affected by an optical lens. In case the extremum is a maximum, this observation may be denominated as the positive FiP-effect, while in case the extremum is a minimum, this observation may be denominated as the negative FiP-effect.

Thus, irrespective of the photosensitive material actually comprised in the sensor region but given the same total power of the illumination of the sensor region by the light beam, a light beam having a first beam diameter or beam cross-section may generate a first longitudinal sensor signal, whereas a light beam having a second beam diameter or beam-cross section being different from the first beam diameter or beam cross-section generates a second longitudinal sensor signal being different from the first longitudinal sensor signal. Thus, by comparing the longitudinal sensor signals, at least one item of information on the beam cross-section, specifically on the beam diameter, may be generated. For details of this effect, reference may be made to WO 2012/110924 A1. Accordingly, the longitudinal sensor signals generated by the longitudinal optical sensors may be compared, in order to gain information on the total power and/or intensity of the light beam and/or in order to normalize the longitudinal sensor signals and/or the at least one item of information on the longitudinal position of the object for the total power and/or total intensity of the light beam. Thus, as an example, a maximum value of the longitudinal optical sensor signals may be detected, and all longitudinal sensor signals may be divided by this maximum value, thereby generating normalized longitudinal optical sensor signals, which, then, may be transformed by using the above-mentioned known relationship, into the at least one item of longitudinal information on the object. Other ways of normalization are feasible, such as a normalization using a mean value of the longitudinal sensor signals and dividing all longitudinal sensor signals by the mean value. Other options are possible. Each of these options may be appropriate to render the transformation independent from the total power and/or intensity of the light beam. In addition, information on the total power and/or intensity of the light beam might, thus, be generated.

Specifically in case one or more beam properties of the light beam propagating from the object to the detector are known, the at least one item of information on the longitudinal position of the object may thus be derived from a known relationship between the at least one longitudinal sensor signal and a longitudinal position of the object. The known relationship may be stored in the evaluation device as an algorithm and/or as one or more calibration curves. As an example, specifically for Gaussian beams, a relationship between a beam diameter or beam waist and a position of the object may easily be derived by using the Gaussian relationship between the beam waist and a longitudinal coordinate.

This embodiment may, particularly, be used by the evaluation device in order to resolve an ambiguity in the known relationship between a beam cross-section of the light beam and the longitudinal position of the object. Thus, even if the beam properties of the light beam propagating from the object to the detector are known fully or partially, it is known that, in many beams, the beam cross-section narrows before reaching a focal point and, afterwards, widens again. Thus, before and after the focal point in which the light beam has the narrowest beam cross-section, positions occur along the axis of propagation of the light beam in which the light beam has the same cross-section. Thus, as an example, at a distance $z0$ before and after the focal point, the cross-section of the light beam is identical. Thus, in case only one longitudinal optical sensor with a specific spectral sensitivity is used, a specific cross-section of the light beam might be determined, in case the overall power or intensity of the light beam is known. By using this information, the distance $z0$ of the respective longitudinal optical sensor from the focal point might be determined. However, in order to determine whether the respective longitudinal optical sensor is located before or behind the focal point, additional information is required, such as a history of movement of the object and/or the detector and/or information on whether the detector is located before or behind the focal point. In typical situations, this additional information may not be provided. Therefore, additional information may be gained in order to resolve the above-mentioned ambiguity. Thus, in case the evaluation device, by evaluating the longitudinal sensor signals, recognizes that the beam cross-section of the light beam on a first longitudinal optical sensor is larger than the beam cross-section of the light beam on a second longitudinal optical sensor, wherein the second longitudinal optical sensor is located behind the first longitudinal optical sensor, the evaluation device may determine that the light beam is still narrowing and that the location of the first longitudinal optical sensor is situated before the focal point of the light beam. Contrarily, in case the beam cross-section of the light beam on the first longitudinal optical sensor is smaller than the beam cross-section of the light beam on the second longitudinal optical sensor, the evaluation device may determine that the light beam is widening and that the location of the second longitudinal optical sensor is situated behind the focal point. Thus, generally, the evaluation device may be adapted to recognize whether the light beam widens or narrows, by comparing the longitudinal sensor signals of different longitudinal sensors.

For further details with regard to determining the at least one item of information on the longitudinal position of the object by employing the evaluation device according to the present invention, reference may made to the description in WO 2014/097181 A1. Thus, generally, the evaluation device may be adapted to compare the beam cross-section and/or the diameter of the light beam with known beam properties of the light beam in order to determine the at least one item of information on the longitudinal position of the object, preferably from a known dependency of a beam diameter of the light beam on at least one propagation coordinate in a direction of propagation of the light beam and/or from a known Gaussian profile of the light beam.

Alternatively or in addition, at least one transversal coordinate of the object may be determined. Thus, generally, the evaluation device may further be adapted to determine at least one transversal coordinate of the object by determining a position of the light beam on the at least one transversal optical sensor, which may be a pixelated, a segmented or a large-area transversal optical sensor, as further outlined also in WO 2014/097181 A1. Thus, the detector according to the present invention may be or comprise a transversal optical sensor. As used herein, the term "transversal optical sensor" generally refers to a device which is adapted to determine a transversal position of at least one light beam traveling from the object to the detector. With regard to the term "position", reference may be made to the definition above. Thus, preferably, the transversal position may be or may comprise at least one coordinate in at least one dimension perpendicular to an optical axis of the detector. As an example, the transversal position may be a position of a light spot generated by the light beam in a plane perpendicular to the optical axis, such as on a light-sensitive sensor surface of the transversal optical sensor. By way of example, the position in the plane may be given in Cartesian coordinates and/or polar coordinates. Other embodiments are feasible. In this embodiment, it may be particularly advantageous to minimize a distance to the reflective layer and the roughness of the reflective layer. In a preferred embodiment as disclosed in WO 2014/097181 A1, the sensor layer of transversal optical sensor may be a photo detector. In a further preferred embodiment as disclosed in WO 2016/120392 A1, the sensor layer of the transversal optical sensor may comprise a layer of a photoconductive material, in particular, selected from the material as described above in more details.

The transversal optical sensor may provide at least one transversal sensor signal. Herein, the transversal sensor signal may generally be an arbitrary signal indicative of the transversal position. As an example, the transversal sensor signal may be or may comprise a digital and/or an analog signal. As an example, the transversal sensor signal may be or may comprise a voltage signal and/or a current signal. Additionally or alternatively, the transversal sensor signal may be or may comprise digital data. The transversal sensor signal may comprise a single signal value and/or a series of signal values. The transversal sensor signal may further comprise an arbitrary signal which may be derived by combining two or more individual signals, such as by averaging two or more signals and/or by forming a quotient of two or more signals.

Herein, at least two electrodes may be present for recording the transversal optical signal. In a preferred embodiment, the at least two electrodes may actually be arranged in the form of at least two physical electrodes, preferably, exhibiting a form of a T-shape, wherein each physical electrode may comprise an electrically conducting material. In this embodiment, at least one of the electrodes of the transversal optical sensor may, preferably, be a split electrode having at least two partial electrodes, wherein the transversal optical sensor may have a sensor area, wherein the at least one transversal sensor signal may indicate an x- and/or a y-position of the incident light beam within the sensor area. The sensor area may be a surface of the photo detector facing towards the object. The sensor area preferably may be oriented perpendicular to the optical axis. Thus, the transversal sensor signal may indicate a position of a light spot generated by the light beam in a plane of the sensor area of the transversal optical sensor. Generally, as used herein, the term "partial electrode" refers to an electrode out of a plurality of electrodes, adapted for measuring at least one current and/or voltage signal, preferably independent from other partial electrodes. Thus, in case a plurality of partial electrodes is provided, the respective electrode is adapted to provide a plurality of electric potentials and/or electric currents and/or voltages via the at least two partial electrodes, which may be measured and/or used independently.

The transversal optical sensor may further be adapted to generate the transversal sensor signal in accordance with the electrical currents through the partial electrodes. Thus, a ratio of electric currents through two horizontal partial electrodes may be formed, thereby generating an x-coordinate, and/or a ratio of electric currents through to vertical partial electrodes may be formed, thereby generating a y-coordinate. The detector, preferably the transversal optical sensor and/or the evaluation device, may be adapted to derive the information on the transversal position of the object from at least one ratio of the currents through the partial electrodes. Other ways of generating position coordinates by comparing currents through the partial electrodes are feasible.

The partial electrodes may generally be defined in various ways, in order to determine a position of the light beam in the sensor area. Thus, two or more horizontal partial electrodes may be provided in order to determine a horizontal coordinate or x-coordinate, and two or more vertical partial electrodes may be provided in order to determine a vertical coordinate or y-coordinate. Thus, the partial electrodes may be provided at a rim of the sensor area, wherein an interior space of the sensor area remains free and may be covered by one or more additional electrode materials. Herein, the additional electrode material preferably may be a transparent additional electrode material, such as a transparent metal and/or a transparent conductive oxide and/or, most preferably, a transparent conductive polymer.

By using the transversal optical sensor, wherein one of the electrodes is a split electrode with three or more partial electrodes, currents through the partial electrodes may be dependent on a position of the light beam in the sensor area. This may generally be due to the fact that Ohmic losses or resistive losses may occur on the way from a location of generation of electrical charges due to the impinging light onto the partial electrodes. Thus, besides the partial electrodes, the split electrode may comprise one or more additional electrode materials connected to the partial electrodes, wherein the one or more additional electrode materials provide an electrical resistance. Thus, due to the Ohmic losses on the way from the location of generation of the electric charges to the partial electrodes through with the one or more additional electrode materials, the currents through the partial electrodes depend on the location of the generation of the electric charges and, thus, to the position of the light beam in the sensor area. For details of this principle of determining the position of the light beam in the sensor area, reference may be made to the preferred embodiments below and/or to the physical principles and device options as disclosed in WO 2014/097181 A1, WO 2016/120392 A1, and the respective references as cited therein.

Further embodiments of the present invention referred to the nature of the light beam which propagates from the object to the detector. As used herein, the term "light" generally refers to electromagnetic radiation in one or more of the visible spectral range, the ultraviolet spectral range and the infrared spectral range. Therein, in partial accordance with standard ISO-21348 in a valid version at the date of this application, the term visible spectral range generally refers to a spectral range of 380 nm to 760 nm. The term infrared (IR) spectral range generally refers to electromagnetic radiation in the range of 760 nm to 1000 µm, wherein the range of 760 nm to 1.4 µm is usually denominated as near infrared (NIR) spectral range, the range from 1.5 µm to 15 µm as mid infrared (MIR), and the range from 15 µm to 1000 µm as far infrared (FIR) spectral range. The term ultraviolet spectral range generally refers to electromagnetic radiation in the range of 1 nm to 380 nm, preferably in the range of 100 nm to 380 nm. Preferably, light as used within the present invention is visible light, i.e. light in the visible spectral range.

The term "light beam" generally refers to an amount of light emitted into a specific direction. Thus, the light beam may be a bundle of the light rays having a predetermined extension in a direction perpendicular to a direction of propagation of the light beam. Preferably, the light beam may be or may comprise one or more Gaussian light beams which may be characterized by one or more Gaussian beam parameters, such as one or more of a beam waist, a Rayleigh-length or any other beam parameter or combination of beam parameters suited to characterize a development of a beam diameter and/or a beam propagation in space.

The light beam might be admitted by the object itself, i.e. might originate from the object. Additionally or alternatively, another origin of the light beam is feasible. Thus, as will be outlined in further detail below, one or more illumination sources might be provided which illuminate the object, such as by using one or more primary rays or beams, such as one or more primary rays or beams having a predetermined characteristic. In the latter case, the light beam propagating from the object to the detector might be a light beam which is reflected by the object and/or a reflection device connected to the object.

Furthermore, the detector can have at least one modulation device for modulating the illumination, in particular for a periodic modulation, in particular a periodic beam interrupting device. A modulation of the illumination should be understood to mean a process in which a total power of the illumination is varied, preferably periodically, in particular with one or a plurality of modulation frequencies. In particular, a periodic modulation can be effected between a maximum value and a minimum value of the total power of the illumination. The minimum value can be 0, but can also be >0, such that, by way of example, complete modulation does not have to be effected. The modulation can be effected for example in a beam path between the object and the sensor layer, for example by the at least one modulation device being arranged in said beam path. Alternatively or additionally, however, the modulation can also be effected in a beam path between an optional illumination source—described in even greater detail below—for illuminating the object and the object, for example by the at least one modulation device being arranged in said beam path. A combination of these possibilities is also conceivable. The at least one modulation device can comprise for example a beam chopper or some other type of periodic beam interrupting device, for example comprising at least one interrupter blade or interrupter wheel, which preferably rotates at constant speed and which can thus periodically interrupt the illumination. Alternatively or additionally, however, it is also possible to use one or a plurality of different types of modulation devices, for example modulation devices based on an electro-optical effect and/or an acousto-optical effect. Once again alternatively or additionally, the at least one optional illumination source itself can also be designed to generate a modulated illumination, for example by said illumination source itself having a modulated intensity and/or total power, for example a periodically modulated total power, and/or by said illumination source being embodied as a pulsed illumination source, for example as a pulsed laser. Thus, by way of example, the at least one modulation device can also be wholly or partly integrated into the illumination source. Various possibilities are conceivable.

Accordingly, the detector can be designed in particular to detect at least two sensor signals in the case of different modulations, in particular at least two longitudinal sensor signals at respectively different modulation frequencies. The evaluation device can be designed to generate the geometrical information from the at least two longitudinal sensor signals. As described in WO 2012/110924 A1 and WO 2014/097181 A1, it is possible to resolve ambiguities and/or it is possible to take account of the fact that, for example, a total power of the illumination is generally unknown. By way of example, the detector can be designed to bring about a modulation of the illumination of the object and/or at least one sensor region of the detector, with a frequency of 0.05 Hz to 1 MHz, such as 0.1 Hz to 10 kHz. As outlined above, for this purpose, the detector may comprise at least one modulation device, which may be integrated into the at least one optional illumination source and/or may be independent from the illumination source. Thus, at least one illumination source might, by itself, be adapted to generate the modulation of the illumination, and/or at least one independent modulation device may be present, such as at least one chopper and/or at least one device having a modulated transmissibility, such as at least one electro-optical device and/or at least one acousto-optical device.

According to the present invention, it may be advantageous in order to apply at least one modulation frequency to the detector as described above. However, it may still be possible to directly determine the longitudinal sensor signal without applying a modulation frequency to the detector. As will be demonstrated below in more detail, an application of a modulation frequency may not be required under many relevant circumstances in order to acquire the desired longitudinal information about the object. As a result, the detector may, thus, not be required to comprise a modulation device which may further contribute to the simple and cost-effective setup of the spatial detector. As a further result, a spatial light modulator may be used in a time-multiplexing mode rather than a frequency-multiplexing mode or in a combination thereof.

In a further aspect of the present invention, a human-machine interface for exchanging at least one item of information between a user and a machine is proposed. The human-machine interface as proposed may make use of the fact that the above-mentioned detector in one or more of the embodiments mentioned above or as mentioned in further detail below may be used by one or more users for providing information and/or commands to a machine. Thus, preferably, the human-machine interface may be used for inputting control commands.

The human-machine interface comprises at least one detector according to the present invention, such as according to one or more of the embodiments disclosed above and/or according to one or more of the embodiments as disclosed in further detail below, wherein the human-machine interface is designed to generate at least one item of geometrical information of the user by means of the detector wherein the human-machine interface is designed to assign the geometrical information to at least one item of information, in particular to at least one control command.

In a further aspect of the present invention, an entertainment device for carrying out at least one entertainment function is disclosed. As used herein, an entertainment device is a device which may serve the purpose of leisure and/or entertainment of one or more users, in the following also referred to as one or more players. As an example, the entertainment device may serve the purpose of gaming, preferably computer gaming. Additionally or alternatively, the entertainment device may also be used for other purposes, such as for exercising, sports, physical therapy or motion tracking in general. Thus, the entertainment device may be implemented into a computer, a computer network or a computer system or may comprise a computer, a computer network or a computer system which runs one or more gaming software programs.

The entertainment device comprises at least one human-machine interface according to the present invention, such as according to one or more of the embodiments disclosed above and/or according to one or more of the embodiments disclosed below. The entertainment device is designed to enable at least one item of information to be input by a player by means of the human-machine interface. The at least one item of information may be transmitted to and/or may be used by a controller and/or a computer of the entertainment device.

In a further aspect of the present invention, a tracking system for tracking the position of at least one movable object is provided. As used herein, a tracking system is a device which is adapted to gather information on a series of past positions of the at least one object or at least one part of an object. Additionally, the tracking system may be adapted to provide information on at least one predicted future position of the at least one object or the at least one part of the object. The tracking system may have at least one track controller, which may fully or partially be embodied as an electronic device, preferably as at least one data processing device, more preferably as at least one computer or microcontroller. Again, the at least one track controller may comprise the at least one evaluation device and/or may be part of the at least one evaluation device and/or might fully or partially be identical to the at least one evaluation device.

The tracking system comprises at least one detector according to the present invention, such as at least one detector as disclosed in one or more of the embodiments listed above and/or as disclosed in one or more of the embodiments below. The tracking system further comprises at least one track controller. The tracking system may comprise one, two or more detectors, particularly two or more identical detectors, which allow for a reliable acquisition of depth information about the at least one object in an overlapping volume between the two or more detectors. The track controller is adapted to track a series of positions of the object, each position comprising at least one item of information on a position of the object at a specific point in time.

The tracking system may further comprise at least one beacon device connectable to the object. For a potential definition of the beacon device, reference may be made to WO 2014/097181 A1. The tracking system preferably is adapted such that the detector may generate an information on the position of the object of the at least one beacon device, in particular to generate the information on the position of the object which comprises a specific beacon device exhibiting a specific spectral sensitivity. Thus, more than one beacon exhibiting a different spectral sensitivity may be tracked by the detector of the present invention, preferably in a simultaneous manner. Herein, the beacon device may fully or partially be embodied as an active beacon device and/or as a passive beacon device. As an example, the beacon device may comprise at least one illumination source adapted to generate at least one light beam to be transmitted to the detector. Additionally or alternatively, the beacon device may comprise at least one reflector adapted to reflect light generated by an illumination source, thereby generating a reflected light beam to be transmitted to the detector.

In a further aspect of the present invention, a scanning system for determining at least one position of at least one object is provided. As used herein, the scanning system is a device which is adapted to emit at least one light beam being configured for an illumination of at least one dot located at at least one surface of the at least one object and for generating at least one item of information about the distance between the at least one dot and the scanning system. For the purpose of generating the at least one item of information about the distance between the at least one dot and the scanning system, the scanning system comprises at least one of the detectors according to the present invention, such as at least one of the detectors as disclosed in one or more of the embodiments listed above and/or as disclosed in one or more of the embodiments below.

Thus, the scanning system comprises at least one illumination source which is adapted to emit the at least one light beam being configured for the illumination of the at least one dot located at the at least one surface of the at least one object. As used herein, the term "dot" refers to a small area on a part of the surface of the object which may be selected, for example by a user of the scanning system, to be illuminated by the illumination source. Preferably, the dot may exhibit a size which may, on one hand, be as small as possible in order to allow the scanning system determining a value for the distance between the illumination source comprised by the scanning system and the part of the surface of the object on which the dot may be located as exactly as possible and which, on the other hand, may be as large as possible in order to allow the user of the scanning system or the scanning system itself, in particular by an automatic procedure, to detect a presence of the dot on the related part of the surface of the object.

For this purpose, the illumination source may comprise an artificial illumination source, in particular at least one laser source and/or at least one incandescent lamp and/or at least one semiconductor light source, for example, at least one light-emitting diode, in particular an organic and/or inorganic light-emitting diode. On account of their generally defined beam profiles and other properties of handleability, the use of at least one laser source as the illumination source is particularly preferred. Herein, the use of a single laser source may be preferred, in particular in a case in which it may be important to provide a compact scanning system that might be easily storable and transportable by the user. The illumination source may thus, preferably be a constituent part of the detector and may, therefore, in particular be integrated into the detector, such as into the housing of the detector. In a preferred embodiment, particularly the housing of the scanning system may comprise at least one display configured for providing distance-related information to the user, such as in an easy-to-read manner. In a further preferred embodiment, particularly the housing of the scanning system may, in addition, comprise at least one button which may be configured for operating at least one function related to the scanning system, such as for setting one or more operation modes. In a further preferred embodiment, particularly the housing of the scanning system may, in addition, comprise at least one fastening unit which may be configured for fastening the scanning system to a further surface, such as a rubber foot, a base plate or a wall holder, such comprising as magnetic material, in particular for increasing the accuracy of the distance measurement and/or the handleablity of the scanning system by the user.

In a particularly preferred embodiment, the illumination source of the scanning system may, thus, emit a single laser beam which may be configured for the illumination of a single dot located at the surface of the object. By using at least one of the detectors according to the present invention at least one item of information about the distance between the at least one dot and the scanning system may, thus, be generated. Hereby, preferably, the distance between the illumination system as comprised by the scanning system and the single dot as generated by the illumination source may be determined, such as by employing the evaluation device as comprised by the at least one detector. However, the scanning system may, further, comprise an additional evaluation system which may, particularly, be adapted for this purpose. Alternatively or in addition, a size of the scanning system, in particular of the housing of the scanning system, may be taken into account and, thus, the distance between a specific point on the housing of the scanning system, such as a front edge or a back edge of the housing, and the single dot may, alternatively, be determined.

Alternatively, the illumination source of the scanning system may emit two individual laser beams which may be configured for providing a respective angle, such as a right angle, between the directions of an emission of the beams, whereby two respective dots located at the surface of the same object or at two different surfaces at two separate objects may be illuminated. However, other values for the respective angle between the two individual laser beams may also be feasible. This feature may, in particular, be employed for indirect measuring functions, such as for deriving an indirect distance which may not be directly accessible, such as due to a presence of one or more obstacles between the scanning system and the dot or which may otherwise be hard to reach. By way of example, it may, thus, be feasible to determine a value for a height of an object by measuring two individual distances and deriving the height by using the Pythagoras formula. In particular for being able to keep a predefined level with respect to the object, the scanning system may, further, comprise at least one leveling unit, in particular an integrated bubble vial, which may be used for keeping the predefined level by the user.

As a further alternative, the illumination source of the scanning system may emit a plurality of individual laser beams, such as an array of laser beams which may exhibit a respective pitch, in particular a regular pitch, with respect to each other and which may be arranged in a manner in order to generate an array of dots located on the at least one surface of the at least one object. For this purpose, specially adapted optical elements, such as beam-splitting devices and mirrors, may be provided which may allow a generation of the described array of the laser beams.

Thus, the scanning system may provide a static arrangement of the one or more dots placed on the one or more surfaces of the one or more objects. Alternatively, illumination source of the scanning system, in particular the one or more laser beams, such as the above described array of the laser beams, may be configured for providing one or more light beams which may exhibit a varying intensity over time and/or which may be subject to an alternating direction of emission in a passage of time. Thus, the illumination source may be configured for scanning a part of the at least one surface of the at least one object as an image by using one or more light beams with alternating features as generated by the at least one illumination source of the scanning device. In particular, the scanning system may, thus, use at least one row scan and/or line scan, such as to scan the one or more surfaces of the one or more objects sequentially or simultaneously. Thus, the scanning system may be adapted to measure angles by measuring three or more dots, or the scanning system may be adapted to measure corners or narrow regions such as a gable of a roof, which may be hardly accessible using a conventional measuring stick.

As a non-limiting example, the scanning system may be attached to a tripod and point towards an object or region with a several corners and surfaces. One or more flexibly movable laser sources are attached to the scanning system. The one or more laser sources are moved as such that they illuminate points of interest. The position of the illuminated points with respect to the scanning system is measured when pressing a designated button on the scanning system and the position information is transmitted via a wireless interface to a mobile phone. The position information is stored in a mobile phone application. The laser sources are moved to illuminate further points of interest the position of which are measured and transmitted to the mobile phone application. The mobile phone application may transform the set of points into a 3d model by connecting adjacent points with planar surfaces. The 3d model may be stored and processed further. The distances and or angles between the measured points or surfaces may be displayed directly on a display attached to a scanning system or on the mobile phone to which the position information is transmitted.

As a non-limiting example, a scanning system may comprise two or more flexible movable laser sources to project points and further one movable laser source projecting a line. The line may be used to arrange the two or more laser spots along a line and the display of the scanning device may display the distance between the two or more laser spots that may be arranged along the line, such as at equal distance. In the case of two laser spots, a single laser source may be used whereas the distance of the projected points is modified using one or more beam-splitters or prisms, where a beam-splitter or prism can be moved as such that the projected laser spots move apart or closer together. Further, the scanning system may be adapted to project further patterns such as a right angle, a circle, a square, a triangle, or the like, along which a measurement can be done by projecting laser spots and measuring their position.

As a non-limiting example, the scanning system may be adapted to support the work with tools, such as wood or metal processing tools, such as a saw, a driller, or the like. Thus, the scanning system may be adapted to measure the distance in two opposite directions and display the two measured distances or the sum of the distances in a display. Further, the scanning system may be adapted to measure the distance to the edge of a surface as such that when the scanning system is placed on the surface, a laser point is moved automatically away from the scanning system along the surface, until the distance measurement shows a sudden change due to a corner or the edge of a surface. This makes it possible to measure the distance of the end of a wood plank while the scanning device is placed on the plank but remote from its end. Further, the scanning system may measure the distance of the end of a plank in one direction and project a line or circle or point in a designated distance in the opposite direction. The scanning system may be adapted to project the line or circle or point in a distance depending on the distance measured in the opposite direction such as depending on a predetermined sum distance. This allows working with a tool such as a saw or driller at the projected position while placing the scanning system in a safe distance from the tool and simultaneously perform a process using the tool in a predetermined distance to the edge of the plank. Further, the scanning system may be adapted to project points or lines or the like in two opposite directions in a predetermined distance. When the sum of the distances is changed, only one of the projected distances changes.

As a non-limiting example, the scanning system may be adapted to be placed onto a surface, such as a surface on which a task is performed, such as cutting, sawing, drilling, or the like, and to project a line onto the surface in a predetermined distance that can be adjusted such as with buttons on the scanning device.

In a further aspect of the present invention, a stereoscopic system for generating at least one single circular, three-dimensional image of at least one object is provided. As used herein, the stereoscopic system as disclosed above and/or below may comprise at least two of the FiP sensors as the longitudinal optical sensors, wherein a first FiP sensor may be comprised in a tracking system, in particular in a tracking system according to the present invention, while a second FiP sensor may be comprised in a scanning system, in particular in a scanning system according to the present invention. Herein, the FiP sensors may, preferably, be arranged in separate beam paths in a collimated arrangement, such as by aligning the FiP sensors parallel to the optical axis and individually displaced perpendicular to the optical axis of the stereoscopic system. Thus, the FiP sensors may be able to generate or increase a perception of depth information, especially, by obtaining the depth information by a combination of the visual information derived from the individual FiP sensors which have overlapping fields of view and are, preferably, sensitive to an individual modulation frequency. For this purpose, the individual FiP sensors may, preferably, be spaced apart from each other by a distance from 1 cm to 100 cm, preferably from 10 cm to 25 cm, as determined in the direction perpendicular to the optical axis. In this preferred embodiment, the tracking system may, thus, be employed for determining a position of a modulated active target while the scanning system which is adapted to project one or more dots onto the one or more surfaces of the one or more objects may be used for generating at least one item of information about the distance between the at least one dot and the scanning system. In addition, the stereoscopic system may further comprise a separate position sensitive device being adapted for generating the item of information on the transversal position of the at least one object within the image as described elsewhere in this application.

Besides allowing stereoscopic vision, further particular advantages of the stereoscopic system which are primarily based on a use of more than one longitudinal optical sensors may, in particular, include an increase of the total intensity and/or a lower detection threshold. Further, whereas in a conventional stereoscopic system which comprises at least two conventional position sensitive devices corresponding pixels in the respective images have to be determined by applying considerable computational effort, in the stereoscopic system according to the present invention which comprises at least two FiP sensors the corresponding pixels in the respective images being recorded by using the FiP sensors, wherein each of the FiP sensors may be operated with a different modulation frequency, may apparently be assigned with respect to each other. Thus, it may be emphasized that the stereoscopic system according to the present invention may allow generating the at least one item of information on the longitudinal position of the object as well as on the transversal position of the object with reduced effort.

For further details of the stereoscopic system, reference may be made to the description of the tracking system and the scanning system, respectively.

In a further aspect of the present invention, a camera for imaging at least one object is disclosed. The camera comprises at least one detector according to the present invention, such as disclosed in one or more of the embodiments given above or given in further detail below. Thus, the detector may be part of a photographic device, specifically of a digital camera. Specifically, the detector may be used for 3D photography, specifically for digital 3D photography. Thus, the detector may form a digital 3D camera or may be part of a digital 3D camera. As used herein, the term "photography" generally refers to the technology of acquiring image information of at least one object. As further used herein, a "camera" generally is a device adapted for performing photography. As further used herein, the term "digital photography" generally refers to the technology of acquiring image information of at least one object by using a plurality of light-sensitive elements adapted to generate electrical signals indicating an intensity of illumination, preferably digital electrical signals. As further used herein, the term "3D photography" generally refers to the technology of acquiring image information of at least one object in three spatial dimensions. Accordingly, a 3D camera is a device adapted for performing 3D photography. The camera generally may be adapted for acquiring a single image, such as a single 3D image, or may be adapted for acquiring a plurality of images, such as a sequence of images. Thus, the camera may also be a video camera adapted for video applications, such as for acquiring digital video sequences.

Thus, generally, the present invention further refers to a camera, specifically a digital camera, more specifically a 3D camera or digital 3D camera, for imaging at least one object. As outlined above, the term imaging, as used herein, generally refers to acquiring image information of at least one object. The camera comprises at least one detector according to the present invention. The camera, as outlined above, may be adapted for acquiring a single image or for acquiring a plurality of images, such as image sequence, preferably for acquiring digital video sequences. Thus, as an example, the camera may be or may comprise a video camera. In the latter case, the camera preferably comprises a data memory for storing the image sequence.

In a further aspect of the present invention, a method for manufacturing an optical detector for an optical detection of an incident light beam is disclosed. The method preferably may be used for manufacturing or producing at least one detector according to the present invention, such as of at least one detector according to one or more of the embodiments disclosed elsewhere in this document in further detail below. Thus, for optional embodiments of the method, reference might be made to the description of the various embodiments of the detector.

The method comprises the following steps, which may be performed in the given order or in a different order. Further, additional method steps might be provided which are not listed. Unless explicitly indicated otherwise, two or more or even all of the method steps might be performed simultaneously, at least partially. Further, two or more or even all of the method steps might be performed twice or even more than twice, repeatedly.

The method for manufacturing the optical detector according to the present invention comprises the following steps:

a) depositing a reflective layer on a partition of the circuit carrier, the reflective layer being designed to at least partially reflect the incident light beam;

b) generating a sensor layer by depositing a photosensitive material on an at least partially transparent substrate layer, wherein the sensor layer is designed to generate at least one sensor signal in a manner dependent on an illumination of the sensor layer by the incident light beam and the reflected light beam; and c) placing the substrate layer carrying the sensor layer on the reflective layer; and d) providing an evaluation device wherein the evaluation device is designed to receive the sensor signal and to generate at least one item of information by evaluating the sensor signal.

Thus, according to step a), a reflective layer may, firstly, be deposited on a partition of the circuit carrier, in particular, on the printed circuit board (PCB). Independently, a sensor layer be generated according to step b) by depositing a photosensitive material on an at least partially transparent substrate layer. Subsequently, the substrate layer which carries the sensor layer may be placed according to step c) on the reflective layer, preferably, by applying an adhesive layer, whereby the reflective layer may be arranged in the desired position to be capable of reflecting the incident light beam, in particular, back to the sensor layer. As a result, losses of the incident light may, thus, be reduced by redirecting impinging light beams back into the sensor layer for a preferred absorption of the incident light. Thereafter, at least two individual electrical contacts may be provided for contacting the sensor layer, wherein the electrical contacts are designed to transmit the sensor signal via the circuit carrier to the evaluation device. Thus, the at least two individual electrical contacts for providing an electrical connection between the sensor layer and the evaluation device may be applied, wherein the electrical connection may, preferably, be obtained by applying wire bonds between the individual electrical contacts and corresponding receiving contacts, such as contact pads, which may, preferably, be further placed on the circuit carrier, such as the PCB.

In a particularly preferred embodiment, the sensor layer may be directly or indirectly applied to the substrate layer, preferably in a manner that no gap may be left or generated between the substrate layer and the sensor layer. For this purpose, the sensor layer may be applied by using a deposition method, wherein the deposition method is selected from the group consisting of vacuum evaporation, sputtering, atomic layer deposition, chemical vapor deposition, spray pyrolysis, electrodeposition, anodization, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, and solution-gas interface techniques.

In a particular embodiment, an adhesive layer may, additionally, be placed between the substrate layer and the reflective layer. For further details of the adhesive layer reference may be made to description of the adhesive layer as provided herein.

As mentioned above, the desired detector is, generally, designed to generate at least one sensor signal in a manner dependent on an illumination of the sensor layer by an incident light beam. For this purpose, at least two electrical contacts being adapted to electrically contact the sensor layer may be further provided. In general, the electrical contacts may be provided before or during any one of the method steps a) to c). In a particularly preferred embodiment, the electrical contacts may be provided by using an evaporated metal layer, such as by known evaporation techniques, wherein the metal layer may, particularly, comprise one or more of silver, aluminum, platinum, magnesium, chromium, titanium, gold, or highly conductive graphene. Alternatively, the electrical contacts may be provided by a galvanic or chemically deposition process, such as electroless Ni, electroless Au, galvanic Ni, or galvanic Au.

In addition, a cover layer may be deposited on the sensor layer in a manner that it may also fully or partially cover the electrical contacts. In this particular embodiment, the electrical contacts are at least partially, preferably fully, covered by the cover layer may, thus, be bonded to at least one external connection by using electrically conductive leads, preferably in form of wires, in particular Au, Al, or Cu wires, wherein the electrically conductive leads may, especially, be bonded to the electrical contacts through the cover layer. By way of example, Au contacts covered by the cover layer may, subsequently, be contacted by wire bonds.

As already described above, at least one additional layer may, further, be deposited on the cover layer or a partition thereof. Herein, the additional layer may be selected to be or comprise at least one of an additional optical filter layer, an anti-reflective layer, an adhesive layer, an encapsulating layer, a scratch-resistant layer, a hydrophilic layer, a hydrophobic layer, a self-cleaning layer, an anti-fog layer, or a conductive layer.

In addition, further details concerning the manufacturing process for the optical detector may be found elsewhere in this document.

The devices according to the present invention may be used in combination with surface mount technology packages such as bump chip carriers, ceramic leadless chip carriers, leadless chip carriers, leaded chip carriers, leaded ceramic chip carriers, dual lead-less chip carriers, plastic leaded chip carrier, package on package chip carriers, or the like. Further, devices according to the present invention may be used in combination with standard through-hole or source mount technology semiconductor packages such as DO-204, DO-213, Metal electrode leafless face, DO-214, SMA, SMB, SMC, GF1, SOD, SOT, TSOT, TO-3, TO-5, TO-8, TO-18, TO-39, TO-46, TO-66, TO-92, TO-99, TO-100, TO-126, TO-220, TO-226, TO-247, TO252, TO-263, TO-263 THIN, SIP, SIPP, DFN, DIP, DIL, Flat Pack, SO, SOIC, SOP, SSOP, TSOP, TSSOP, ZIP, LCC, PLCC, QFN, QFP, QUIP, QUIL, BGA, eWLB, LGA, PGA, COB, COF, COG, CSP, Flip Chip, PoP, QP, UICC, WL-CSP, WLP, MDIP, PDIP, SDIP, CCGA, CGA, CERPACK, CQGP, LLP, LGA, LTCC, MCM, MICRO SMDXT, or the like. Further, devices according to the present invention may be used in combination with pin grid arrays (PGA) such as OPGA, FCPGA, PAC, PGA, CPGA, or the like. Further, devices according to the present invention may be used in combination with flat packages such as CFP, CQFP, BQFP, DFN, ETQFP, PQFN, PQFP, LQFP, QFN, QFP, MQFP, HVQFP, SIDEBRAZE, TQFP, TQFN, VQFP, ODFN, or the like. Further, devices according to the present invention may be used in combination with small outline packages such as SOP, CSOP MSOP, PSOP, PSON, PSON, QSOP, SOIC, SSOP, TSOP, TSSOP, TVSOP, µMAX, WSON, or the like. Further, devices according to the present invention may be used in combination with chip-scale packages such as CSP, TCSP, TDSP, MICRO SMD, COB, COF, COG, or the like. Further, devices according to the present invention may be used in combination with ball grid arrays such as FBGA, LBGA, TEPBGA, CBGA, OBGA, TFBGA, PBGA, MAPBGA, UCSP, µBGA, LFBGA, TBGA, SBGA, UFBGA, or the like. Further, devices according to the present invention may be combined with further electronic devices such as chips in multi-chip packages such as SiP, PoP, 3D-SiC, WSI, proximity communication, or the like. For additional information concerning integrate circuit packings reference may be made to the following sources at https://en.wikipedia.org/wiki/List_of_integrated_circuit_packaging_types or https://en.wikipedia.org/wiki/List_of_integrated_circuit_package_dimensions.

In a further aspect of the present invention, a use of a detector according to the present invention is disclosed. Therein, a use of the detector for a purpose of determining a position of an object, in particular a lateral position of an object, is proposed, in particular, for a purpose of use selected from the group consisting of: a position measurement, in particular in traffic technology; an entertainment application; a security application; a human-machine interface application; a tracking application; a scanning application; a stereoscopic vision application; a photography application; an imaging application or camera application; a mapping application for generating maps of at least one space; a homing or tracking beacon detector for vehicles; a position measurement of objects with a thermal signature (hotter or colder than background); a machine vision application; a robotic application.

Preferably, for further potential details of the optical detector, the method, the human-machine interface, the entertainment device, the tracking system, the camera and the various uses of the detector, in particular with regard to the optical sensors, the evaluation device and, if applicable, to the longitudinal optical sensor, the modulation device, the illumination source and the imaging device, specifically with respect to the potential materials, setups and further details, reference may be made to one or more of WO 2012/110924 A1, US 2012/206336 A1, WO 2014/097181 A1, US 2014/291480 A1, and WO 2016/120392 A1, the full content of all of which is herewith included by reference.

Further, the devices according to the present invention may be used for infrared detection applications, heat-detection applications, thermometer applications, heat-seeking applications, flame-detection applications, fire-detection applications, smoke-detection applications, temperature sensing applications, spectroscopy applications, or the like. Further, devices according to the present invention may be used in photocopy or xerography applications. Further, devices according to the present invention may be used to monitor exhaust gas, to monitor combustion processes, to monitor pollution, to monitor industrial processes, to monitor chemical processes, to monitor food processing processes, to assess water quality, to assess air quality, or the like. Further, devices according to the present invention may be used for quality control, temperature control, motion control, exhaust control, gas sensing, gas analytics, motion sensing, chemical sensing, or the like.

The above-described optical detector, the method, the human-machine interface and the entertainment device, which comprises at least one of the detectors, and also the proposed uses have considerable advantages over the prior art. Thus, generally, a simple and, still, efficient detector for an accurate determining a position of at least one object in space, specifically with regard to sensing at least one of transmissivity, absorption, emission and reflectivity of the at least one object may be provided. Further, the detectors according to the present invention may be particularly sensitive over at least a partition of the IR spectral range, especially, in the MidIR spectral range, i.e. from 1.5 µm to 15 µm, thus providing efficient, reliable and large-area position sensitive devices for the infrared.

As compared to devices known in the art, the detector as proposed herein can, preferably, be arranged in a manner to be capable of effectively reducing or avoiding a loss of incident light, in particular light from the infrared spectral range, as far as possible, wherein the optical detector could be manufactured by applying an easy manufacturing process. Herein, the detector can be easily be integrated into a package. Further, the detector as described herein may, preferably, be supplied as a non-bulky hermetic package which may, nevertheless, provide a high degree of protection against possible degradation by external influence, such as humidity and/or oxygen, even at elevated temperatures and/or humidity. Furthermore, the bondability of the electrical contacts even through the cover layer and the non-bulky hermetic package of the sensor layer may allow easy integration on a circuit carrier, such as a printed circuit board (PCB). Herein, the materials used for the detector may be selected in order to ensure that the sensor layer may exhibit a suitable absorption characteristic over a desired spectral range, in particular, within a partition of the IR spectral range, especially, of the MidIR spectral range.

Summarizing, in the context of the present invention, the following embodiments are regarded as particularly preferred:

Embodiment 1: A detector for an optical detection of an incident light beam, comprising
  a circuit carrier designed to carry at least one layer;
  a reflective layer, the reflective layer being placed on a partition of the circuit carrier, wherein the reflective layer is designed to reflect the incident light beam, thereby generating at least one reflected light beam;
  a substrate layer, the substrate layer being directly or indirectly adjacent to the reflective layer, wherein the substrate layer is at least partially transparent with respect to the incident light beam and the reflected light beam;
  a sensor layer, the sensor layer being placed on the substrate layer, wherein the sensor layer is designed to generate at least one sensor signal in a manner dependent on an illumination of the sensor layer by the incident light beam and the reflected light beam; and
  an evaluation device designed to generate at least one item of information by evaluating the sensor signal.

Embodiment 2: The detector according to the preceding embodiment, wherein the detector is designed for detecting at least one wavelength in at least a partition of a spectral range selected from the ultraviolet spectral range, the visible spectral range and the infrared spectral range.

Embodiment 3: The detector according to the preceding embodiment, wherein the detector is designed for detecting at least one wavelength in at least a partition of the infrared spectral range, the infrared spectral range ranging from 760 nm to 1000 µm.

Embodiment 4: The detector according to the preceding embodiment, wherein the detector is designed for detecting at least one wavelength in at least a partition of the mid infrared spectral range, the mid infrared spectral range ranging from of 1.5 µm to 15 µm.

Embodiment 5: The detector according to any one of the preceding embodiments, wherein the circuit carrier is designed to mechanically support and electrically connect the detector.

Embodiment 6: The detector according to any one of the preceding embodiments, wherein the circuit carrier is or comprises a printed circuit board (PCB), preferably, a single-sided PCB.

Embodiment 7: The detector according to the preceding embodiment, wherein the printed circuit board is an electrically non-conductive, planar substrate on which at least one sheet of an electrically conductive material is laminated onto the substrate in a manner that electrically conductive structures are etchable into the sheet.

Embodiment 8: The detector according to any one of the preceding embodiments, wherein the reflective layer is placed on a partition of the surface of the circuit carrier.

Embodiment 9: The detector according to the preceding embodiment, wherein the reflective layer is placed on a partition of the surface of the printed circuit board.

Embodiment 10: The detector according to any one of the preceding embodiments, wherein the reflective layer is designated to reflect the incident light beam in a manner that the incident light beam is reflected back into the sensor layer after it has, at least partially, transmitted the sensor layer.

Embodiment 11: The detector according to any one of the preceding embodiments, wherein the reflective layer is designed to provide a diffuse reflection to the incident light beam.

Embodiment 12: The detector according to any one of the preceding embodiments, wherein the reflective layer exhibits a rough surface, wherein the rough surface, preferably, exhibits an Ra value of at least 0.01 µm.

Embodiment 13: The detector according to any one of the preceding embodiments, wherein the reflective layer comprises a metal layer or, at least, a metal surface, wherein the reflective layer is, preferably, at least one of a gold layer, a silver layer, or a copper layer.

Embodiment 14: The detector according to any one of the preceding embodiments, wherein the reflective layer exhibits a thickness of 10 nm to 100 µm, preferably of 20 nm to 10 µm, more preferred of 40 nm to 2 µm.

Embodiment 15: The detector according to any one of the preceding embodiments, wherein a material for the substrate layer is selected from glass, quartz, silicon (Si), a transparent conducting oxide (TCO), or a transparent organic polymer.

Embodiment 16: The detector according to the preceding embodiment, wherein the transparent conducting oxide (TCO) is selected from the group consisting of aluminum oxide ($Al_2O_3$), titanium oxide ($TiO_2$), indium tin oxide (ITO), fluorine doped tin oxide ($SnO_2$:F; FTO), aluminum doped zinc oxide (AZO), magnesium oxide (MgO), or a perovskite transparent conducting oxide.

Embodiment 17: The detector according to any one of the preceding embodiments, wherein the sensor layer is exactly one continuous sensor layer.

Embodiment 18: The detector according to any one of the preceding embodiments, wherein the sensor layer is directly or indirectly applied to the substrate layer.

Embodiment 19: The detector according to the preceding embodiment, wherein no gap is left or generated between the substrate layer and the sensor layer.

Embodiment 20: The detector according to any one of the two preceding embodiments, wherein the sensor layer is applied by using a deposition method.

Embodiment 21: The detector according to the preceding embodiment, wherein the deposition method is selected from the group consisting of chemical bath deposition, vacuum evaporation, sputtering, atomic layer deposition, chemical vapor deposition, spray pyrolysis, anodization, electrodeposition, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading and solution-gas interface techniques.

Embodiment 22: The detector according to any one of the preceding embodiments, wherein the detector further comprises an adhesive layer placed between substrate and the reflective layer.

Embodiment 23: The detector according to any one of the preceding embodiments, wherein the adhesive layer is or comprises an adhesive substance, wherein the adhesive substance is designed to assemble the substrate and the reflective layer.

Embodiment 24: The detector according to any one of the preceding embodiments, wherein the adhesive layer is at least partially transparent with respect to the incident light beam and the reflected light beam, or wherein the adhesive layer is at least partially reflective with respect to the incident light beam.

Embodiment 25: The detector according to any one of the preceding embodiments, wherein the adhesive substance is selected from an organic adhesive which is, preferably, filled with diffusively or specularly reflecting particles.

Embodiment 26: The detector according to any one of the preceding embodiments, wherein the sensor layer comprises a photosensitive material selected from a group dye solar cells, photoconductive materials, and quantum dots, wherein the photoconductive materials are particularly preferred.

Embodiment 27: The detector according to any one of the preceding embodiments, wherein the photoconductive material comprises an inorganic photoconductive material, an organic photoconductive material, or a combination thereof.

Embodiment 28: The detector according to the preceding embodiment, wherein the inorganic photoconductive material comprises one or more of selenium, tellurium, a selenium-tellurium alloy, a metal oxide, a group IV element or compound, a III-V compound, a II-VI compound, a chalcogenide, a pnictogenide, a halide, and solid solutions and/or doped variants thereof.

Embodiment 29: The detector according to the preceding embodiment, wherein the chalcogenide is selected from a group comprising sulfide chalcogenides, selenide chalcogenides, telluride chalcogenides, ternary chalcogenides, quaternary and higher chalcogenides.

Embodiment 30: The detector according to the preceding embodiment, wherein the sulfide chalcogenide is selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS), cobalt sulfide (CoS), nickel sulfide (NiS), molybdenum disulfide ($MoS_2$), iron disulfide ($FeS_2$), chromium trisulfide ($CrS_3$), copper indium sulfide (CIS), copper indium gallium selenide (CIGS), copper zinc tin sulfide (CZTS), and solid solutions and/or doped variants thereof.

Embodiment 31: The detector according to any one of the two preceding embodiments, wherein the selenide chalcogenide is selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe), molybdenum diselenide ($MoSe_2$), tin selenide (SnSe), cobalt selenide (CoSe), indium selenide ($In_2Se_3$), copper zinc tin selenide (CZTSe), and solid solutions and/or doped variants thereof.

Embodiment 32: The detector according to any one of the three preceding embodiments, wherein the telluride chalcogenide is selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), indium telluride ($In_2Te_3$), and solid solutions and/or doped variants thereof.

Embodiment 33: The detector according to any one of the four preceding embodiments, wherein the ternary chalcogenide is selected from a group comprising mercury cadmium telluride (HgCdTe), mercury zinc telluride (HgZnTe), mercury cadmium sulfide (HgCdS), lead cadmium sulfide (PbCdS), lead mercury sulfide (PbHgS), copper indium disulfide ($CuInS_2$), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), indium gallium phosphide (InGaP), gallium arsenide phosphide (GaAsP), aluminum gallium phosphide (AlGaP), cadmium selenite ($CdSeO_3$), cadmium zinc telluride (CdZnTe), cadmium zinc selenide (CdZnSe), a copper-zinc-tin sulfur-selenium chalcogenide (CZTSSe), and solid solutions and/or doped variants thereof.

Embodiment 34: The detector according to any one of the six preceding embodiments, wherein the II-VI compound is selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe), and solid solutions and/or doped variants thereof.

Embodiment 35: The detector according to any one of the seven preceding embodiments, wherein the III-V compound is selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb), and solid solutions and/or doped variants thereof.

Embodiment 36: The detector according to any one of the eight preceding embodiments, wherein the metal oxide is selected from a group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), and solid solutions and/or doped variants thereof.

Embodiment 37: The detector according to any one of the nine preceding embodiments, wherein the group IV element or compound is selected from a group comprising doped diamond (C), doped silicon (Si), silicon carbide (SiC), and silicon germanium (SiGe), and solid solutions and/or doped variants thereof.

Embodiment 38: The detector according to any one of the ten preceding embodiments, wherein the photoconductive material is provided as a colloidal film comprising quantum dots.

Embodiment 39: The detector according to the preceding embodiment, wherein the photoconductive material is selected from the group comprising lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe), copper indium sulfide (CIS), copper indium gallium selenide (CIGS), and copper zinc tin sulfide (CZTS).

Embodiment 40: The detector according to the preceding embodiment, wherein the sensor layer exhibits a thickness from 1 nm to 100 µm, preferably from 10 nm to 10 µm, more preferred from 100 nm to 1 µm.

Embodiment 41: The detector according to any one of the preceding embodiments, further comprising at least two individual electrical contacts contacting the sensor layer, wherein the electrical contacts are designed to transmit the sensor signal via the circuit carrier to the evaluation device.

Embodiment 42: The detector according to the preceding embodiment, wherein the wire bonds provide a direct connection between each of the electrical contacts contacting the sensor layer and a corresponding receiving contact.

Embodiment 43: The detector according to the preceding embodiment, wherein the receiving contact is further placed on the circuit carrier, preferably on the printed circuit board (PCB).

Embodiment 44: The detector according to any one of the two preceding embodiments, wherein the receiving contact is a contact pad.

Embodiment 45: The detector according to any one of the preceding embodiments, further comprising a cover layer deposited on the sensor layer.

Embodiment 46: The detector according to the preceding embodiment, wherein the cover layer is an amorphous layer comprising at least one metal-containing compound.

Embodiment 47: The detector according to the preceding embodiment, wherein the at least one metal-containing compound comprises a metal or a semimetal, wherein the metal is selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, and Bi, and wherein the semimetal is selected from the group consisting of B, Ge, As, Sb, and Te.

Embodiment 48: The detector according to the preceding embodiment, wherein the at least one metal-containing compound comprises a metal selected from the group consisting of Al, Ti, Ta, Mn, Mo, Zr, Hf, and W.

Embodiment 49: The detector according to any one of the three preceding embodiments, wherein the at least one metal-containing compound is selected from the group comprising an oxide, a hydroxide, a chalcogenide, a pnictide, a carbide, or a combination thereof.

Embodiment 50: The detector according to the preceding embodiment, wherein the at least one metal-containing compound comprises at least one oxide, at least one hydroxide, or a combination thereof of Al, Ti, Zr or Hf.

Embodiment 51: The detector according to any one of the six preceding embodiments, wherein the cover layer has a thickness of 10 nm to 600 nm, preferably of 20 nm to 200 nm, more preferred of 40 nm to 100 nm, most preferred of 50 to 75 nm.

Embodiment 52: The detector according to any one of the seven preceding embodiments, wherein the cover layer is or comprises an chemical bath deposition, vacuum evaporation, sputtering, atomic layer deposition, chemical vapor deposition, spray pyrolysis, anodization, electrodeposition, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, dip coating, and solution-gas interface techniques.

Embodiment 53: The detector according to any one of the eight preceding embodiments, wherein the cover layer additionally comprises a property of at least one of an optical filter, an anti-reflective layer, an encapsulating layer, an adhesive layer, a scratch-resistant layer, a hydrophilic layer, a hydrophobic layer, a self-cleaning layer, an anti-fog layer, or a conductive layer.

Embodiment 54: The detector according to any one of the nine preceding embodiments, wherein the cover layer directly contacts the sensor layer.

Embodiment 55: The detector according to the preceding embodiment, wherein the cover layer fully covers the accessible surface of the sensor layer.

Embodiment 56: The detector according to any one of the two preceding embodiments, wherein the cover layer at least partially covers the electrical contacts.

Embodiment 57: The detector according to the preceding embodiment, wherein the electrical contacts are bondable through the cover layer.

Embodiment 58: The detector according to any one of the preceding embodiments, wherein the electrical contacts are bondable, preferably by using wire bonds, in particular Au, Al, or Cu wires.

Embodiment 59: The detector according to any one of the preceding embodiments, wherein the at least two individual electrical contacts are applied at different locations of the sensor layer.

Embodiment 60: The detector according to any one of the preceding embodiments, wherein the electrical contacts comprise at least one electrode material selected from the group consisting of Ag, Pt, Mo, Al, Au, and highly conductive graphene.

Embodiment 61: The detector according to the preceding embodiment, wherein a further adhesive layer is provided at the electrical contacts, wherein the further adhesive layer is adapted for bonding.

Embodiment 62: The detector according to the preceding embodiment, wherein the further adhesive layer comprises at least one of Ni, Cr, Ti, or Pd.

Embodiment 63: The detector according to any of the preceding embodiments, wherein the detector is adapted to generate the sensor signal by one or more of measuring an electrical resistance or a conductivity of at least one part of the sensor layer.

Embodiment 64: The detector according to the preceding embodiment, wherein the detector is adapted to generate the sensor signal by performing at least one current-voltage measurement and/or at least one voltage-current-measurement.

Embodiment 65: The detector according to any one of the preceding embodiments, further comprising a bias voltage source.

Embodiment 66: The detector according to the preceding embodiment, wherein the bias voltage source and a load resistor are arranged in series with the sensor layer.

Embodiment 67: The detector according to any one of the two preceding embodiments, wherein a bias voltage is applied across the photosensitive material of the sensor layer.

Embodiment 68: The detector according to any one of the preceding embodiments, wherein the detector furthermore has at least one modulation device for modulating the illumination.

Embodiment 69: The detector according to the preceding embodiment, wherein the light beam is a modulated light beam.

Embodiment 70: The detector according to the preceding embodiment, wherein the detector is designed to detect at least two sensor signals in the case of different modulations, in particular at least two sensor signals at respectively different modulation frequencies, wherein the evaluation device is designed to generate the at least one item of information on the position of an object by evaluating the at least two sensor signals at the respectively different modulation frequencies.

Embodiment 71: The detector according to any one of the two preceding embodiments, wherein the optical sensor is furthermore designed in such a way that the sensor signal, given the same total power of the illumination, is dependent on a modulation frequency of a modulation of the illumination.

Embodiment 72: The detector according to the preceding embodiment, wherein the light beam is a non-modulated continuous-wave light beam.

Embodiment 73: The detector according to any one of the preceding embodiments, wherein the sensor signal is a longitudinal sensor signal, wherein the longitudinal sensor signal, given the same total power of the illumination, is dependent on a beam cross-section of the light beam in the sensor layer, wherein the longitudinal sensor signal, given the same total power of the illumination, is dependent on the beam cross-section of the light beam in the sensor layer, wherein the evaluation device is designed to generate at least one item of information on a longitudinal position of an object by evaluating the longitudinal sensor signal.

Embodiment 74: The detector according to the preceding embodiment, wherein the evaluation device is designed to generate the at least one item of information on the longitudinal position of the object from at least one predefined relationship between the geometry of the illumination and a relative positioning of the object with respect to the detector, preferably taking account of a known power of the illumination and optionally taking account of a modulation frequency with which the illumination is modulated.

Embodiment 75: The detector according to any one of the two preceding embodiments, wherein the sensor signal is a uniform sensor signal for the entire sensor layer.

Embodiment 76: The detector according to any one of the three preceding embodiments, wherein the evaluation device is adapted to normalize the longitudinal sensor signal and to generate the information on the longitudinal position of the object independent from an intensity of the modified light beam.

Embodiment 77: The detector according to the preceding embodiment, wherein the evaluation device is adapted to recognize whether the modified light beam widens or narrows, by comparing the longitudinal sensor signals of different longitudinal sensors.

Embodiment 78: The detector according to any one of the five preceding embodiments, wherein the evaluation device is adapted to generate the at least one item of information on the longitudinal position of the object by determining a diameter of the modified light beam from the at least one longitudinal sensor signal.

Embodiment 79: The detector according to the preceding embodiment, wherein the evaluation device is adapted to compare the diameter of the modified light beam with known beam properties of the light beam in order to determine the at least one item of information on the longitudinal position of the object, preferably from a known dependency of a beam diameter of the modified light beam on at least one propagation coordinate in a direction of propagation of the modified light beam and/or from a known Gaussian profile of the modified light beam.

Embodiment 80: The detector according to any one of the preceding embodiments, wherein the sensor signal is a transversal sensor signal, wherein the transversal sensor signal is provided by the electrical contacts contacting the sensor layer.

Embodiment 81: The detector according to the preceding embodiment, wherein the electrical contacts are configured as at least one split electrode, wherein the bias voltage source is applicable to the at least one split electrode, wherein the evaluation device is further designed to generate at least one item of information on a transversal position of the object by applying the bias voltage source and the at least one split electrode and by evaluating the transversal sensor signal.

Embodiment 82: The detector according to the preceding embodiment, wherein the split electrode comprises at least two partial electrodes.

Embodiment 83: The detector according to the preceding embodiment, wherein at least four partial electrodes are provided, wherein each of the partial electrodes is preferably provided in a form comprising a T shape.

Embodiment 84: The detector according to any one of the two preceding embodiments, wherein electrical currents through the partial electrodes are dependent on a position of the modified light beam in the sensor layer.

Embodiment 85: The detector according to the preceding embodiment, wherein the transversal sensor signal is generated in accordance with the electrical currents through the partial electrodes, wherein the evaluation device is adapted to generate the information on the transversal position of the object from at least one ratio of the currents through the partial electrodes.

Embodiment 86: The detector according to any one of the preceding embodiments relating to a detector, furthermore comprising at least one illumination source.

Embodiment 87: The detector according to the preceding embodiment, wherein the illumination source is selected from: an illumination source, which is at least partly connected to the object and/or is at least partly identical to the object; an illumination source which is designed to at least partly illuminate the object with a primary radiation.

Embodiment 88: The detector according to the preceding embodiment, wherein the light beam is generated by a reflection of the primary radiation on the object and/or by light emission by the object itself, stimulated by the primary radiation.

Embodiment 89: The detector according to the preceding embodiment, wherein the spectral sensitivity of the sensor layer is covered by the spectral range of the illumination source.

Embodiment 90: A human-machine interface for exchanging at least one item of information between a user and a machine, in particular for inputting control commands, wherein the human-machine interface comprises at least one detector according to any one of the preceding embodiments relating to a detector, wherein the human-machine interface is designed to generate at least one item of geometrical information of the user by means of the detector wherein the human-machine interface is designed to assign to the geometrical information at least one item of information, in particular at least one control command.

Embodiment 91: The human-machine interface according to the preceding embodiment, wherein the at least one item of geometrical information of the user is selected from the group consisting of: a position of a body of the user; a position of at least one body part of the user; an orientation of a body of the user; an orientation of at least one body part of the user.

Embodiment 92: The human-machine interface according to any of the two preceding embodiments, wherein the human-machine interface further comprises at least one beacon device connectable to the user, wherein the human-machine interface is adapted such that the detector may generate an information on the position of the at least one beacon device.

Embodiment 93: The human-machine interface according to the preceding embodiment, wherein the beacon device comprises at least one illumination source adapted to generate at least one light beam to be transmitted to the detector.

Embodiment 94: An entertainment device for carrying out at least one entertainment function, in particular a game, wherein the entertainment device comprises at least one human-machine interface according to any of the preceding embodiments referring to a human-machine interface, wherein the entertainment device is designed to enable at least one item of information to be input by a player by means of the human-machine interface, wherein the entertainment device is designed to vary the entertainment function in accordance with the information.

Embodiment 95: A tracking system for tracking the position of at least one movable object, the tracking system comprising at least one detector according to any of the preceding embodiments referring to a detector, the tracking system further comprising at least one track controller, wherein the track controller is adapted to track a series of positions of the object, each comprising at least one item of information on a position of the object at a specific point in time.

Embodiment 96: The tracking system according to the preceding embodiment, wherein the tracking system further comprises at least one beacon device connectable to the object, wherein the tracking system is adapted such that the detector may generate an information on the position of the object of the at least one beacon device.

Embodiment 97: A scanning system for determining at least one position of at least one object, the scanning system comprising at least one detector according to any of the preceding embodiments relating to a detector, the scanning system further comprising at least one illumination source adapted to emit at least one light beam configured for an illumination of at least one dot located at at least one surface of the at least one object, wherein the scanning system is designed to generate at least one item of information about the distance between the at least one dot and the scanning system by using the at least one detector.

Embodiment 98: The scanning system according to the preceding embodiment, wherein the illumination source comprises at least one artificial illumination source, in particular at least one laser source and/or at least one incandescent lamp and/or at least one semiconductor light source.

Embodiment 99: The scanning system according to any one of the two preceding embodiments, wherein the illumination source emits a plurality of individual light beams, in particular an array of light beams exhibiting a respective pitch, in particular a regular pitch.

Embodiment 100: The scanning system according to any one of the three preceding embodiments, wherein the scanning system comprises at least one housing, wherein the at least one item of information about the distance between the at least one dot and the scanning system distance is determined between the at least one dot and a specific point on the housing of the scanning system, in particular a front edge or a back edge of the housing.

Embodiment 101: The scanning system according to the preceding embodiment, wherein the housing comprises at least one of a display, a button, a fastening unit, a leveling unit.

Embodiment 102: A stereoscopic system comprising at least one tracking system according to any one of the embodiments which refer to the tracking system and at least one scanning system according to any one of the embodiments which refer to the scanning system, wherein the tracking system and the scanning system each comprise at least one optical detector which are placed in a collimated arrangement in such a manner that they are aligned in an orientation parallel to the optical axis of the stereoscopic system and, concurrently, exhibit an individual displacement with respect to the orientation perpendicular to the optical axis of the stereoscopic system.

Embodiment 103: The stereoscopic system according to the preceding embodiment, wherein the tracking system and the scanning system each comprise at least one longitudinal optical sensor, wherein the sensor signals of the longitudinal optical sensors are combined for determining the item of information on the longitudinal position of the object.

Embodiment 104: The stereoscopic system according to the preceding embodiment, wherein the sensor signals of the longitudinal optical sensors are distinguishable with respect to each other by applying a different modulation frequency.

Embodiment 105: The stereoscopic system according to any one of the three preceding embodiments, wherein the stereoscopic system further comprises at least one transversal optical sensor, wherein the sensor signals of the transversal optical sensor are used for determining the item of information on the transversal position of the object.

Embodiment 106: The stereoscopic system according to the preceding embodiment, wherein a stereoscopic view of the object is obtained by combining the item of information on the longitudinal position of the object and the item of information on the transversal position of the object.

Embodiment 107: A camera comprising at least one detector according to any one of the preceding embodiments referring to a detector.

Embodiment 108: A method for manufacturing an optical detector for an optical detection of an incident light beam, the method comprising the following steps:

a) depositing a reflective layer on a partition of a circuit carrier, the reflective layer being designed to at least partially reflect the incident light beam;
b) generating a sensor layer by depositing a photosensitive material on an at least partially transparent substrate layer, wherein the sensor layer is designed to generate at least one sensor signal in a manner dependent on an illumination of the sensor layer by the incident light beam and the reflected light beam;
c) placing the substrate layer carrying the sensor layer on the reflective layer; and
d) providing an evaluation device, wherein the evaluation device is designed to receive the sensor signal and to generate at least one item of information by evaluating the sensor signal.

Embodiment 109: The method according to the preceding embodiment, wherein the reflective layer is deposited on a partition of the circuit carrier, in particular, on a printed circuit board (PCB).

Embodiment 110: The method according to any one of the preceding embodiments referring to the method, wherein the substrate layer which carries the sensor layer is placed on the reflective layer by applying an adhesive layer.

Embodiment 111: The method according to any one of the preceding embodiments referring to the method, wherein the reflective layer is obtained by depositing a metal layer, wherein the reflective layer is obtained by depositing, preferably, at least one of a gold layer, a silver layer, or a copper layer.

Embodiment 112: The method according to any one of the preceding embodiments referring to the method, wherein the reflective layer is deposited until it exhibits a thickness of 10 nm to 100 μm, preferably of 20 nm to 10 μm, more preferred of 40 nm to 2 μm.

Embodiment 113: The method according to any one of the preceding embodiments referring to the method, further comprising applying the sensor layer directly or indirectly to the substrate layer.

Embodiment 114: The method according to the preceding embodiment, wherein no gap is left or generated between the substrate layer and the sensor layer.

Embodiment 115: The method according to any one of the two preceding embodiments, wherein the sensor layer is applied by using a deposition method, wherein the deposition method is selected from the group consisting of chemical bath deposition, vacuum evaporation, sputtering, atomic layer deposition, chemical vapor deposition, spray pyrolysis, electrodeposition, anodization, electro-conversion, electroless dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, and solution-gas interface techniques.

Embodiment 116: The method according to any one of the preceding embodiments referring to the method, wherein the photosensitive material used for the sensor layer is selected from a group consisting of dye solar cells, photoconductive materials, and quantum dots, wherein the photoconductive materials are particularly preferred.

Embodiment 117: The method according to any one of the preceding embodiments referring to the method, wherein at least two individual electrical contacts for contacting the sensor layer are provided, the electrical contacts are designed to transmit the sensor signal via the circuit carrier to the evaluation device.

Embodiment 118: The method according to the preceding embodiment, wherein the electrical contacts are bonded to at least one external connection by using electrically conductive leads, preferably in form of wire bonds, in particular Au, Al, or Cu wires.

Embodiment 119: The method according to the preceding embodiment, wherein the electrical connection is obtained by applying the wire bonds between the individual electrical contacts and corresponding receiving contacts.

Embodiment 120: The method according to the preceding embodiment, wherein the receiving contacts are contact pads which are, preferably, further placed on the circuit carrier, in particular, on the printed circuit board (PCB).

Embodiment 121: The method according to any one of the preceding embodiments referring to the method, wherein a cover layer is generated, the cover layer at least partially, preferably fully, covering the sensor layer.

Embodiment 122: The method according to the preceding embodiment, wherein the electrically conductive leads are bonded to the electrical contacts through the cover layer.

Embodiment 123: The use of a detector according to any one of the preceding claims referring to a detector, for a purpose of use, selected from the group consisting of: a distance measurement, in particular in traffic technology; a position measurement, in particular in traffic technology; an entertainment application; a security application; a human-machine interface application; a tracking application; a scanning application; in stereoscopic vision; a photography application; an imaging application or camera application; a mapping application for generating maps of at least one space; a homing or tracking beacon detector for vehicles; a distance and/or position measurement of objects with a thermal signature; a machine vision application; a robotic application; a logistics application; a vehicle application; an airplane application; a ship application; a spacecraft application; a robotic application; a medical application; a sports' application; a building application; a construction application; a manufacturing application; a machine vision application; a use in combination with at least one sensing technology selected from time-of-flight detector, radar, Lidar, ultrasonic sensors, or interferometry; an infrared detection application; a heat-detection application; a thermometer application; a heat-seeking application; a flame-detection application; a fire-detection application; a smoke-detection application; a temperature sensing application; a spectroscopy application; a photocopy application; a xerography applications; exhaust gas monitoring application; a combustion process monitoring application; a pollution monitoring application; an industrial process monitoring application; a chemical process monitoring application; a food processing process monitoring application; a water quality monitoring application; an air quality monitoring application; a quality control application; a temperature control application; a motion control application; an exhaust control application; a gas sensing application; a gas analytics application; a motion sensing application; a chemical sensing application.

BRIEF DESCRIPTION OF THE FIGURES

Further optional details and features of the invention are evident from the description of preferred exemplary embodiments which follows in conjunction with the dependent claims. In this context, the particular features may be implemented alone or with features in combination.

The invention is not restricted to the exemplary embodiment. The exemplary embodiments are shown schematically in the figures. Identical reference numerals in the individual figures refer to identical elements or elements with identical function, or elements which correspond to one another with regard to their functions.

Specifically, in the figures:

FIG. 1 illustrates an exemplary embodiment of an optical detector according to the present invention comprising a reflective layer;

FIG. 2 illustrates a further exemplary embodiment of the detector further comprising an a cover layer;

FIG. 3 illustrates a comparison of experimentally determined detector signals between the optical detector according to the present invention and an optical detector without reflective layer; and FIG. 4 shows an exemplary embodiment of a detector, a detector system, a human-machine interface, an entertainment device, a tracking system and a camera according to the present invention.

EXEMPLARY EMBODIMENTS

Figure 1:
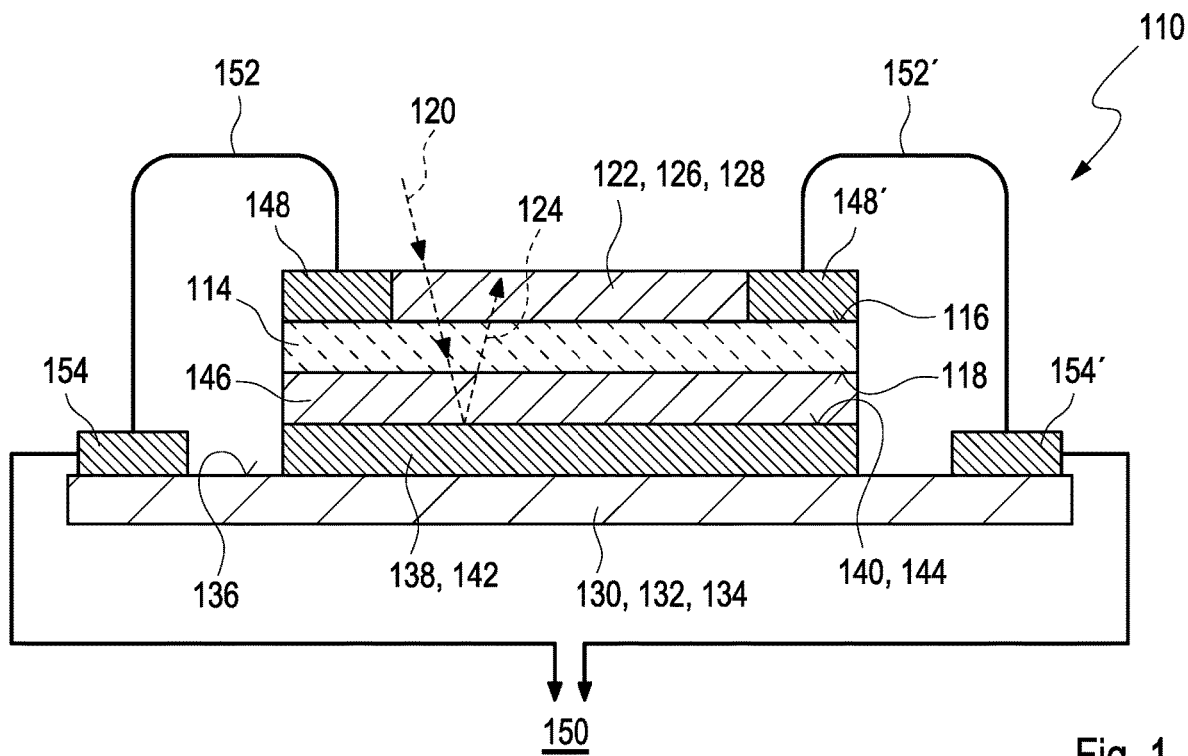

FIG. 1 illustrates, in a highly schematic fashion, an exemplary embodiment of an optical detector 110 according to the present invention. Herein, the detector 110 is adapted for optical detection, in particular, for detecting at least one wavelength in at least a partition of a spectral range, wherein the desired partition of the spectral range may be selected from the ultraviolet (UV), the visible (VIS) and/or the infrared (IR) spectral range, wherein the IR range, i.e. the spectral range of 760 nm to 1000 µm may, particularly, be preferred.

Specifically, the detector may be designed for sensing at least one optically conceivable property of at least one object 112. In particular, the optically conceivable property determinable by the detector 110 may be selected from at least one of an optical property and/or a geometric property of the object 112. By way of example, the optical property may, preferably, be selected from a transmissivity, absorption, emission, and/or reflectivity of the object 112, while the geometric property may, in particular, refer to a position of the object 112 in relation to the detector 110. For sake of simplicity, the object 112 is only schematically depicted in FIG. 4, however, the object 112 may also assumed to be present in the embodiments according to FIGS. 1 to 3.

Figure 2:
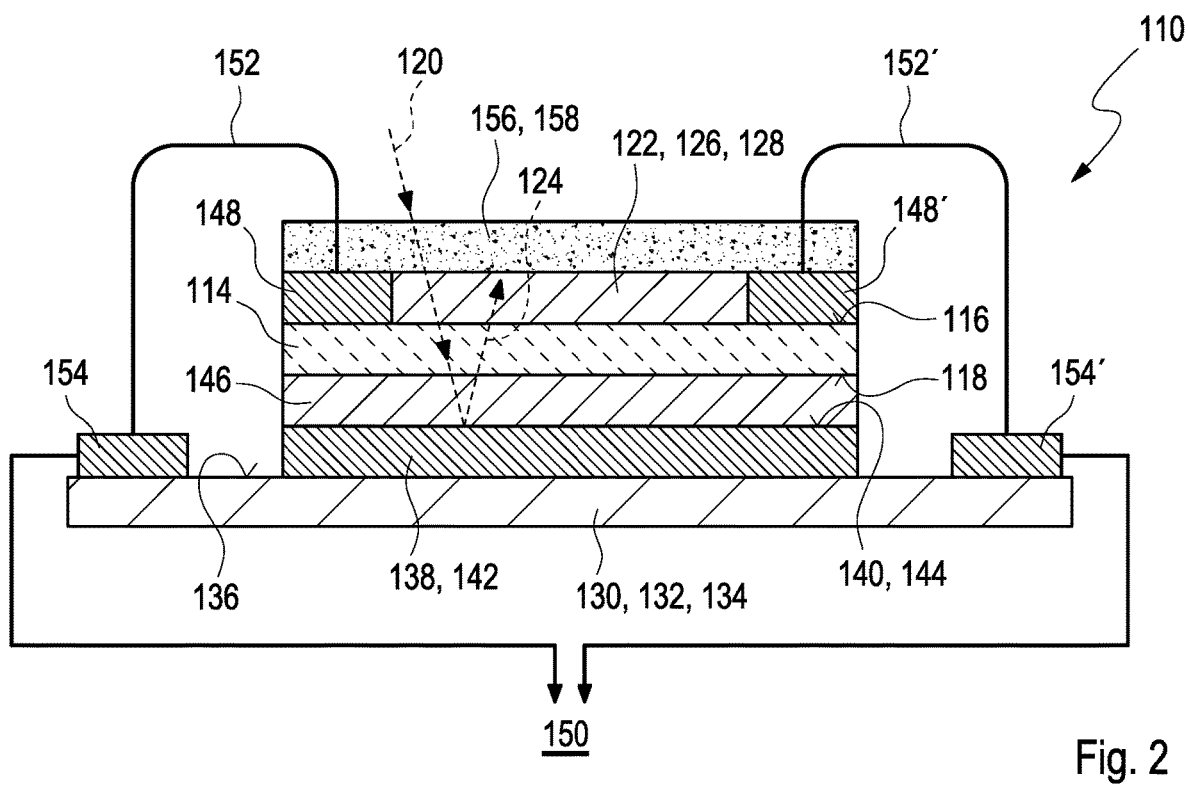

The detector 110 comprises at least one substrate layer 114 having at least a first surface 116 and a second surface 118, wherein the second surface 118 is located oppositely with respect to the first surface 116. Herein, the first surface 116 and/or the second surface 118 of the substrate layer 114 may, as depicted in FIGS. 1 and 2, preferably be a flat surface. However, in an alternative embodiment (not depicted here), at least one of the first surface 116 or of the second surface 118 of the substrate layer 114 may exhibit a curved surface, wherein the curved surface refers to an area which may deviate from being a flat plane. Herein, the curved surface may, especially, be designed to correct aberrations an incident light beam 120 may experience on its path through the detector 110. In particular, the curved surface may be is selected from a convex or a concave surface. However, other kinds of curved surfaces may also be conceivable.

For the purposes of the present invention, the incident light beam 120 may impinge on a sensor layer 122 which may indirectly or, preferably, directly be applied to the second surface 118 of the substrate layer 114, preferentially that no gap may remain between the substrate layer 114 and the sensor layer 122. Herein, the sensor layer 122 may, as depicted here, be exactly a single continuous sensor layer.

For this purpose, the sensor layer 122 may, preferably, be deposited on the substrate layer 114 by using a deposition method, advantageously, by using a bath deposition process, which may easily allow generating a thickness from 1 nm to 100 µm, preferably from 10 nm to 10 µm, more preferred from 100 nm to 1 µm. However, alternative arrangements of the sensor layer 122 or other deposition methods for generating the sensor layer 122 may also be feasible.

Herein, the sensor layer 122 is designed to generate at least one sensor signal in a manner dependent on an illumination of the sensor layer 122 by the incident light beam 120 and, as described below in more detail, by a reflected light beam 124. According to the present invention, the sensor layer 122 comprises at least one photosensitive material 126. In a particularly preferred embodiment, the photosensitive material 122 may comprise a photoconductive material 128, preferentially, at least one chalcogenide material, in particular, selected from the group consisting of lead sulfide (PbS) lead selenide (PbSe), lead telluride (PbTe), cadmium telluride (CdTe), or indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), and copper zinc tin sulfide (CZTS). However, other chalcogenides or other kinds of photoconductive materials 128 may also be employed. In alternative embodiments (not depicted here), the photosensitive material 126 as comprised by the sensor layer 122 may be selected from a dye solar cell or from a quantum dot layer.

Further, the detector 110 comprises a circuit carrier 130. As generally used, the circuit carrier 130 refers to a platform being designed to mechanically support and electrically connect electronical, electrical, and/or optical elements, such as the detector 110 or a partition thereof. In a particularly preferred embodiment of the present invention, the circuit carrier 130 may be or comprise a printed circuit board (PCB) 132. As schematically illustrated in FIG. 1, the printed circuit board 132 comprises only a single sheet and may, thus, be denominated as a single-sided PCB 134, However, printed circuit boards comprising more than only a single sheet, such as a double-sided PCB or a multi-layer PCB, wherein the different sheets may be connected with each other by using so-called "vias", may also be applicable. However, other types of circuit carriers 130 may also be applicable. As general, the electronical, electrical, and/or optical elements may be placed on a surface 136 of the printed circuit board 132, such as by soldering, welding, or depositing, or, additionally or as an alternative, by embedding into the circuit carrier 130, such as by placing into seats designated in the circuit carrier 130 for this purpose and/or by removing a partition of the circuit carrier 130.

Further, the detector 110 comprises a reflective layer 138 which is, thus, placed on a partition of the circuit carrier 130, in particular on a partition of the surface 136 of the printed circuit board 132. Herein, the reflective layer 138 is designed to reflect the incident light beam 120, in particular, in a manner that the incident light beam 120 may be reflected back as reflected light beam 124 into the sensor layer 114 after the incident light beam 120 has, at least partially but preferably completely, transmitted the sensor layer 114 before. This kind of arrangement may, thus, allow redirecting the incident light beam 120 as reflected light beam 124 into the sensor layer 114, whereby a loss of incident light during a measurement in this kind of detector 110 may be diminished.

Preferably, the reflective layer 138, in particular at least the surface 140 of the reflective layer 138 which is designate to be impinged by the incident light beam 120, comprises a layer or, at least, a surface, preferably of gold, silver, or copper. Herein, gold, silver, and copper are, particularly, preferred since they exhibit a high reflectivity in the IR, such as a reflectivity above 90% over the whole IR spectral range, especially from 760 nm to 20 µm. In addition, a gold layer 142 is, additionally, preferred since the gold layer 142 may easily be manufactured by depositing gold on the receptive surface 136 of the circuit carrier 130, in particular the PCB 132. However, other kinds of metal layers may also be suitable as the reflective layer 138. In particular, the reflective layer may exhibit a thickness of 10 nm to 100 µm, preferably of 20 nm to 10 µm, more preferred of 40 nm to 2 µm.

Herein, the reflective layer 138 may be designed to reflect the incident light beam 120 in a manner that a diffuse reflection (not depicted here) may be generated hereby, thus, scattering the incident light beams 120 in various directions. For this purpose, the surface 140 of the reflective layer may, especially, be or comprise a rough surface 144 which may, particularly compared to a flat surface, reflected the incident light beam 120 at a narrower angle with respect to the surface 140, thus, causing the reflected light beam 124 to travel over longer distances through the sensor layer 114 where it may be absorbed with a large probability. Consequently, the rough surface 144 of the reflective layer 138 may, thus, especially be provided in order to reduce the losses of the incident light.

As a result, the substrate layer 114 is at least partially transparent with respect to both the incident light beam 120 and the reflected light beam 124. For this purpose, the substrate layer may comprise a material which may, preferably, be selected from glass, quartz, silicon (Si), a transparent organic polymer, or a transparent conducting oxide (TCO), which can, in particular, be selected from the group consisting of aluminum oxide ($Al_2O_3$), titanium oxide ($TiO_2$), indium tin oxide (ITO), fluorine doped tin oxide (SnO2:F; FTO), aluminum doped zinc oxide (AZO), magnesium oxide (MgO), or a perovskite transparent conducting oxide. However, depending on the desired wavelength range of the detector 110, other kinds of materials may also be feasible.

In the preferred exemplary embodiment as illustrated in FIG. 1, the detector 110 may, further, comprise an adhesive layer 146 which may be placed between the substrate layer 114 and the reflective layer 138, in particular between the second surface 118 of the substrate layer 114 and the surface 140 of the reflective layer 138. For the purpose of assembling the two adjacent substrate layer 114 and reflective layer 138 that they are resistive to separation, the adhesive layer 146 comprises an adhesive substance. A schematically depicted in FIG. 1, the adhesive layer 146 may, especially, be applied in a manner that no gap may be left nor generated, on one hand, between the reflective layer 138 and the adhesive layer 146 and, on the other hand, between the adhesive layer 146 and the substrate layer 114. Herein, the adhesive layer 146 may, preferably, be exactly one continuous layer which may be placed adjacently with respect to both the substrate layer 114 and the reflective layer 138. The particularly preferred embodiment of FIG. 1 may, thus, allow placing the substrate layer 114 which carries the sensor layer 122 on the reflective layer 138, preferably, by applying the adhesive layer 146, whereby the reflective layer 138 could be arranged in the desired position to reflect the incident light beam 120, in particular, as reflected light beam 124 back to the sensor layer 122 as effective as possible.

Herein, the adhesive layer 146 may, at least partially, be transparent with respect to the incident light beam 120 or, as an alternative, be partially reflective with respect to the incident light beam 120, thus supporting the effect of the reflective layer 138. Irrespective which embodiments may be used, the incident light beam 120 may, as desired, thus be reflected as reflected light beam 124 through the substrate layer 114 towards the sensor layer 122. For this purpose, the adhesive layer 146 may exhibit a thickness which may be selected in order to provide a close and stable connection between the substrate layer 114 and the reflective layer 138. Depending on the material selected for the adhesive layer 146, the thickness of the adhesive layer 146 may, thus, be 100 nm to 10 μm, more preferred of 250 nm to 5 μm.

Further, the detector 110 may, preferably, comprise electrical contacts 148, 148' which are designed to transmit the at least one sensor signal as generated in the sensor layer 122 directly or indirectly to an evaluation device 150 (not depicted here). Preferably, the electrical contacts 148, 148' may comprise at least one electrode material selected from a group consisting of Ag, Pt, Mo, Al, Au, and highly conductive graphene. As illustrated in FIG. 1, the electrical contacts 148, 148' may, further, be bonded using bond wires or bonding wires 152, 152', wherein the bonding wires 152, 152' may, in particular, be or comprise Au, Al, or Cu wires. Particularly in order to support the bonding between the bonding wires 152, 152' and the electrode material of the electrical contacts 148, 148', a further adhesive layer (not depicted here) may, additionally, be provided at the electrical contacts 148, 148', wherein the further adhesive layer may comprise at least one of Ni, Cr, Ti or Pd. However, other kinds of bonding wires and/or further adhesive layers may also be feasible. As further depicted in FIG. 1, the bonding wires 152, 152' carrying the sensor signal may be guided to contact pads 154, 154' which are located on the surface 136 of the circuit carrier 130 and which comprise an electrically conducting material, wherefrom the sensor signal may, further, be guided to the evaluation device 150 in a direct or an indirect manner. This arrangement may allow an easy handling and contacting of the detector 110, preferably, by automatically picking and placing the substrate layer 114 carrying the sensor layer 122 and the electrical contacts 148, 148' on a selected location on the circuit carrier 130 and, subsequently, by providing the bonding wires 152, 152'.

Thus, the electrical contacts 148, 148' may be designed to transmit the sensor signal as generated by the sensor layer 122 to the evaluation device 150. Alternatively, the sensor signal may be transmitted from the sensor layer 122 to the evaluation device 150 in a wireless fashion. Consequently, the resulting sensor signal as provided by the sensor layer 122 upon impingement by both the incident light beam 122 and the reflected light beam 124 depends on properties of the photosensitive material 126, in particular of the photoconductive material 128, as comprised by in the sensor layer 122. The evaluation device 150 is, generally, designed to generate at least one item of information provided by both the incident light beam 120 and the reflected light beam 124 about one or more optically conceivable properties of at least one object 112 by evaluating the sensor signal. For this purpose, the evaluation device 150 may comprise one or more electronic devices and/or one or more software components, in order to evaluate the sensor signals. Thus, the evaluation device 150 may be adapted to determine the at least one item of information by comparing more than one sensor signals as acquired by the sensor layer 122.

Preferably, the evaluation device 150 may be adapted to determine the at least one item of information on a longitudinal position of the object 112 by comparing more than one longitudinal sensor signals of the sensor layer 122 which may, in this particular embodiment, be arranged as a longitudinal optical sensor. For this purpose, the detector 110 may, particularly, be adapted to generate the sensor signal by performing at least one current-voltage measurement and/or at least one voltage-current-measurement. As known for FiP devices, the longitudinal sensor signal, given the same total power of the illumination, may be dependent on a beam cross-section of the incident light beam 120 in the sensor layer 122. For the purpose of generating the at least one item of information on the longitudinal position of the object 112, the evaluation device 150 may, thus, be designed to employ at least one predefined relationship between the geometry of the illumination and a relative positioning of the object 112 with respect to the detector 110, thereby, preferably, taking account of a known power of the illumination. Alternatively or in addition, the evaluation device 150 may be adapted to determine at least one optical property of the object 112, such as selected from the transmissivity, absorption, emission, and/or reflectivity of the object 112. However, application of other kinds of evaluation procedures may also be feasible.

Generally, the evaluation device 150 may be part of a data processing device and/or may comprise one or more data processing devices. The evaluation device 150 may be fully or partially integrated into the circuit carrier 130 and/or may fully or partially be embodied as a separate device which may be electrically connected in a wireless or wire-bound fashion to the sensor layer 122. The evaluation device 150 may further comprise one or more additional components, such as one or more electronic hardware components and/or one or more software components, such as one or more measurement units and/or one or more evaluation units and/or one or more controlling units (not depicted here).

The light beam 120 for illumining the detector 110 may be generated by a light-emitting object 112. Alternatively or in addition, the light beam 120 may be generated by a separate illumination source (not depicted here), which may include an ambient light source and/or an artificial light source, such as a light-emitting diode, being adapted to illuminate the object 112 that the object 112 may be able to reflect at least a part of the light generated by the illumination source in a manner that the light beam 120 may be configured to impinge the optical detector 110. In a specific embodiment, the illumination source may be a modulated light source, wherein one or more modulation properties of the illumination source may be controlled by at least one optional modulation device. Alternatively or in addition, the modulation may be effected in a beam path between the illumination source and the object 112 and/or between the object 112 and the detector 110. Further possibilities may be conceivable. In this specific embodiment, it may be advantageous taking into account one or more of the modulation properties, in particular the modulation frequency, when evaluating the sensor signal for determining the at least one item of information on the object 112.

According to the further exemplary embodiment of the detector 110 as illustrated in FIG. 2, the detector 110 may, further, comprise an optional cover layer 156 which may, preferably, be directly deposited on the sensor layer 122. Herein, the cover layer 156 may, especially, be an amorphous layer comprising at least one metal-containing compound, wherein the metal-containing compound may, advantageously, be selected from an oxide, a hydroxide, a chalcogenide, a pnictide, or a carbide of Al, Ti, Ta, Mn, Mo, Zr, Hf, or W or a combination thereof. Herein, the cover layer, which may, particularly, exhibit a thickness of 10 nm to 600 nm, preferably of 20 nm to 200 nm, may be or comprise an atomic deposition layer 158. Alternatively, the cover layer 156 may be generated by employing a chemical vapor deposition (CVD) process, such as a plasma-enhanced chemical vapor deposition (PECVD) process. Further, other deposition methods, such as spin coating or ink-jet printing, may also be applied.

The cover layer 156 may, in particular, be used to avoid as far as possible a degradation of the sensor layer 122 by external influence, such as by humidity and/or by oxygen as comprised in a surrounding atmosphere. Thus, the cover layer 156 may provide an encapsulation, preferably, a hermetic packaging, of the sensor layer 122, in particular, by fully covering any accessible surfaces of the sensor layer 122. In addition, the cover layer may inherently also contribute to an activation of the photoconductive properties of the photoconductive material 128 that may be, preferentially, in direct contact with the cover layer 156 in a sense that the photoconductive properties of the photoconductive material 156 may considerably be improved after the deposition of the cover layer 156 on the sensor layer 122 and a subsequent thermal treating.

As schematically depicted in FIG. 2, the cover layer 156 may, additionally, cover the electrical contacts 148, 148' which are designed to contact the sensor layer 122, in particular, at different locations at the sensor layer 122. Further, the electrical contacts 148, 148' may be bonded through the cover layer 156, whereby, preferably, the bonding wires 152, 152' may be used.

For further details concerning the features as illustrated in FIG. 2, reference may be made to the description of FIG. 1.

Figure 3:
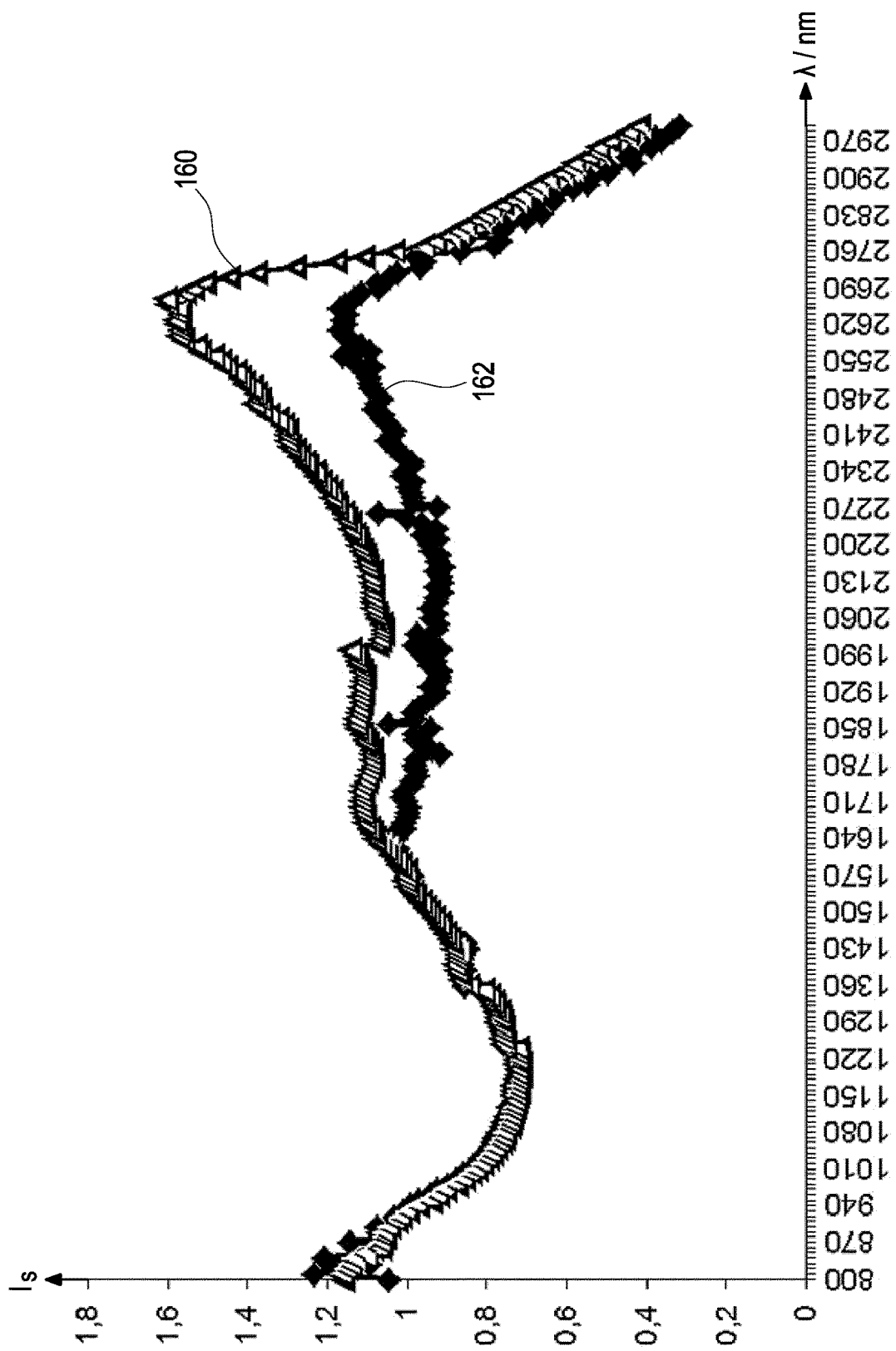

FIG. 3 illustrates a graph of the sensor signal $I_S$ as received from the sensor layer 122 and provided by the evaluation device 150 in arbitrary units with respect to the wavelength $\lambda$ of the incident light beam 120 in nm. Hereby, a distinct increase in sensor signal Is can be observed for a first graph 160 which refers to the detector 110 according to the present invention in the embodiment as described in FIG. 2 which comprises the gold layer 142 as the reflective layer 138 placed on the circuit carrier 130 in comparison with a second graph 162 obtained for a comparative optical detector which did not comprise any reflective layer being placed on the circuit carrier 130. In this particular example, the distinct increase in the sensor signal $I_S$ can be observed in the mid-IR range, especially from 1.5 μm to 2.7 μm. However, other examples may also be feasible.

Figure 4:
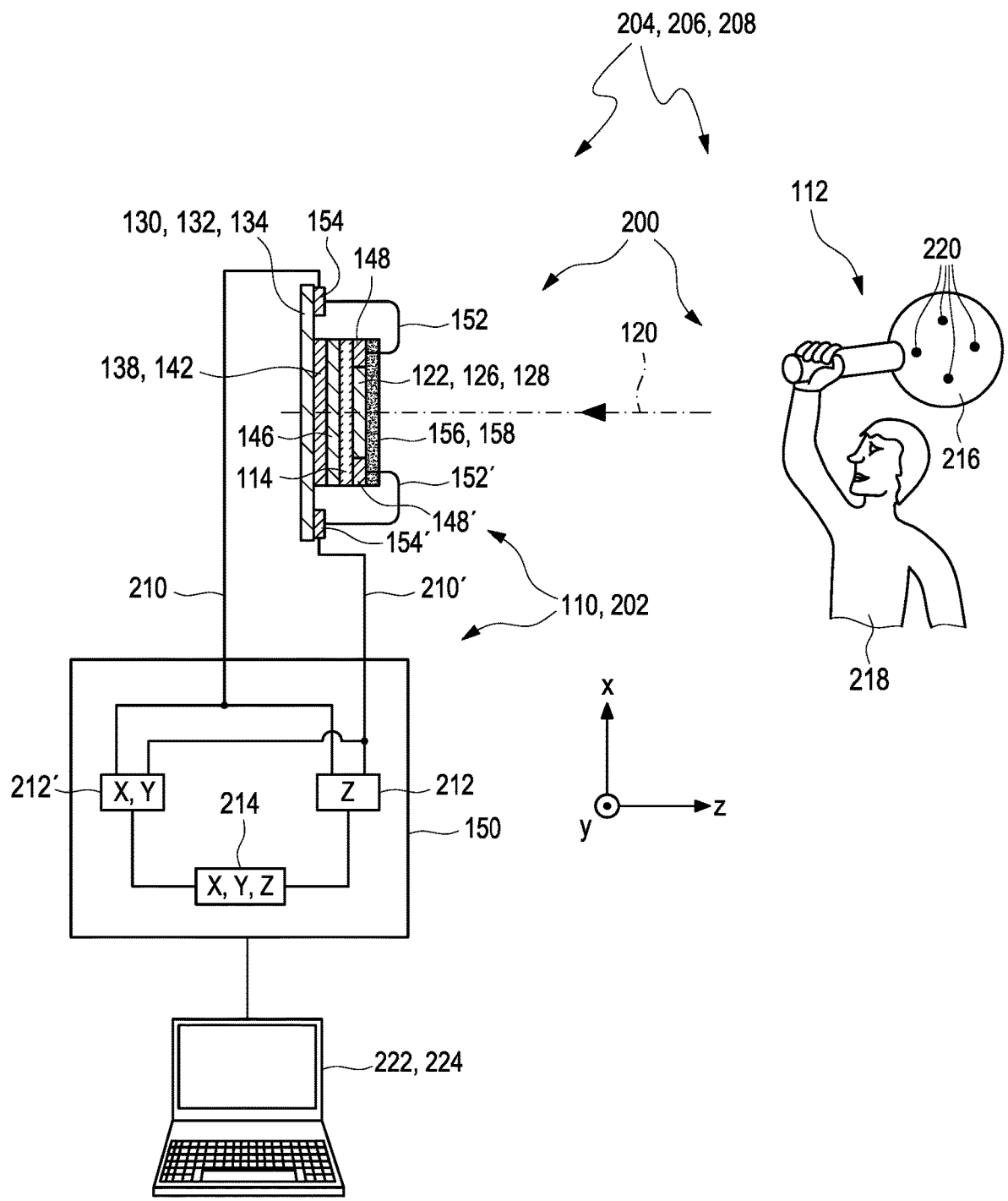

As a further example, FIG. 4 shows an exemplary embodiment of a detector system 200, comprising the at least one detector 110 which is placed on the circuit carrier 130, in particular on the printed circuit board (PCB) 132, more particular on the single-sided PCB 134, as described above. Especially, the detector 110 as disclosed in one or more of the other embodiments as shown in FIG. 1 or 2 may be feasible for this purpose. Herein, the detector 110 may be employed as a camera 202, specifically for 3D imaging, which may be made for acquiring images and/or image sequences, such as digital video clips. Further, FIG. 4 shows an exemplary embodiment of a human-machine interface 204, which comprises the at least one detector 110 and/or the at least one detector system 200, and, further, an exemplary embodiment of an entertainment device 206 comprising the human-machine interface 204. FIG. 4 further shows an embodiment of a tracking system 208 adapted for tracking a position of at least one object 112, which comprises the detector 110 and/or the detector system 200. With regard to the detector 110, reference may be made to the full disclosure of this application. Basically, all potential embodiments of the detector 110 may also be embodied in the embodiment shown in FIG. 4. In this particular embodiment, the detector 110 has a setup in accordance with the exemplary arrangement as provided in FIG. 2. Accordingly, the detector 110 has the substrate layer 114 having at the least a first surface 116 and the second surface 118, wherein the second surface 118 is located oppositely with respect to the first surface 116. Herein, the substrate layer 114 carries a sensor layer 122 comprising the photosensitive material 126, in particular the photoconductive material 128, which is deposited on the second surface 118 of the substrate layer 114. For the purposes of the present invention, the sensor layer 122 is designed to generate at least one sensor signal in a manner dependent on an illumination of the sensor layer 122 by both the incident light beam 120 and the reflected light beam 124. In particular, the detector 110 may be employed to determine at least one optical property of the object 112, such as selected from the transmissivity, absorption, emission, and/or reflectivity of the object 112. In addition, the sensor layer 122 is protected by a cover layer 156 as described above.

Further, the sensor signal as generated by the sensor layer 122 is provided to the evaluation device 150 in order to generate the at least one item of information about the object 112 as provided by both the incident light beam 120 and the reflected light beam 124 by evaluating the sensor signal. For this purpose, the sensor signal is guided via the electrodes 148, 148', the wiring bonds 152, 152', the contact pads 154, 154' as located on the circuit carrier 130, and signal leads 210, 210' to the evaluation device 150. Herein, the signal leads 210, 210' may be wireless interfaces and/or wire-bound interfaces. Further, the signal leads 210, 210' may comprise one or more drivers and/or one or more measurement devices for modifying sensor signals. The evaluation device 150 may fully or partially be integrated into one or more components of the detector 110. The evaluation device 150 may also be enclosed into a housing comprising the detector 110 and/or into a separate housing. The evaluation device 150 may comprise one or more electronic devices and/or one or more software components, in order to evaluate the sensor signals, such as by a longitudinal evaluation unit 212 (denoted by "z") and/or a transversal evaluation unit 212' (denoted by "xy"). By combining results derived by these evolution units 212, 212', position information 214, preferably a three-dimensional position information, may be generated (denoted by "x, y, z"). However, as mentioned above, at least one optical property of the object 112, such as selected from the transmissivity, absorption, emission, and/or reflectivity of the object 112, may, preferably, be determined by using the evaluation device 150.

In the exemplary embodiment as shown in FIG. 4, the object 112 to be detected, as an example, may be designed as an article of sports equipment and/or may form a control element 216, the position and/or orientation of which may be manipulated by a user 218. Thus, generally, in the embodiment shown in FIG. 4 or in any other embodiment of the detector system 200, the human-machine interface 204, the entertainment device 206 or the tracking system 208, the object 112 itself may be part of the named devices and, specifically, may comprise the at least one control element 216, specifically, wherein the at least one control element 216 has one or more beacon devices 220, wherein a position and/or orientation of the control element 216 preferably may be manipulated by user 218. As an example, the object 112 may be or may comprise one or more of a bat, a racket, a club or any other article of sports equipment and/or fake sports equipment. Other types of objects 112 are possible. Further, the user 218 may be considered as the object 112, the position of which shall be detected. As an example, the user 218 may carry one or more of the beacon devices 220 attached directly or indirectly to his or her body.

The detector 110 may be adapted to determine at least one item on a longitudinal position of one or more of the beacon devices 220 and, optionally, at least one item of information regarding a transversal position thereof, and/or at least one other item of information regarding the longitudinal position of the object 112 and, optionally, at least one item of information regarding a transversal position of the object 112. Particularly, the detector 110 may be adapted for identifying colors and/or for imaging the object 112, such as different colors of the object 112, more particularly, the color of the beacon devices 220 which may comprise different colors.

The detector 110 may, thus, be adapted for determining the position of the at least one object 112. Additionally, the detector 110, specifically an embodiment including the camera 202, may be adapted for acquiring at least one image of the object 112, preferably a 3D-image. As outlined above, the determination of a position of the object 112 and/or a part thereof by using the detector 110 and/or the detector system 200 may be used for providing a human-machine interface 204, in order to provide at least one item of information to a machine 222. In the embodiments schematically depicted in FIG. 4, the machine 222 may be or may comprise at least one computer and/or a computer system comprising the data processing device. Other embodiments are feasible. The evaluation device 150 may be a computer and/or may comprise a computer and/or may fully or partially be embodied as a separate device and/or may fully or partially be integrated into the machine 222, particularly the computer. The same holds true for a track controller 224 of the tracking system 208, which may fully or partially form a part of the evaluation device 150 and/or the machine 222.

Similarly, as outlined above, the human-machine interface 204 may form part of the entertainment device 206. Thus, by means of the user 218 functioning as the object 112 and/or by means of the user 218 handling the object 112 and/or the control element 216 functioning as the object 112, the user 218 may input at least one item of information, such as at least one control command, into the machine 222, particularly the computer, thereby varying the entertainment function, such as controlling the course of a computer game.

As outlined above, the detector 110 may have a straight beam path or a tilted beam path, an angulated beam path, a branched beam path, a deflected or split beam path or other types of beam paths. Further, the incident light beam 120 may propagate along each beam path or partial beam path once or repeatedly, unidirectionally or bidirectionally.

LIST OF REFERENCE NUMBERS 110 detector
112 object
114 substrate layer
116 first surface
118 second surface
120 incident light beam
122 sensor layer
124 reflected light beam
126 photosensitive material
128 photoconductive material
130 circuit carrier
132 printed circuit board (PCB)
134 single-sided PCB
136 surface
138 reflective layer
140 surface
142 gold layer
144 rough surface
146 adhesive layer
148, 148' electrical contract
150 evaluation device
152, 152' bonding wire
154, 154' contact pad
156 cover layer
158 atomic deposition layer
160 first graph
162 second graph
200 detector system
202 camera
204 human-machine interface
206 entertainment device
208 tracking system
210, 210' signal leads
212, 212' longitudinal evaluation unit, transversal evaluation unit
214 position information
216 control element
218 user
220 beacon device
222 machine
224 track controller

The invention claimed is:

1. A detector, comprising:
    a circuit carrier designed to carry at least one layer, wherein the circuit carrier is or comprises a printed circuit board;
    a reflective layer, the reflective layer being disposed on a portion of the circuit carrier, wherein the reflective layer is designed to reflect an incident light beam, thereby generating at least one reflected light beam;
    a substrate layer, the substrate layer being directly or indirectly adjacent to the reflective layer, wherein the substrate layer is at least partially transparent with respect to the incident light beam and the at least one reflected light beam;
    a sensor layer, the sensor layer being disposed on the substrate layer, wherein the sensor layer is designed to generate at least one sensor signal in a manner dependent on an illumination of the sensor layer by the incident light beam and the at least one reflected light beam;
    an evaluation device designed to generate at least one item of information by evaluating the at least one sensor signal; and
    an adhesive layer disposed between the substrate layer and the reflective layer, wherein the adhesive layer is or comprises an adhesive substance, wherein the adhesive substance is designed to assemble the substrate layer and the reflective layer.

2. The detector of claim 1, wherein the detector is designed to detect at least one wavelength in at least a portion of an infrared spectral range of 760 nm to 1000 µm.

3. The detector of claim 1, wherein the reflective layer is designed to reflect the incident light beam in a manner that the incident light beam is reflected back into the sensor layer after the incident light beam has, at least partially, transmitted the sensor layer before.

4. The detector of claim 1, wherein the reflective layer is designed to provide a diffuse reflection to the incident light beam.

5. The detector of claim 4, wherein the reflective layer comprises a rough surface, wherein the rough surface has an Ra value of at least 0.01 μm.

6. The detector of claim 1, wherein the reflective layer is at least one of a gold layer, a silver layer, a nickel layer, a tin layer, a lead layer, a palladium layer, a platinum layer, an aluminum layer, a copper layer, or a layer of an alloy thereof.

7. The detector of claim 1, wherein the adhesive layer is at least partially transparent with respect to the incident light beam and the at least one reflected light beam, or wherein the adhesive layer is at least partially reflective with respect to the incident light beam.

8. The detector of claim 1, wherein the adhesive substance is an organic adhesive comprising diffusively or specularly reflecting particles.

9. The detector of claim 1, wherein the sensor layer comprises a photosensitive material, wherein the photosensitive material is an inorganic photoconductive material comprising one or more of selenium, tellurium, a selenium-tellurium alloy, a metal oxide, a group IV element or compound, a III-V compound, a II-VI compound, a chalcogenide, a pnictogenide, a halide, and solid solutions and/or doped variants thereof.

10. The detector of claim 9, wherein the chalcogenide is selected from the group consisting of lead sulfide (PbS), copper indium sulfide (CIS), copper indium gallium selenide (CIGS), copper zinc tin sulfide (CZTS), lead selenide (PbSe), copper zinc tin selenide (CZTSe), cadmium telluride (CdTe), mercury cadmium telluride (HgCdTe), mercury zinc telluride (HgZnTe), lead sulfoselenide (PbSSe), copper-zinc-tin sulfur-selenium chalcogenide (CZTSSe), and a solid solution and/or a doped variant thereof.

11. The detector of claim 1, further comprising at least two individual electrical contacts contacting the sensor layer, wherein the at least two individual electrical contacts are designed to transmit the at least one sensor signal via the circuit carrier to the evaluation device.

12. The detector of claim 11, wherein, for each of the at least two individual electrical contacts, at least one wire bond contacts the electrical contact with at least one corresponding receiving contact further disposed on the circuit carrier.

13. The detector of claim 1, further comprising a cover layer disposed at least on the sensor layer, the cover layer being at least partially transparent with respect to the incident light beam.

14. The detector of claim 13, wherein the cover layer comprises at least one oxide, at least one hydroxide, or a combination thereof of aluminum, titanium, zirconium, hafnium, a mixture and/or a laminate thereof.

15. The detector of claim 1, wherein the at least one sensor signal is a longitudinal sensor signal, wherein the longitudinal sensor signal, given the same total power of the illumination, is dependent on a beam cross-section of the incident light beam in the sensor layer, wherein the evaluation device is further designed to generate at least one item of information on a longitudinal position of an object by evaluating the longitudinal sensor signal.

16. A method of detecting an incident light beam with the detector of claim 1, the method comprising:
reflecting an incident light beam with the reflective layer, thereby generating at least one reflected light beam,
generating at least one sensor signal in a manner dependent on an illumination of the sensor layer by the incident light beam and the at least one reflected light beam, and
generating at least one item of information by evaluating the at least one sensor signal.

17. A method for manufacturing a detector, the method comprising:
a) depositing a reflective layer on a portion of a circuit carrier, the reflective layer being designed to at least partially reflect an incident light beam, thereby generating at least one reflected light beam, wherein the circuit carrier is or comprises a printed circuit board;
b) generating a sensor layer by depositing a photosensitive material on an at least partially transparent substrate layer, wherein the sensor layer is designed to generate at least one sensor signal in a manner dependent on an illumination of the sensor layer by the incident light beam and the at least one reflected light beam;
c) disposing the substrate layer carrying the sensor layer on the reflective layer;
d) disposing an adhesive layer between the substrate layer and the reflective layer, wherein the adhesive layer is or comprises an adhesive substance, wherein the adhesive substance is designed to assemble the substrate layer and the reflective layer; and
e) providing an evaluation device, wherein the evaluation device is designed to receive the at least one sensor signal and to generate at least one item of information by evaluating the at least one sensor signal.

* * * * *